US009799406B2

United States Patent
Sato et al.

(10) Patent No.: US 9,799,406 B2
(45) Date of Patent: Oct. 24, 2017

(54) MEMORY SYSTEM

(71) Applicant: KABUSHIKI KAISHA TOSHIBA, Minato-ku, Tokyo (JP)

(72) Inventors: Manabu Sato, Chigasaki Kanagawa (JP); Daiki Watanabe, Yokohama Kanagawa (JP); Hiroshi Sukegawa, Tokyo (JP); Tokumasa Hara, Kawasaki Kanagawa (JP); Hiroshi Yao, Yokohama Kanagawa (JP); Naomi Takeda, Yokohama Kanagawa (JP); Noboru Shibata, Kawasaki Kanagawa (JP); Takahiro Shimizu, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 14/843,878

(22) Filed: Sep. 2, 2015

(65) Prior Publication Data
US 2015/0380097 A1 Dec. 31, 2015

Related U.S. Application Data

(63) Continuation of application No. PCT/JP2013/072125, filed on Aug. 19, 2013.

(51) Int. Cl.
G11C 16/26 (2006.01)
G11C 8/08 (2006.01)
(Continued)

(52) U.S. Cl.
CPC ............... *G11C 16/26* (2013.01); *G11C 8/08* (2013.01); *G11C 11/56* (2013.01);
(Continued)

(58) Field of Classification Search
None
See application file for complete search history.

(56) References Cited

U.S. PATENT DOCUMENTS 4,538,224 A * 8/1985 Peterson ............... G06F 13/285
710/22
6,091,640 A 7/2000 Kawahara et al.
(Continued)

FOREIGN PATENT DOCUMENTS

CN 1832039 A 9/2006
CN 101273413 A 9/2008
(Continued)

OTHER PUBLICATIONS

International Search Report (ISR) dated Nov. 12, 2013 issued in International Application No. PCT/JP2013/072125.
(Continued)

*Primary Examiner* — James G Norman
(74) *Attorney, Agent, or Firm* — Holtz, Holtz & Volek PC

(57) ABSTRACT

A memory system includes a memory device, and a controller which controls the memory device. The memory device includes a plurality of memory cells capable of rewriting data, a plurality of word lines connected to the plurality of memory cells, a page including the plurality of memory cells connected to the same word line, a plane including a plurality of pages, a memory cell array including a plurality of planes, and a plurality of word line drivers which apply voltages to the plurality of word lines, and a plurality of switches provided for each plane and which assigns the word line drivers to the word lines.

18 Claims, 50 Drawing Sheets

(51) Int. Cl.
    *G11C 11/56* (2006.01)
    *G11C 16/04* (2006.01)
    *G11C 16/08* (2006.01)
    *G11C 16/10* (2006.01)
    *G11C 16/30* (2006.01)
    *H01L 27/11556* (2017.01)
    *H01L 27/11582* (2017.01)

(52) U.S. Cl.
    CPC ...... *G11C 11/5628* (2013.01); *G11C 16/0483* (2013.01); *G11C 16/08* (2013.01); *G11C 16/10* (2013.01); *G11C 16/30* (2013.01); *H01L 27/11556* (2013.01); *H01L 27/11582* (2013.01)

(56) References Cited

U.S. PATENT DOCUMENTS

| | | |
|---|---|---|
| 7,577,029 B2 | 8/2009 | Pyeon |
| 8,189,424 B2 | 5/2012 | Uehara et al. |
| 8,369,153 B2 | 2/2013 | Fujiu |
| 8,429,327 B2 | 4/2013 | Kim et al. |
| 2002/0036317 A1 | 3/2002 | Matsui et al. |
| 2005/0082579 A1 | 4/2005 | Horii et al. |
| 2006/0161728 A1 | 7/2006 | Bennett et al. |
| 2006/0203548 A1* | 9/2006 | You ............ G11C 16/26 365/185.12 |
| 2008/0077729 A1* | 3/2008 | Kim ............ G06F 12/0246 711/103 |
| 2008/0215801 A1 | 9/2008 | Tan et al. |
| 2009/0168534 A1 | 7/2009 | Park et al. |
| 2009/0267128 A1 | 10/2009 | Maejima |
| 2009/0268522 A1 | 10/2009 | Maejima |
| 2010/0034023 A1 | 2/2010 | Shingu et al. |
| 2010/0124117 A1* | 5/2010 | Kutsukake ...... G11C 16/0483 365/185.11 |
| 2010/0262721 A1 | 10/2010 | Asnaashari et al. |
| 2010/0329013 A1 | 12/2010 | Shikata et al. |
| 2011/0284946 A1 | 11/2011 | Kiyotoshi |
| 2011/0317489 A1 | 12/2011 | Kim et al. |
| 2013/0010564 A1 | 1/2013 | Shibazaki |
| 2013/0067143 A1* | 3/2013 | Hasegawa ............ G06F 3/0611 711/103 |
| 2013/0141971 A1 | 6/2013 | Hosono |

FOREIGN PATENT DOCUMENTS

| | | |
|---|---|---|
| JP | 10106276 A | 4/1998 |
| JP | 2003178590 A | 6/2003 |
| JP | 2006252747 A | 9/2006 |
| JP | 2008084317 A | 4/2008 |
| JP | 2008529130 A | 7/2008 |
| JP | 2009510594 A | 3/2009 |
| JP | 2010123186 A | 6/2010 |
| JP | 2011008857 A | 1/2011 |
| JP | 2011060415 A | 3/2011 |
| JP | 2012523612 A | 10/2012 |
| JP | 2013020668 A | 1/2013 |
| JP | 2013061790 A | 4/2013 |
| JP | 2013157077 A | 8/2013 |
| WO | 03073430 A1 | 9/2003 |
| WO | 2012082654 A2 | 6/2012 |

OTHER PUBLICATIONS

Japanese Office Action (and English translation thereof) dated Sep. 8, 2015, issued in counterpart Japanese Application No. 2014-551861.
Taiwanese Office Action (and English translation thereof) dated Aug. 28, 2015, issued in counterpart Taiwanese Application No. 102147653.
Singaporean Office Action dated Jan. 5, 2016, issued in counterpart Singaporean Application No. 11201507090P.
International Preliminary Report on Patentability (IPRP) including Written Opinion (in English) dated Mar. 3, 2016, issued in parent International Application No. PCT/JP2013/072125.
Chinese Office Action dated Jan. 22, 2017, issued in counterpart Chinese Application No. 201380033765.9.

* cited by examiner

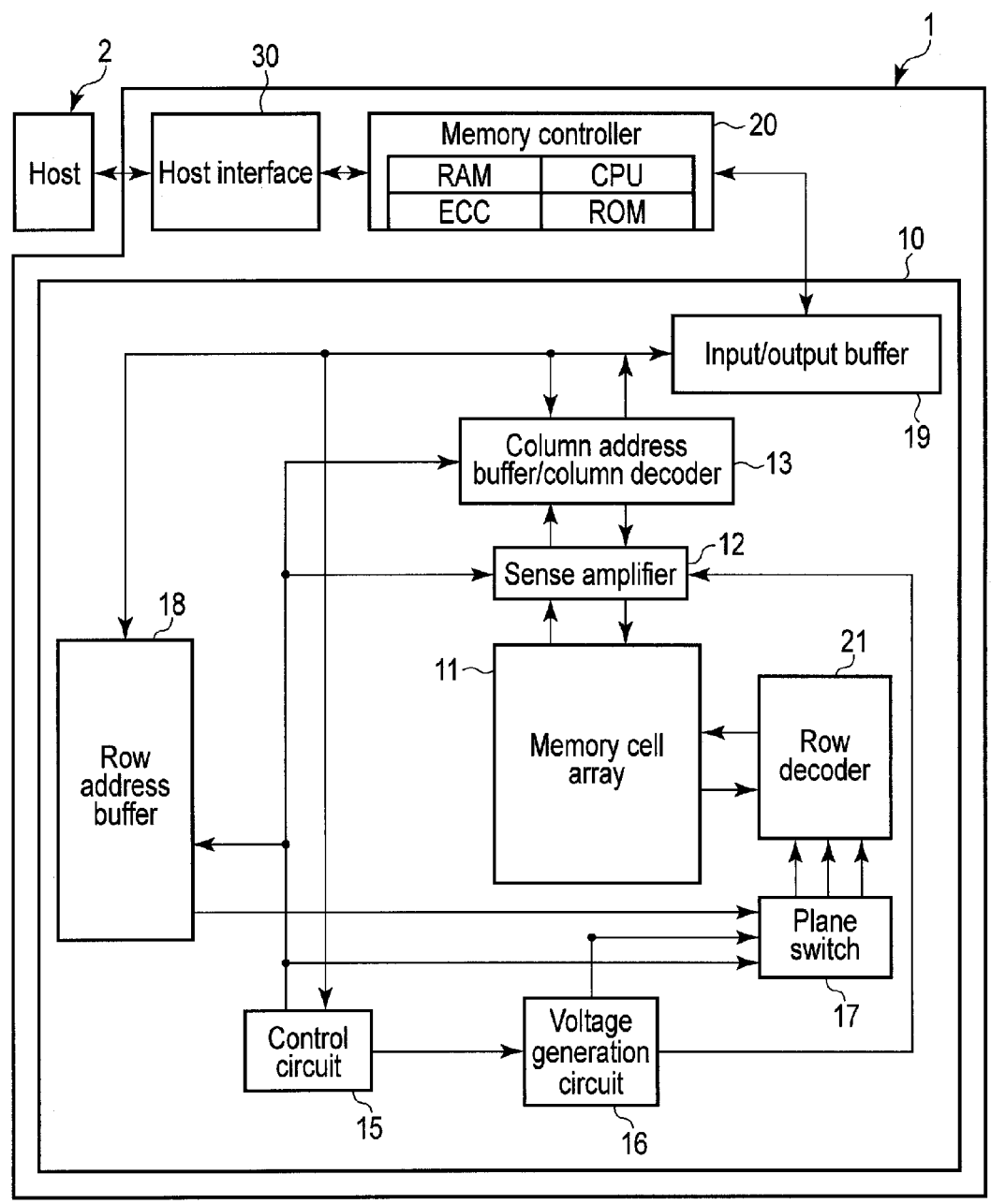
F I G. 1

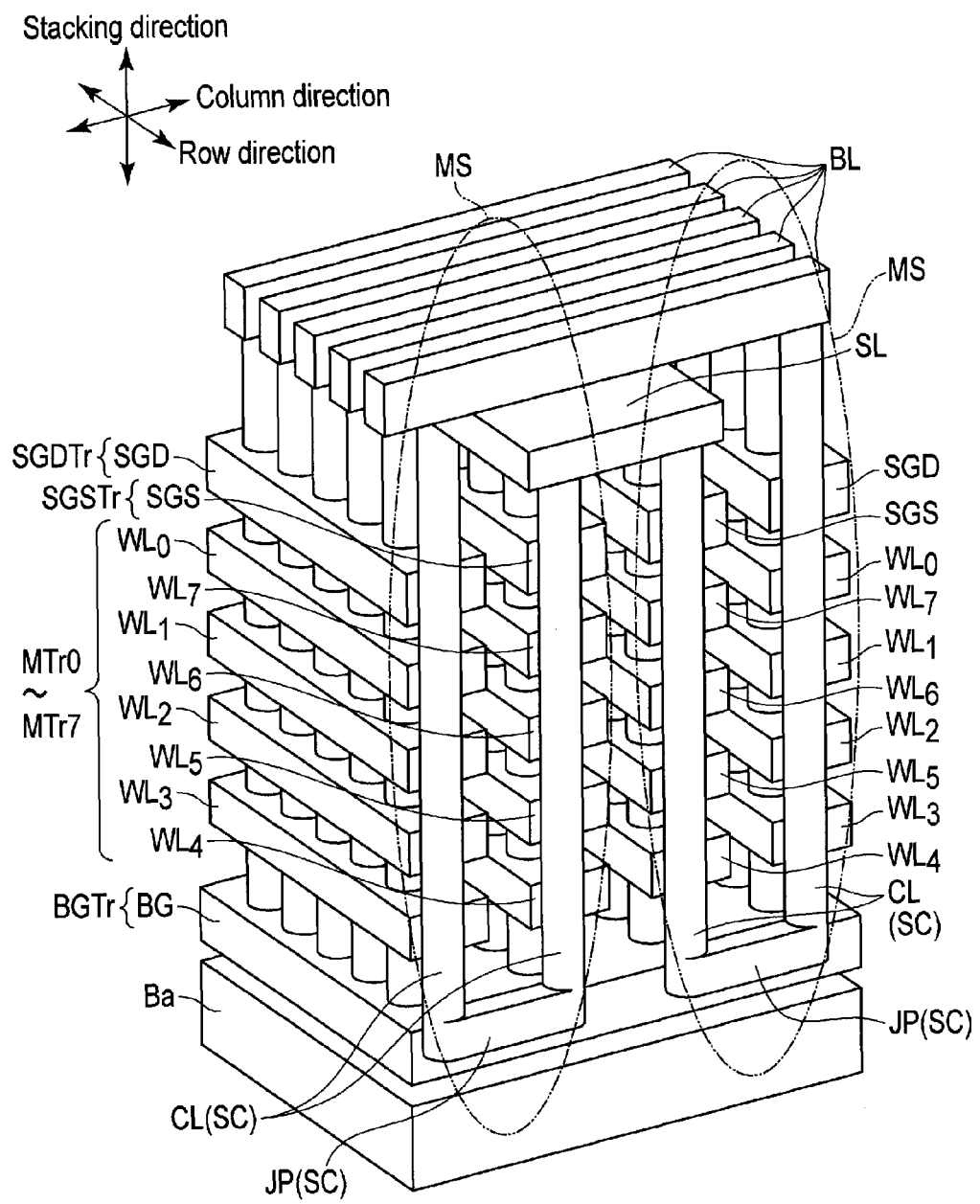
F I G. 2

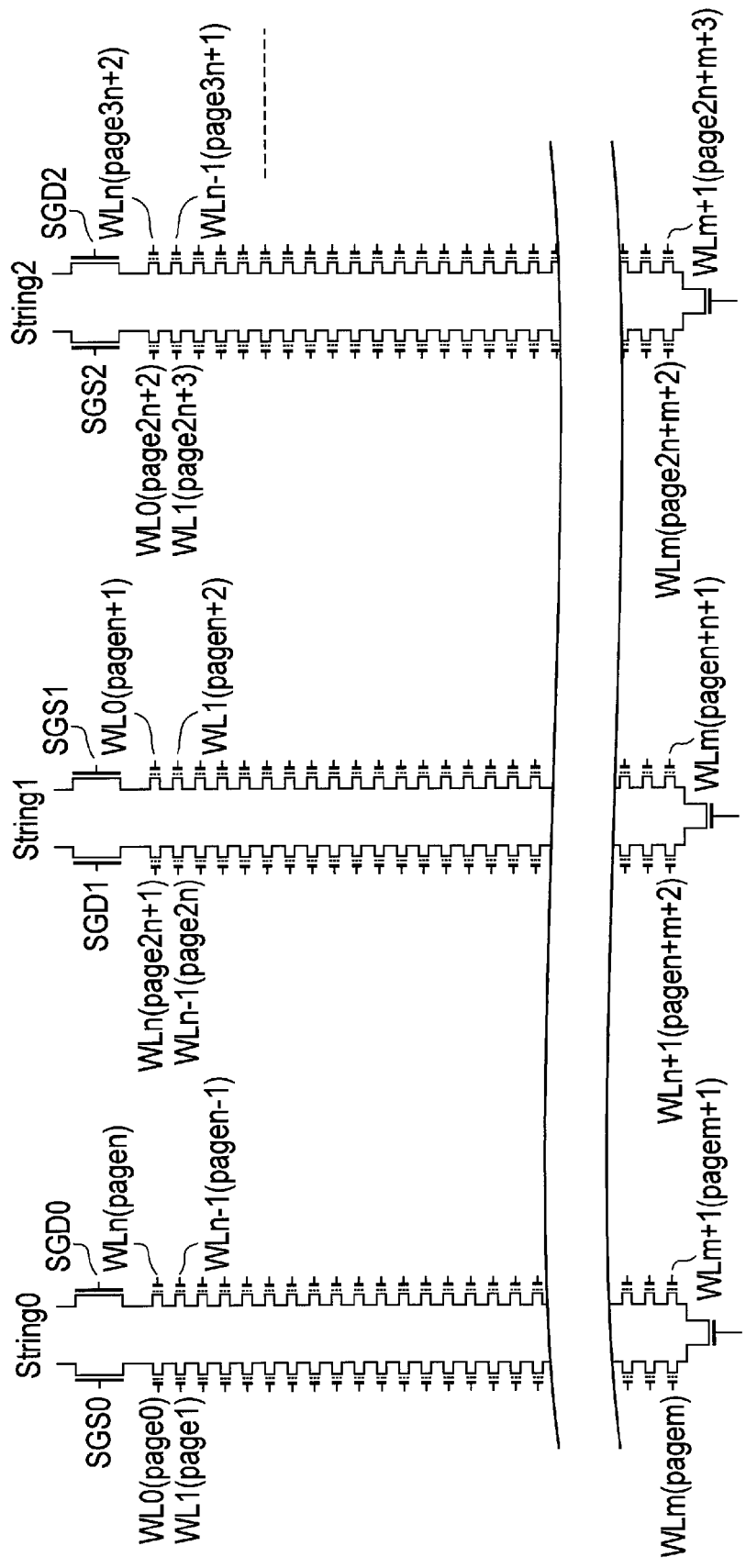
F I G. 3

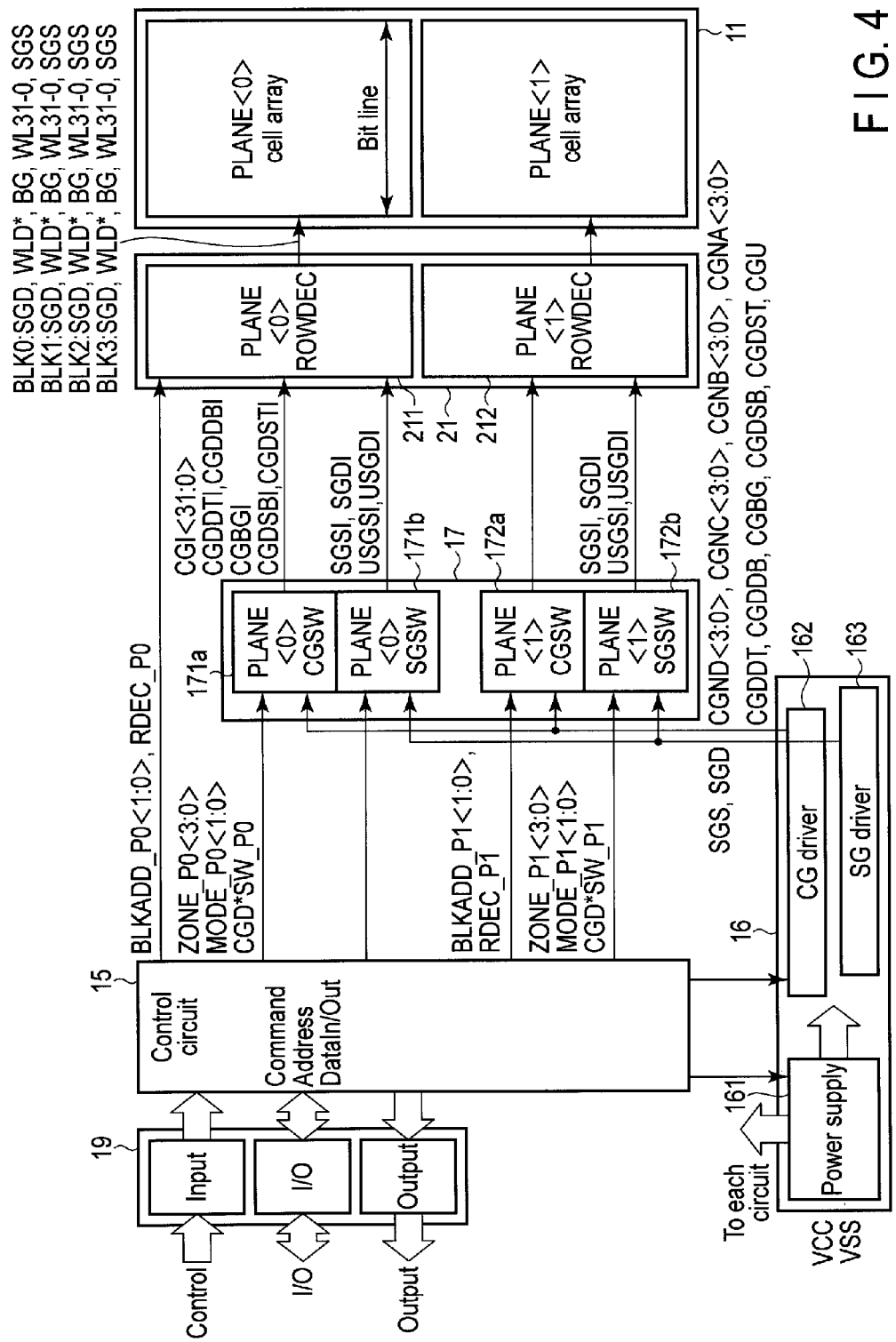
F I G. 4

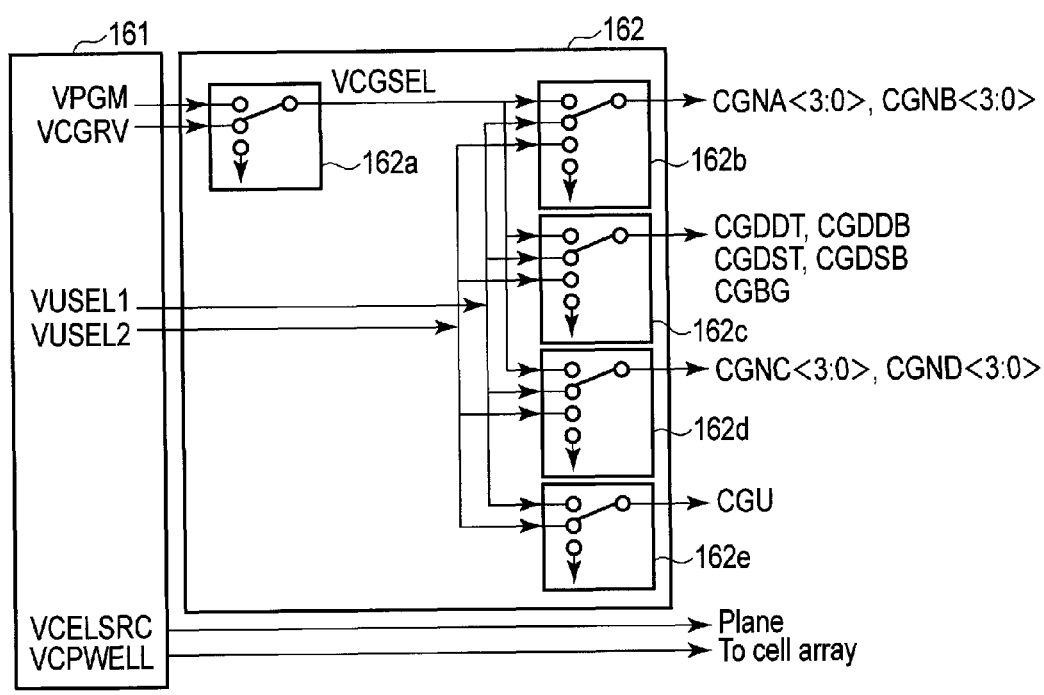
F I G. 5

FIG. 12A

| CGI Connect Control | | CGI<31:28> Output | | | | | | | |
|---|---|---|---|---|---|---|---|---|---|
| MODE<1:0> | ZONE<2:0> | <31:28> | <27:24> | <23:20> | <19:16> | <15:12> | <11:8> | <7:4> | <3:0> |
| 00 (Erase) | Don't Care | CGND<3:0> | CGNC<3:0> | CGNB<3:0> | CGNA<3:0> | CGND<3:0> | CGNC<3:0> | CGNB<3:0> | CGNA<3:0> |
| 01 (Program) | 000 | CGU | CGU | CGU | CGU | CGND<3:0> | CGNC<3:0> | CGNB<3:0> | CGNA<3:0> |
| | 001 | CGU | CGU | CGU | CGNA<3:0> | CGND<3:0> | CGNC<3:0> | CGNB<3:0> | CGU |
| | 010 | CGU | CGU | CGNB<3:0> | CGNA<3:0> | CGND<3:0> | CGNC<3:0> | CGU | CGU |
| | 011 | CGU | CGNC<3:0> | CGNB<3:0> | CGNA<3:0> | CGND<3:0> | CGU | CGU | CGU |
| | 100 | CGND<3:0> | CGNC<3:0> | CGNB<3:0> | CGNA<3:0> | CGU | CGU | CGU | CGU |
| | 101 | CGND<3:0> | CGNC<3:0> | CGNB<3:0> | CGU | CGU | CGU | CGU | CGNA<3:0> |
| | 110 | CGND<3:0> | CGNC<3:0> | CGU | CGU | CGU | CGU | CGNB<3:0> | CGNA<3:0> |
| | 111 | CGND<3:0> | CGU | CGU | CGU | CGU | CGNC<3:0> | CGNB<3:0> | CGNA<3:0> |
| 10 (Read-A) | 000 | CGU | CGU | CGU | CGU | CGU | CGU | CGNB<3:0> | CGNA<3:0> |
| | 001 | CGU | CGU | CGU | CGU | CGU | CGNA<3:0> | CGNB<3:0> | CGU |
| | 010 | CGU | CGU | CGU | CGU | CGNB<3:0> | CGNA<3:0> | CGU | CGU |
| | 011 | CGU | CGU | CGU | CGNA<3:0> | CGNB<3:0> | CGU | CGU | CGU |
| | 100 | CGU | CGU | CGNB<3:0> | CGNA<3:0> | CGU | CGU | CGU | CGU |
| | 101 | CGU | CGU | CGNB<3:0> | CGU | CGU | CGU | CGU | CGNA<3:0> |
| | 110 | CGU | CGNA<3:0> | CGU | CGU | CGU | CGU | CGNB<3:0> | CGU |
| | 111 | CGNB<3:0> | CGNA<3:0> | CGU | CGU | CGU | CGU | CGU | CGU |
| 11 (Read-B) | 000 | CGU | CGU | CGU | CGU | CGU | CGU | CGND<3:0> | CGNC<3:0> |
| | 001 | CGU | CGU | CGU | CGU | CGU | CGNC<3:0> | CGND<3:0> | CGU |
| | 010 | CGU | CGU | CGU | CGU | CGND<3:0> | CGNC<3:0> | CGU | CGU |
| | 011 | CGU | CGU | CGU | CGNC<3:0> | CGND<3:0> | CGU | CGU | CGU |
| | 100 | CGU | CGU | CGND<3:0> | CGNC<3:0> | CGU | CGU | CGU | CGU |
| | 101 | CGU | CGU | CGND<3:0> | CGU | CGU | CGU | CGU | CGNC<3:0> |
| | 110 | CGU | CGNC<3:0> | CGND<3:0> | CGU | CGU | CGU | CGU | CGU |
| | 111 | CGND<3:0> | CGNC<3:0> | CGU | CGU | CGU | CGU | CGU | CGU |

CGDDTI Connect Control

| CGDDTSW | CGDDTI Output |
|---|---|
| 0 | CGDDT |
| 1 | CGDDB |

CGDSTI Connect Control

| CGDSTSW | CGDSTI Output |
|---|---|
| 0 | CGDST |
| 1 | CGDSB |

CGDDBI Connect Control

| CGDDBSW | CGDDBI Output |
|---|---|
| 0 | CGDDB |
| 1 | CGDDT |

CGDSBI Connect Control

| CGDSBSW | CGDSBI Output |
|---|---|
| 0 | CGDSB |
| 1 | CGDST |

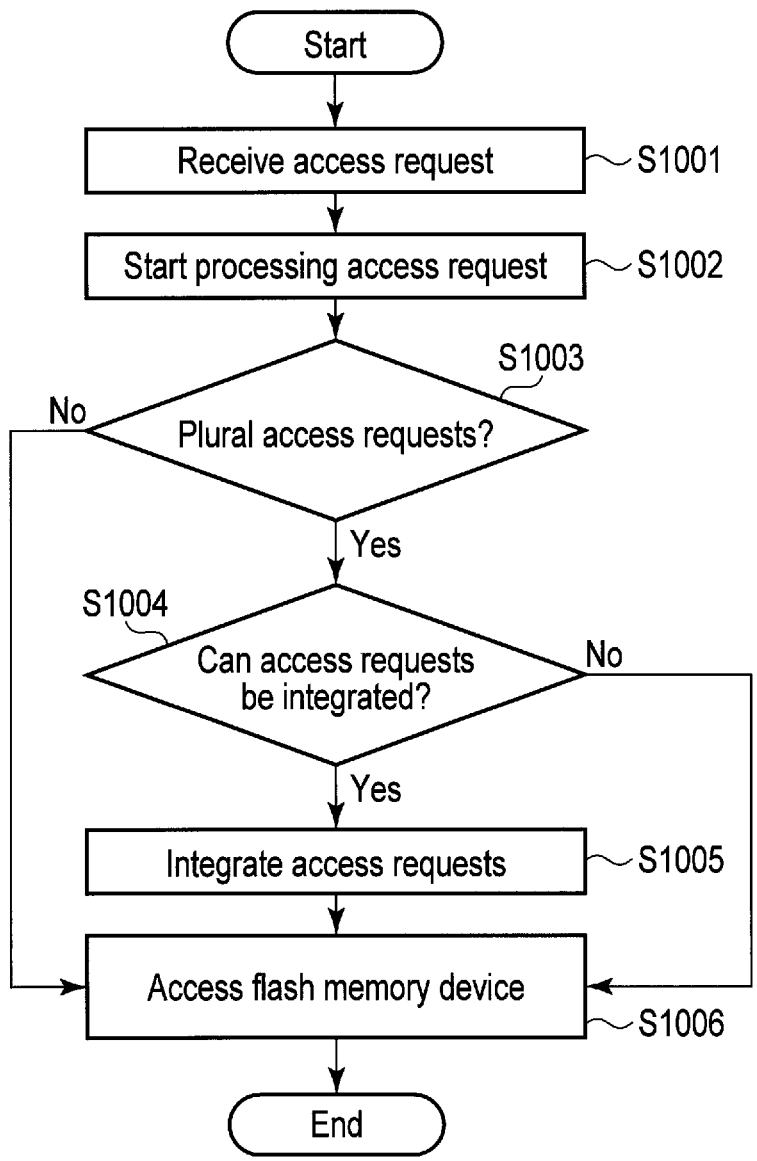
F I G. 14

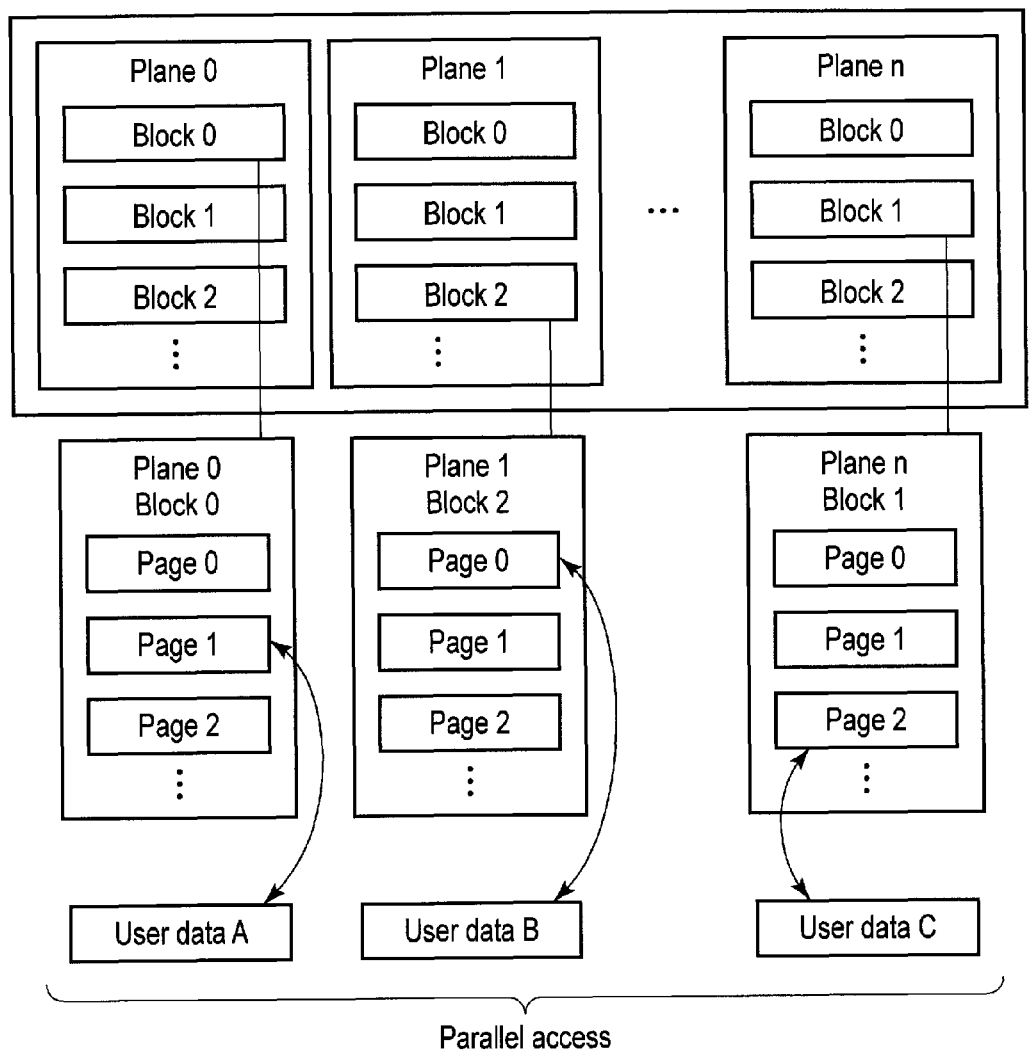
F I G. 15

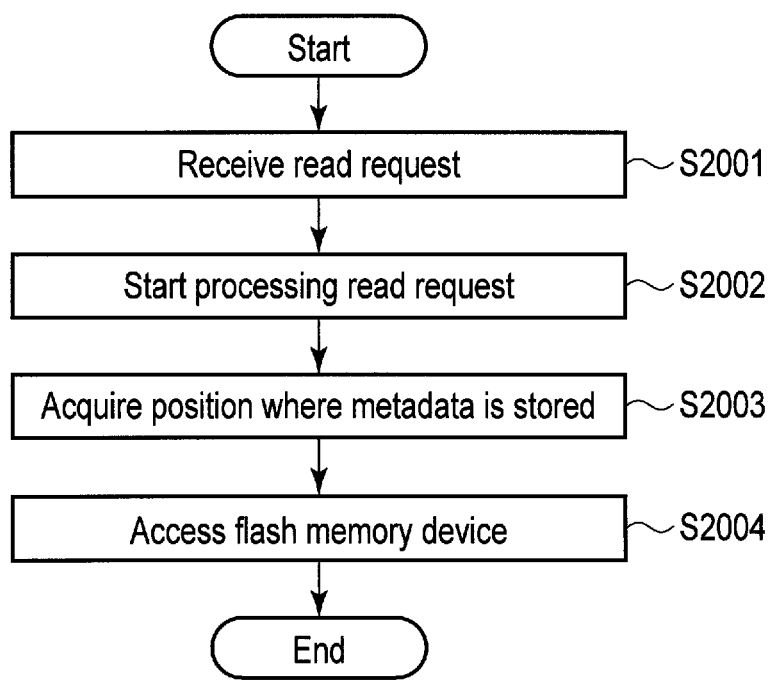
F I G. 16

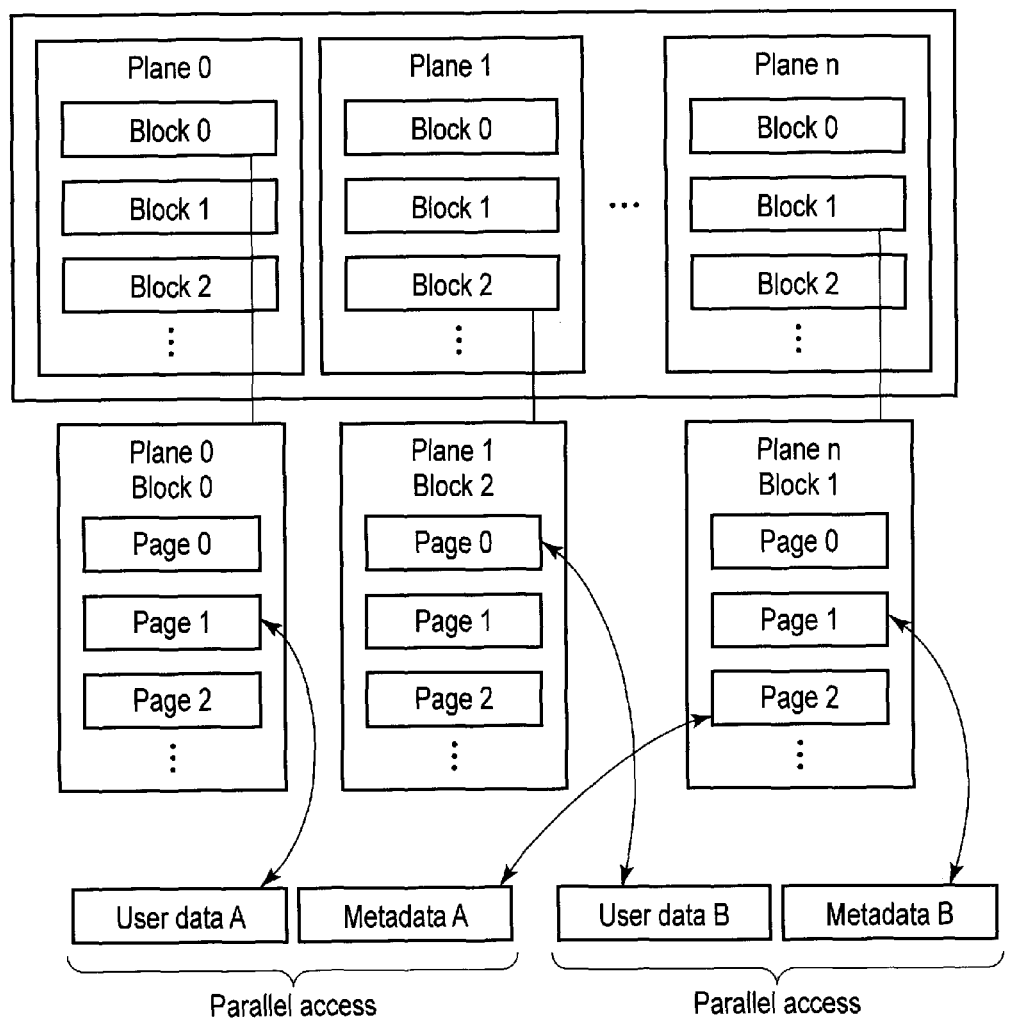
F I G. 17

F_VPGMHSLC ⋯ Initial VPGM for hSLC Program
F_DVPGMHSLC ⋯ Delta VPGM for hSLC Program
F_VCG_HSLCV ⋯ Verify Level for hSLC Program
F_NLP_HSLC ⋯ Loop max for hSLC Program

F I G. 19

Operation Option A (F_HSLC_MODE=1)

| Plane 0 | Plane 1 | Read Sequence |
|---|---|---|
| SLC | hSLC | SLCR |
| MLC-Lower (YetUpperProgram) | hSLC | BR→LMR |
| MLC-Upper (YetUpperProgram) | hSLC | AR→CR |
| MLC-Lower (UpperProgramed) | hSLC | BR |
| MLC-Upper (UpperProgramed) | hSLC | AR→CR |

Operation Option B (F_HSLC_MODE=0)

| Plane 0 | Plane 1 | Read Sequence |
|---|---|---|
| SLC | hSLC | SLCR |
| MLC-Lower (YetUpperProgramed) | hSLC | LMR→BR (New) |
| MLC-Upper (YetUpperProgramed) | hSLC | AR→CR |
| MLC-Lower (UpperProgramed) | hSLC | LMR→BR (New) |
| MLC-Upper (UpperProgramed) | hSLC | AR→CR |

F I G. 20

SLC Read

MLC Lower Read

MLC Upper Read

SLC Read(+hSLC Read)
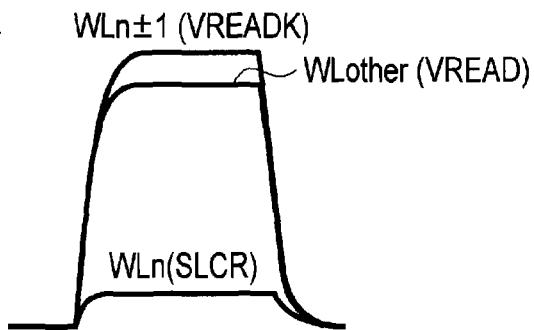
F I G. 22A
MLC Lower Read(+hSLC Read)
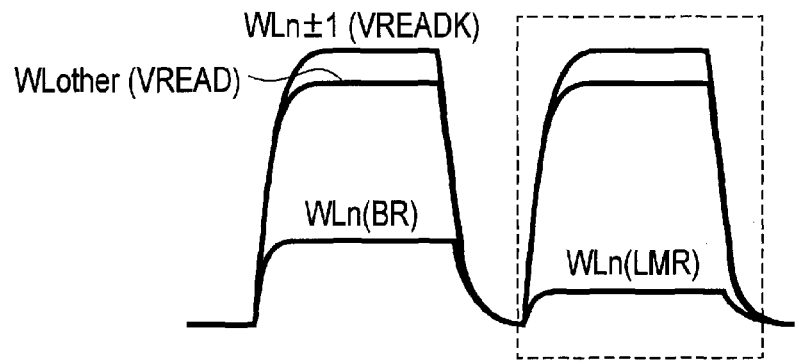
F I G. 22B
MLC Upper Read(+hSLC Read)
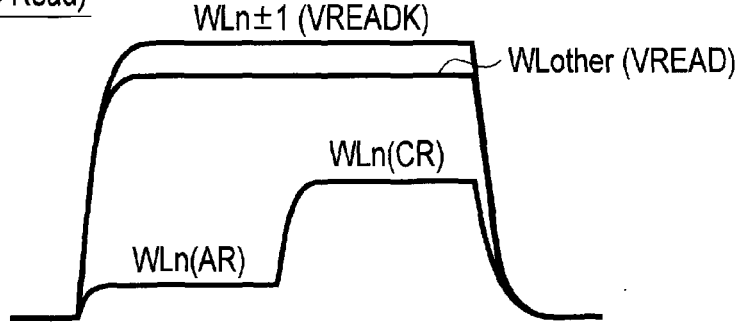
F I G. 22C

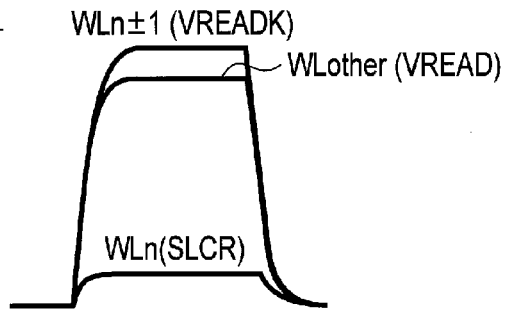
F I G. 23A
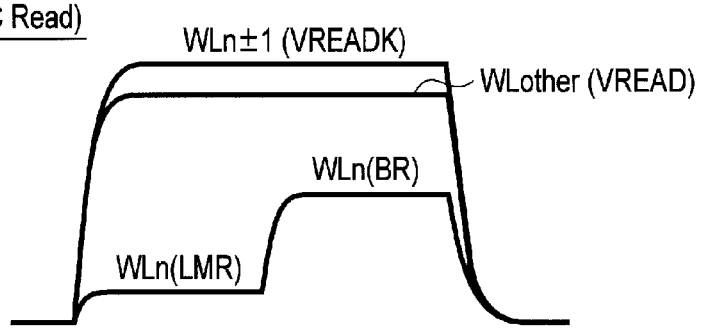
F I G. 23B
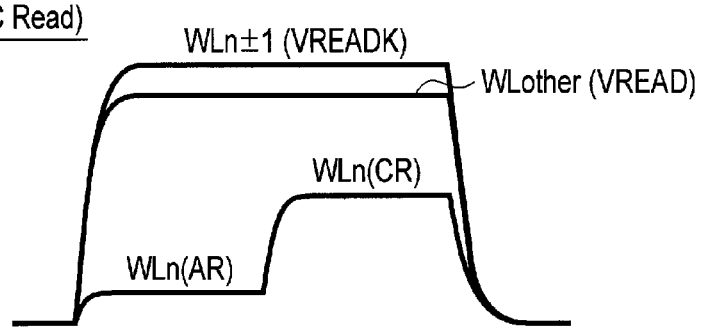
F I G. 23C

| command | Command data |
|---|---|
| C1 C2 R1 R2 R3 | Address data<br>C1: Column address 1<br>C2: Column address 2<br>R1: Row address 1<br>R2: Row address 2<br>R3: Row address 3 |
| R-Data | Read data by data out from chip |
| P-Data | Program data for data in to chip |

F I G. 24

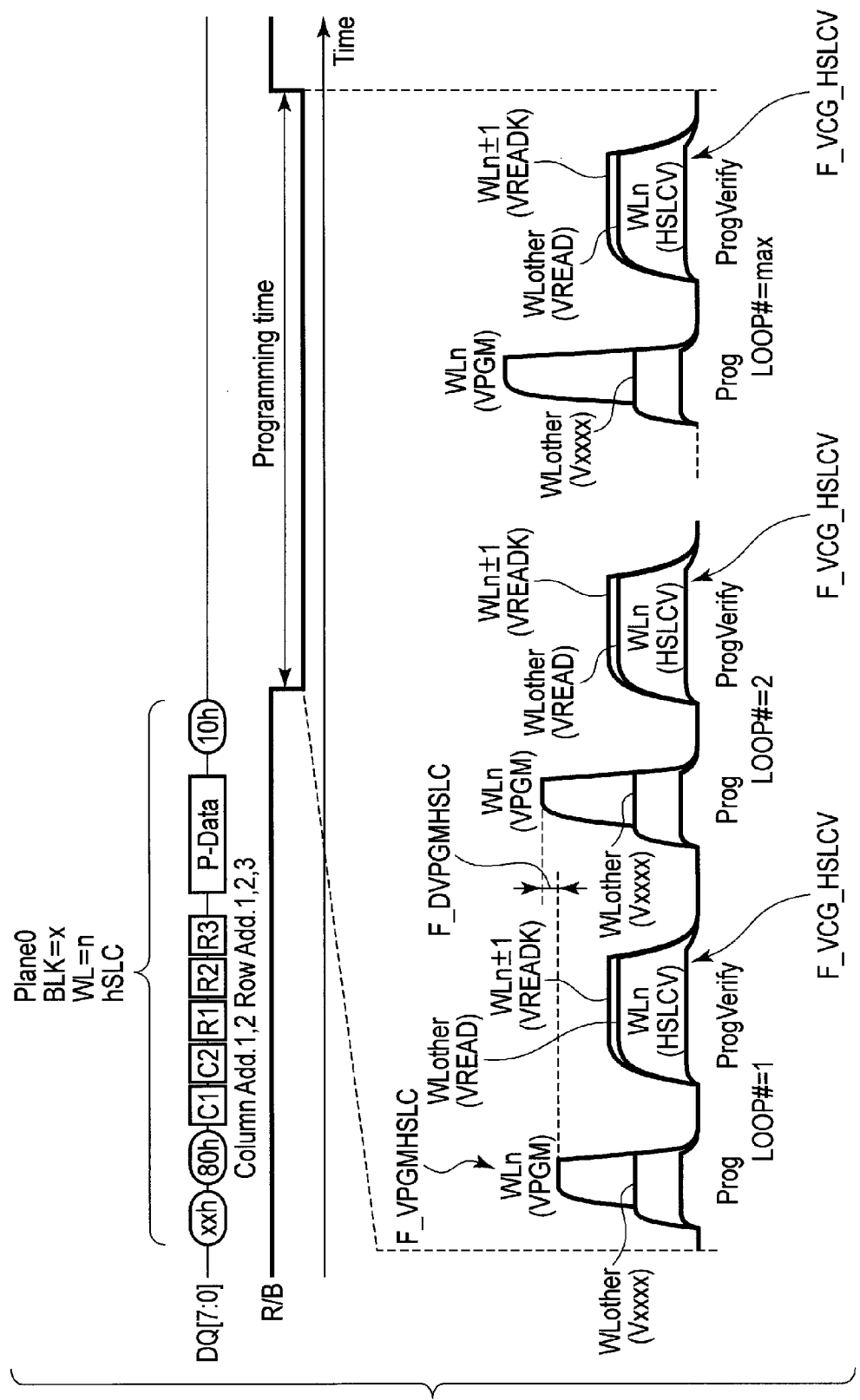
F I G. 25

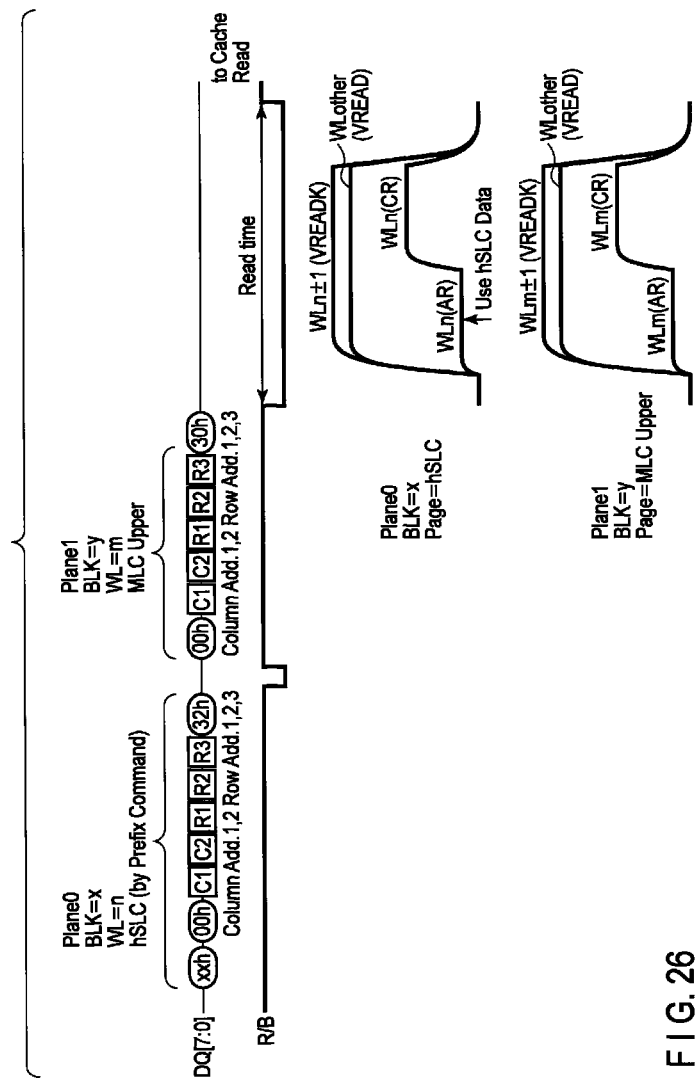
F I G. 26

|  | DQ7 | DQ6 | DQ5 | DQ4 | DQ3 | DQ2 | DQ1 | DQ0 |
|---|---|---|---|---|---|---|---|---|
| First cycle (C1) (Column address 1) | C1-7 | C1-6 | C1-5 | C1-4 | C1-3 | C1-2 | C1-1 | C1-0 |
| Second cycle (C2) (Column address 2) | L | C2-6 | C2-5 | C2-4 | C2-3 | C2-2 | C2-1 | C2-0 |
| Third cycle (R1) (Row address 1) | R1-7 | R1-6 | R1-5 | R1-4 | R1-3 | R1-2 | R1-1 | R1-0 |
| Fourth cycle (R2) (Row address 2) | R2-7 | R2-6 | R2-5 | R2-4 | R2-3 | R2-2 | R2-1 | R2-0 |
| Fifth cycle (R3) (Row address 3) | L | L | L | R3-4 | R3-3 | R3-2 | R3-1 | R3-0 |

F I G. 28

CGSW Control Signal　　　　　　　　　　　　　　　　　　(hSLC)

|  | Plane0 (Sel=Edge WL) | Plane1 (Sel=MidWL) |
|---|---|---|
| ZONE<3:0> | 111 | 011 |
| MODE<1:0> | 10 | 11 |
| CGDDTSW | 0 | 1 |
| CGDDBSW | 0 | 0 |
| CGDSTSW | 1 | 1 |
| CGDSBSW | 0 | 1 |

F I G. 29A

WL Voltage (hSLC)

| | Plane0 (Sel=Edge WL) | Plane1 (Sel=Edge WL) |
|---|---|---|
| WLDDT | CGDDTI=CGDDT=VREADK | CGDDTI=CGDDB=VREAD |
| WL31 | CGI<31>=CGNB<3>=VCGRV | CGI<31>=CGU=VREAD |
| WL30 | CGI<30>=CGNB<2>=VREADK | CGI<30>=CGU=VREAD |
| WL29 | CGI<29>=CGNB<1>=VREAD | CGI<29>=CGU=VREAD |
| WL28 | CGI<29>=CGNB<0>=VREAD | CGI<29>=CGU=VREAD |
| ⋮ | ⋮ | ⋮ |
| WL19 | CGI<19>=CGU=VREAD | CGI<19>=CGU=VREAD |
| WL18 | CGI<18>=CGU=VREAD | CGI<18>=CGU=VREAD |
| WL17 | CGI<17>=CGU=VREAD | CGI<17>=CGU=VREAD |
| WL16 | CGI<16>=CGU=VREAD | CGI<16>=CGU=VREAD |
| WLDDB | CGDDBI=CGDDB=VREAD | CGDDBI=CGDDB=VREAD |
| BG | CGBGI=CGBG=VREAD | CGBGI=CGBG=VREAD |
| WLDSB | CGDSBI=CGDSB=VREAD | CGDSBI=CGDST=VREADK |
| WL15 | CGI<15>=CGU=VREAD | CGI<15>=CGND<3>=VCGRV |
| WL14 | CGI<14>=CGU=VREAD | CGI<14>=CGND<2>=VREADK |
| WL13 | CGI<13>=CGU=VREAD | CGI<13>=CGND<1>=VREAD |
| WL12 | CGI<12>=CGU=VREAD | CGI<12>=CGND<0>=VREAD |
| ⋮ | ⋮ | ⋮ |
| WL3 | CGI<3>=CGU=VREAD | CGI<3>=CGU=VREAD |
| WL2 | CGI<2>=CGU=VREAD | CGI<2>=CGU=VREAD |
| WL1 | CGI<1>=CGU=VREAD | CGI<1>=CGU=VREAD |
| WL0 | CGI<0>=CGU=VREAD | CGI<0>=CGU=VREAD |
| WLDST | CGDSTI=CGDSB=VREAD | CGDSTI=CGDSB=VREAD |

FIG. 29B

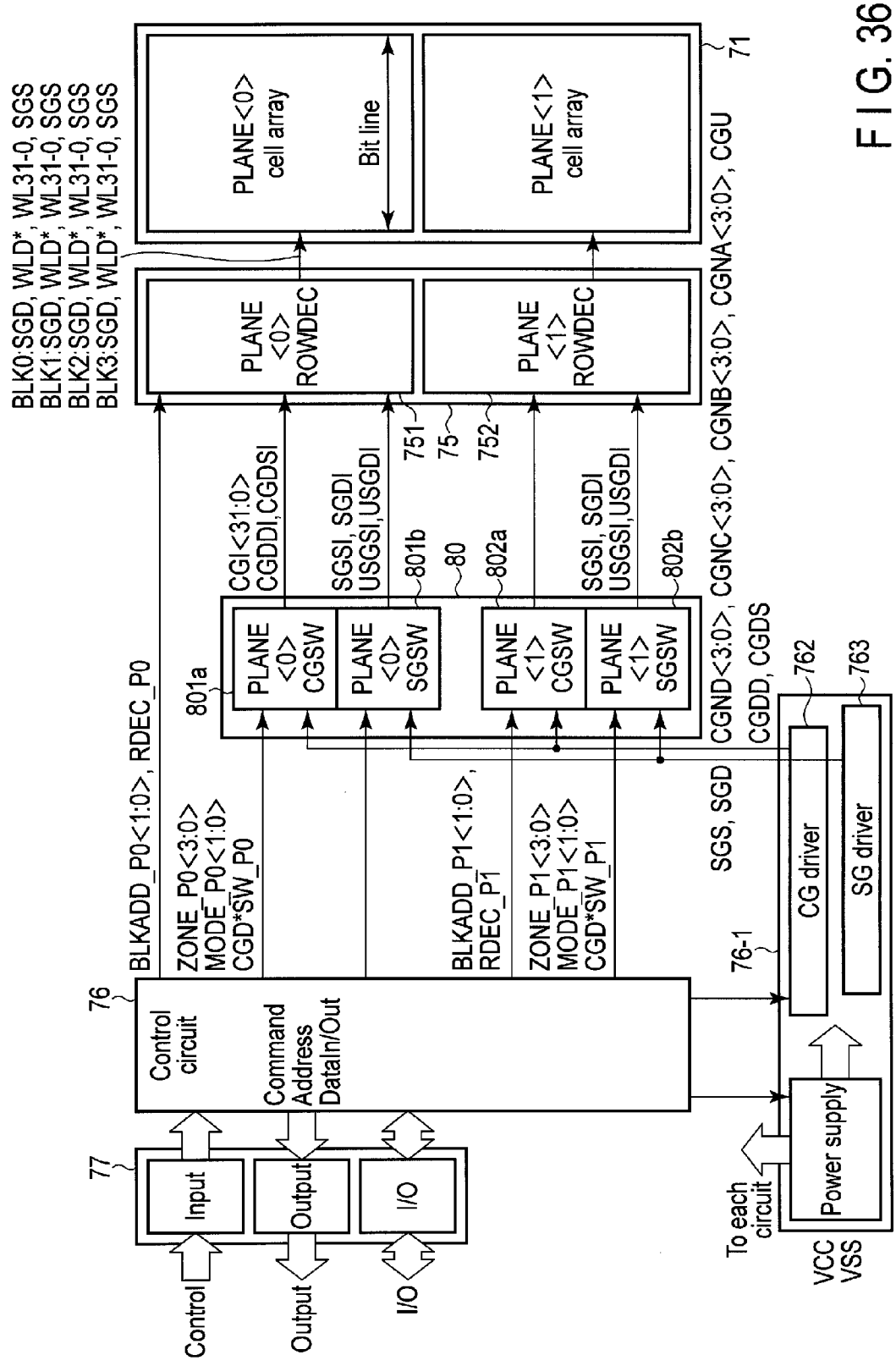
F I G. 36

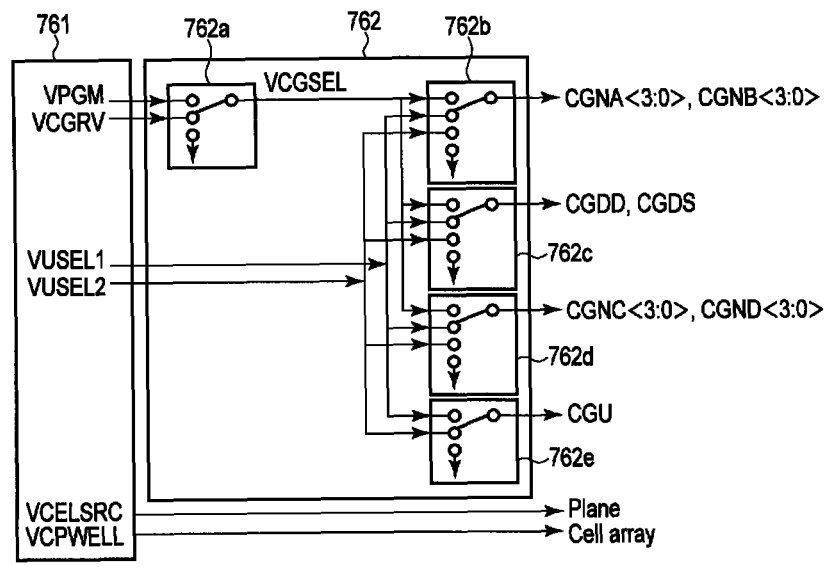
F I G. 37
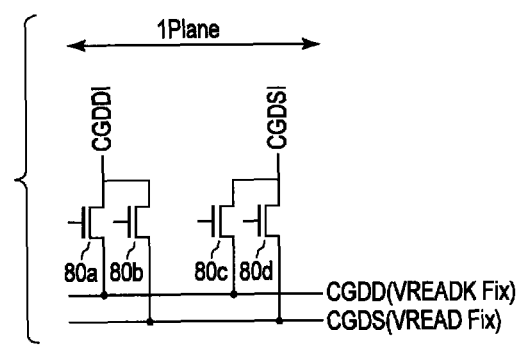
F I G. 38

| CGI Connect Control | | CGI<31:28> Output | | | | | | | |
|---|---|---|---|---|---|---|---|---|---|
| MODE<1:0> | ZONE<2:0> | <31:28> | <27:24> | <23:20> | <19:16> | <15:12> | <11:8> | <7:4> | <3:0> |
| 00 (Erase) | Don't Care | CGND<3:0> | CGNC<3:0> | CGNB<3:0> | CGNA<3:0> | CGND<3:0> | CGNC<3:0> | CGNB<3:0> | CGNA<3:0> |
| 01 (Program) | 000 | CGU | CGU | CGU | CGU | CGND<3:0> | CGNC<3:0> | CGNB<3:0> | CGNA<3:0> |
| | 001 | CGU | CGNC<3:0> | CGU | CGU | CGND<3:0> | CGU | CGNB<3:0> | CGNA<3:0> |
| | 010 | CGU | CGU | CGNB<3:0> | CGU | CGND<3:0> | CGNC<3:0> | CGU | CGNA<3:0> |
| | 011 | CGU | CGU | CGU | CGNA<3:0> | CGND<3:0> | CGNC<3:0> | CGNB<3:0> | CGU |
| | 100 | CGND<3:0> | CGNC<3:0> | CGNB<3:0> | CGNA<3:0> | CGND<3:0> | CGU | CGU | CGU |
| | 101 | CGND<3:0> | CGNC<3:0> | CGNB<3:0> | CGNA<3:0> | CGU | CGNC<3:0> | CGU | CGU |
| | 110 | CGND<3:0> | CGNC<3:0> | CGNB<3:0> | CGNA<3:0> | CGU | CGU | CGNB<3:0> | CGU |
| 10 (Read-A) | 000 | CGU | CGU | CGU | CGU | CGU | CGU | CGU | CGNA<3:0> |
| | 001 | CGU | CGU | CGU | CGU | CGU | CGNA<3:0> | CGNB<3:0> | CGU |
| | 010 | CGU | CGU | CGU | CGU | CGNB<3:0> | CGNA<3:0> | CGU | CGU |
| | 011 | CGU | CGU | CGU | CGNA<3:0> | CGNB<3:0> | CGU | CGU | CGU |
| | 100 | CGU | CGU | CGNB<3:0> | CGNA<3:0> | CGU | CGU | CGU | CGU |
| | 101 | CGU | CGNC<3:0> | CGNB<3:0> | CGU | CGU | CGU | CGU | CGU |
| | 110 | CGNB<3:0> | CGNA<3:0> | CGU | CGU | CGU | CGU | CGND<3:0> | CGNC<3:0> |
| 11 (Read-B) | 000 | CGU | CGU | CGU | CGU | CGU | CGU | CGND<3:0> | CGNC<3:0> |
| | 001 | CGU | CGU | CGU | CGU | CGU | CGNC<3:0> | CGND<3:0> | CGU |
| | 010 | CGU | CGU | CGU | CGU | CGND<3:0> | CGNC<3:0> | CGU | CGU |
| | 011 | CGU | CGU | CGU | CGNC<3:0> | CGND<3:0> | CGU | CGU | CGU |
| | 100 | CGU | CGU | CGND<3:0> | CGNC<3:0> | CGU | CGU | CGU | CGU |
| | 101 | CGU | CGNC<3:0> | CGND<3:0> | CGU | CGU | CGU | CGU | CGU |
| | 110 | CGND<3:0> | CGNC<3:0> | CGU | CGU | CGU | CGU | CGU | CGU |

F I G. 42A

{ 
CGDDI Connect Control

| CGDDSW | CGDDI Output |
|---|---|
| 0 | CGDD |
| 1 | CGDS |

CGDSI Connect Control

| CGDSSW | CGDSI Output |
|---|---|
| 0 | CGDS |
| 1 | CGDD |
}

F I G. 42B

CGSW Control Signal (hSLC)

| | Plane0 (Sel=Edge WL) | Plane1 (Sel=MidWL) |
|---|---|---|
| ZONE<3:0> | 110 | 011 |
| MODE<1:0> | 10 | 11 |
| CGDDSW | 0 | 1 |
| CGDSSW | 0 | 0 |

F I G. 43A

WL Voltage (hSLC)

| | Plane0 (Sel=Edge WL) | Plane1 (Sel=Edge WL) |
|---|---|---|
| WLDD | CGDDI=CGDD=VREADK | CGDDI=CGDS=VREAD |
| WL31 | CGI<31>=CGNB<3>=VCGRV | CGI<31>=CGU=VREAD |
| WL30 | CGI<30>=CGNB<2>=VREADK | CGI<30>=CGU=VREAD |
| WL29 | CGI<29>=CGNB<1>=VREAD | CGI<29>=CGU=VREAD |
| WL28 | CGI<28>=CGNB<0>=VREAD | CGI<28>=CGU=VREAD |
| : | : | : |
| WL19 | CGI<19>=CGU=VREAD | CGI<19>=CGNC<3>=VREAD |
| WL18 | CGI<18>=CGU=VREAD | CGI<18>=CGNC<2>=VREAD |
| WL17 | CGI<17>=CGU=VREAD | CGI<17>=CGNC<1>=VREAD |
| WL16 | CGI<16>=CGU=VREAD | CGI<16>=CGNC<0>=VREADK |
| WL15 | CGI<14>=CGU=VREAD | CGI<15>=CGND<3>=VCGRV |
| WL14 | CGI<14>=CGU=VREAD | CGI<14>=CGND<2>=VREADK |
| WL13 | CGI<13>=CGU=VREAD | CGI<13>=CGND<1>=VREAD |
| WL12 | CGI<12>=CGU=VREAD | CGI<12>=CGND<0>=VREAD |
| : | : | : |
| WL3 | CGI<3>=CGU=VREAD | CGI<3>=CGU=VREAD |
| WL2 | CGI<2>=CGU=VREAD | CGI<2>=CGU=VREAD |
| WL1 | CGI<1>=CGU=VREAD | CGI<1>=CGU=VREAD |
| WL0 | CGI<0>=CGU=VREAD | CGI<0>=CGU=VREAD |
| WLDS | CGDSI=CGDS=VREAD | CGDSI=CGDS=VREAD |

F I G. 43B

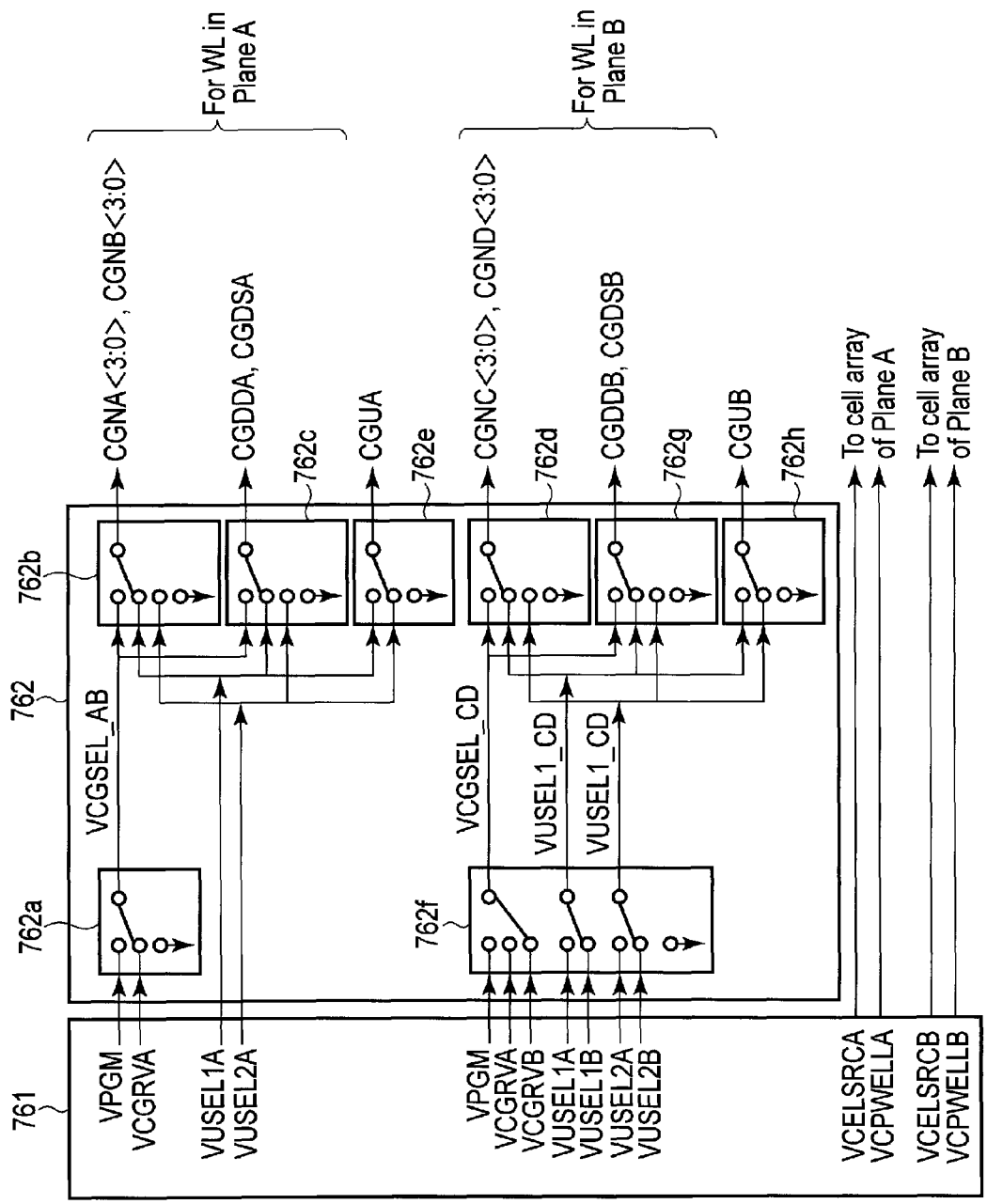
F I G. 44

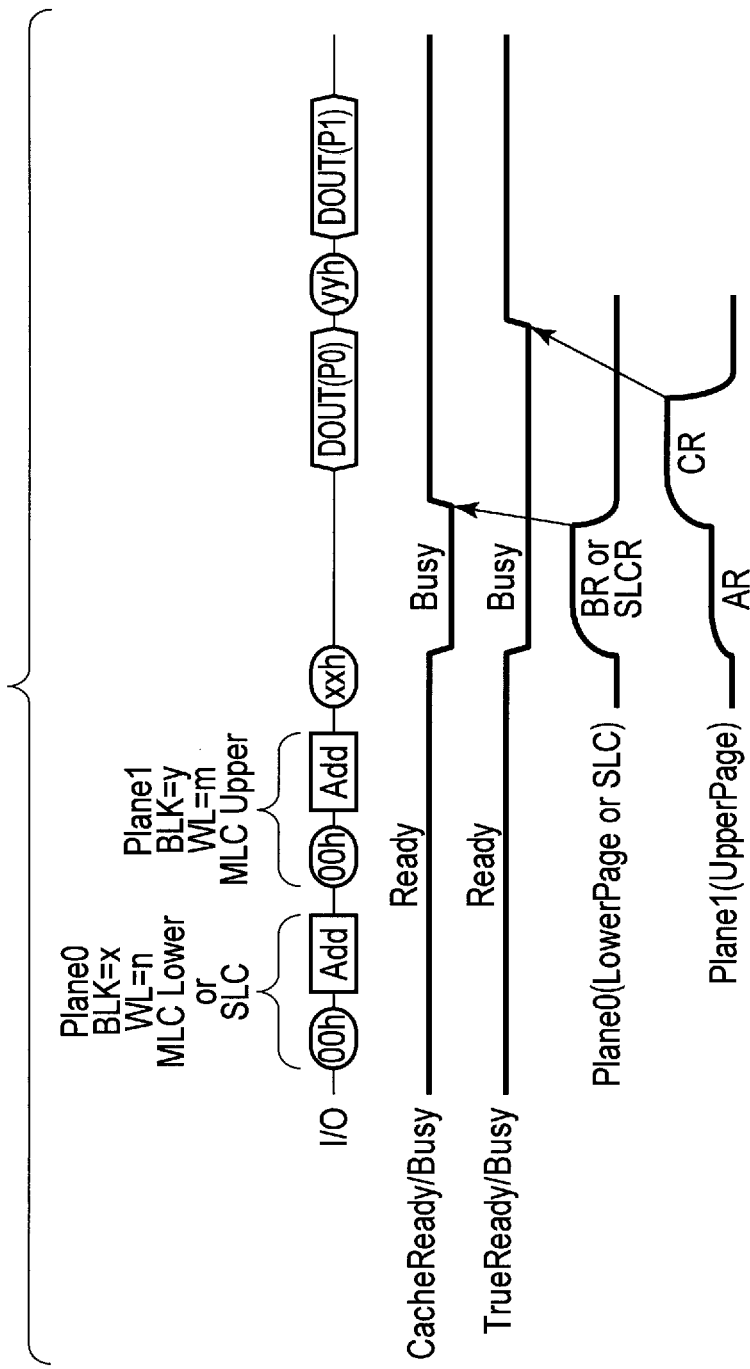
F I G. 45

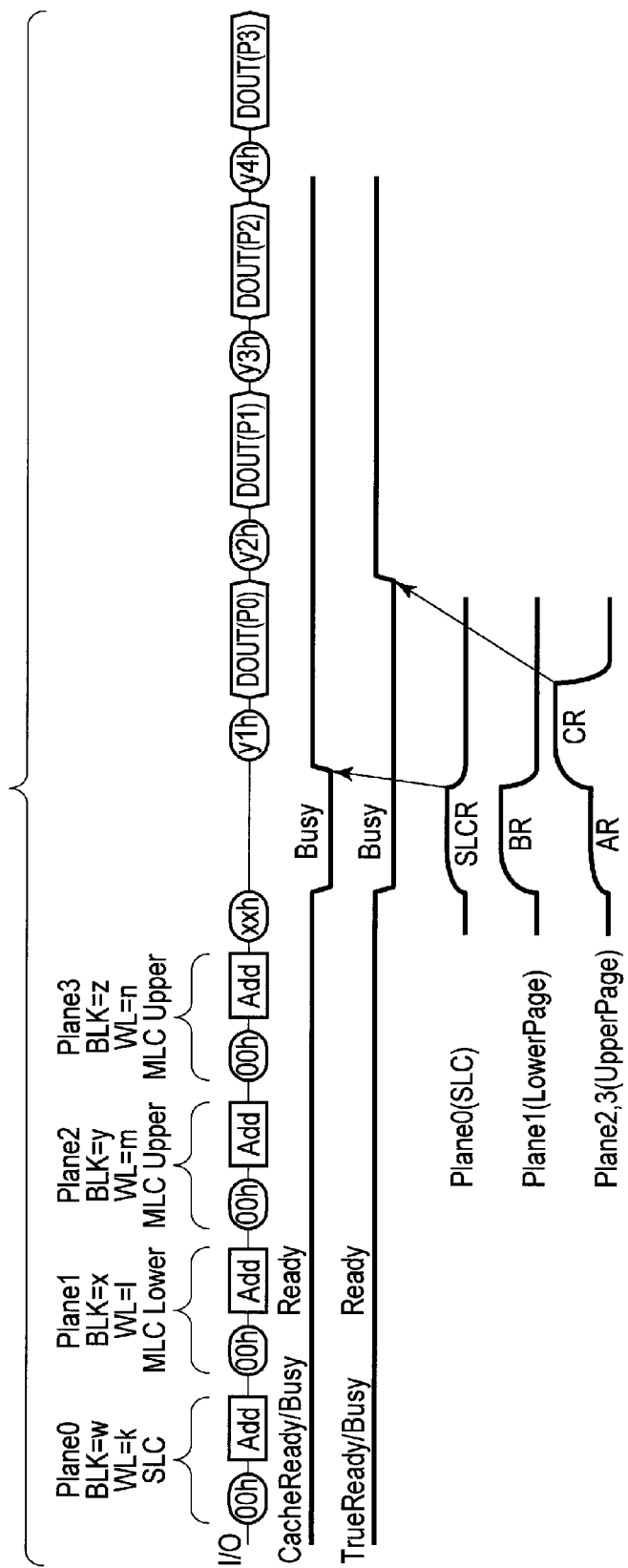
F I G. 46

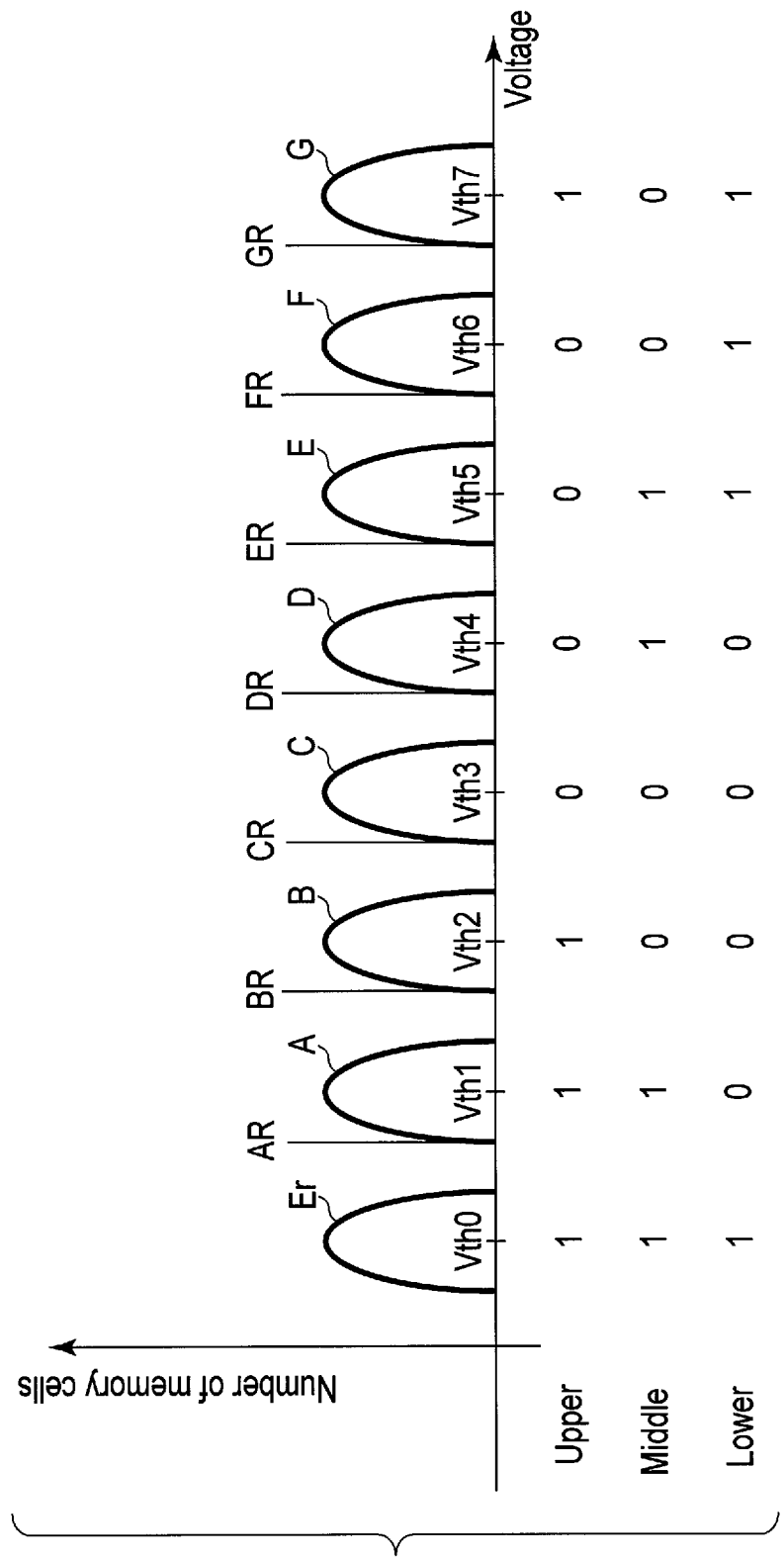
F I G. 47

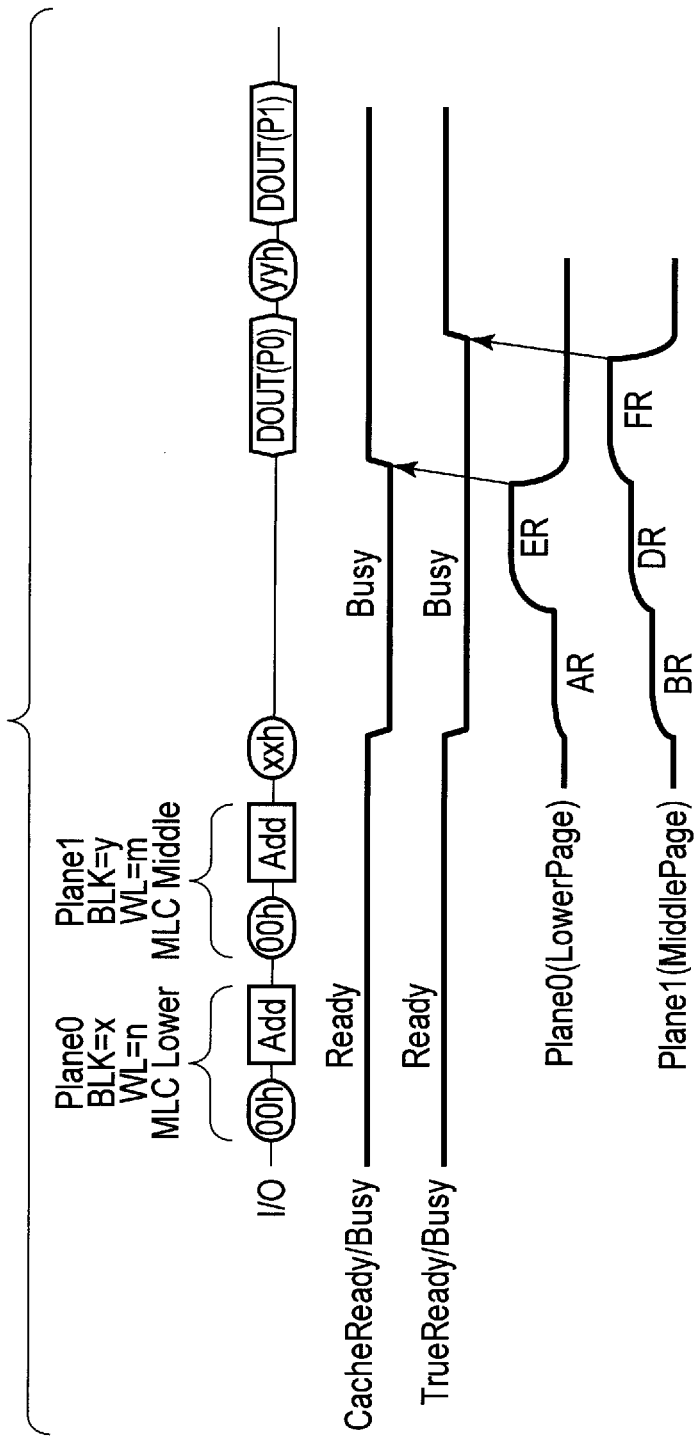
F I G. 49

MEMORY SYSTEM

CROSS-REFERENCE TO RELATED APPLICATIONS

This application is a Continuation application of PCT Application No. PCT/JP2013/072125, filed Aug. 19, 2013, the entire contents of all of which are incorporated herein by reference.

FIELD

Embodiments described herein relate generally to a memory system.

BACKGROUND

Currently, as the range of application purposes of a nonvolatile semiconductor memory device (memory) increases, the memory capacity is also increasing.

BRIEF DESCRIPTION OF THE DRAWINGS

FIG. 1 is a block diagram showing the circuit arrangement of a 3D-stacked nonvolatile semiconductor memory device according to the first embodiment;

FIG. 2 shows a memory cell array according to the first embodiment;

FIG. 3 shows the arrangement of a plurality of U-shaped strings connected to one bit line out of one block of the p-BiCS memory according to the first embodiment;

FIG. 4 is a block diagram schematically showing the relationship between drivers and plane switches according to the first embodiment;

FIG. 5 is a block diagram schematically showing a CG driver according to the first embodiment;

FIG. 12A shows the relationship between zone signals and CG drivers in the erase operation, program operation, and read operation;

FIG. 14 is a flowchart showing an access combination operation according to the second embodiment;

FIG. 15 shows parallel access to data on pages having different page numbers, where each page is included in a block in a different plane of the semiconductor memory device according to the second embodiment;

FIG. 16 is a flowchart showing an access combination operation according to the third embodiment;

FIG. 17 shows parallel access to data on pages having different page numbers, where each page is included in a block in a different plane of a semiconductor memory device according to the third embodiment;

FIG. 19 shows parameters dedicated to hSLC;

FIG. 20 is a view showing the read sequence in operation options according to the fourth embodiment;

FIG. 22A shows a read operation waveform in case of read of SLC data and hSLC data in an operation option A according to the fourth embodiment;

FIG. 22B shows a read operation waveform in case of read of MLC-Lower data and hSLC data;

FIG. 22C shows a read operation waveform in case of read of MLC-Upper data and hSLC data;

FIG. 23A shows a read operation waveform in case of read of SLC data and hSLC data in an operation option B according to the fourth embodiment;

FIG. 23B shows a read operation waveform in case of read of MLC-Lower data and hSLC data;

FIG. 23C shows a read operation waveform in case of read of MLC-Upper data and hSLC data;

FIG. 24 is a table showing symbols used in a command sequence and the meanings of the symbols;

FIG. 25 is a view showing the command sequence when programming hSLC data and its internal operation waveform;

FIG. 26 is a view showing the command sequence when reading hSLC data and its internal operation waveform;

FIG. 28 shows an example of addresses used in multiplane access;

FIG. 29A is a view showing signals when a selected word line WL is located near a dummy word line WLD in a read operation;

FIG. 29B is a view showing the types of CG drivers used for word lines WL and voltages applied to the word lines WL;

FIG. 36 is a block diagram schematically showing the relationship between CG drivers and plane switches according to the eighth embodiment;

FIG. 37 is a block diagram schematically showing a CG driver according to the eighth embodiment;

FIG. 38 is a circuit diagram of switches concerning CGD of a plane switch CGSW according to the eighth embodiment;

FIG. 42A shows the relationship between zone signals and CG drivers in the erase operation, program operation, and read operation;

FIG. 42B shows the relationship between switch signals and output signals;

FIG. 43A is a view showing signals when a selected word line WL is located near a dummy word line WLD in a read operation;

FIG. 43B is a view showing the types of CG drivers used in word lines WL and voltages applied to the word lines WL; and FIG. 44 is a block diagram schematically showing CG drivers according to the 10th embodiment.

FIG. 45 is a view showing a command sequence at the time of data read for two planes and operation waveforms at the time of read;

FIG. 46 is a view showing a command sequence at the time of data read for four planes and operation waveforms at the time of read;

FIG. 47 is a graph showing a threshold distribution while plotting a voltage along the abscissa and the number of memory cell transistors MT along the ordinate;

FIG. 49 is a view showing a command sequence at the time of data read for two planes and operation waveforms at the time of read;

DETAILED DESCRIPTION

Figure 6:
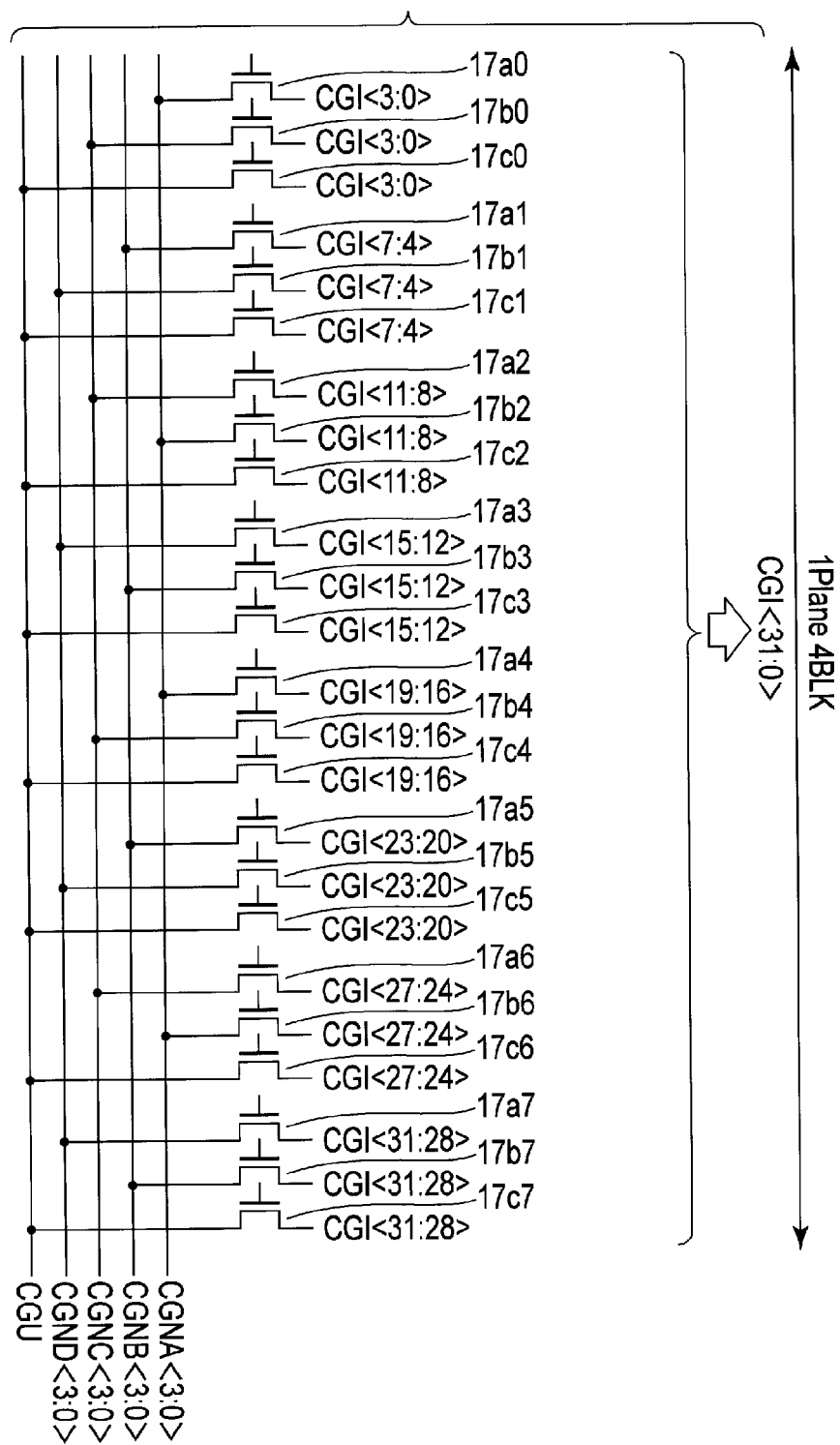
FIG. 6 is a circuit diagram of switches concerning CGN in a plane switch CGSW according to the first embodiment.

In general, according to one embodiment, a memory system includes a memory device, and a controller which controls the memory device. The memory device includes a plurality of memory cells capable of rewriting data, plurality of word lines connected to the plurality of memory cells, a page including the plurality of memory cells connected to the same word line, a plane including a plurality of pages, a memory cell array including a plurality of planes, and a plurality of word line drivers which apply voltages to the plurality of word lines, and a plurality of switches provided for each plane and which assigns the word line drivers to the word lines.

Embodiments will now be described with reference to the accompanying drawings. In the following explanation, the same reference numerals denote constituent elements having almost the same functions and arrangements, and a repetitive explanation will be made only when necessary. The dimensional ratios of the drawings are not limited to the illustrated ratios. The embodiments to be described below merely exemplify devices and methods for embodying the technical concepts of the embodiments, and the materials, shapes, structures, layouts, and the like of the components are not limited to those to be described below. The technical concepts of the embodiments can variously be modified in the appended claims.

(First Embodiment)

<Arrangement of Nonvolatile Semiconductor Memory Device>

FIG. 1 is a block diagram showing the circuit arrangement of a 3D-stacked nonvolatile semiconductor memory device (memory system) according to the first embodiment.

In recent years, as an approach to improve the bit density of a NAND flash memory, a stacked NAND flash memory formed by stacking memory cells, that is, a so-called BiCS (Bit-Cost Scalable) flash memory has been proposed.

A 3D-stacked nonvolatile semiconductor memory device (memory system) 1 according to this embodiment includes a BiCS flash memory (to be also simply referred to as a flash memory or a memory device) 10 and a memory controller 20.

The BiCS flash memory 10 includes a memory cell array 11, a sense amplifier 12, a column address buffer/column decoder 13, a row decoder 21, a control circuit 15, a voltage generation circuit 16, a plane switch 17, a row address buffer 18, and an input/output buffer 19.

The memory cell array 11 is a 3D-stacked nonvolatile semiconductor memory device in which a plurality of memory cells are stacked in the vertical direction, as will be described later. For example, column replacement information used to replace defective columns, parameters for determining various operation modes, trimming results to generate various voltages, and bad block information representing defective blocks are stored in part of the memory cell array 11. Bad block information representing acquired bad blocks may be stored in part of the memory cell array 11.

<Sense Amplifier and Column Address Buffer/Column Decoder>

As shown in FIG. 1, the sense amplifier 12 is connected to the memory cell array 11 via bit lines BL. The memory cell array 11 includes a plurality of blocks BLK. For example, data of memory cell transistors MT in the same block BLK are erased at once. On the other hand, data read or write is performed at once for the plurality of memory cell transistors MT commonly connected to a word line WL in one memory group of one block BLK. This unit is called "page". The sense amplifier 12 reads data of the memory cell array 11 on a page basis at the time of read, and writes data in the memory cell array 11 on a page basis at the time of write.

The sense amplifier 12 is also connected to the column address buffer/column decoder 13. The sense amplifier 12 decodes a select signal input from the column address buffer/column decoder 13, selects one of the bit lines BL, and drives it.

The sense amplifier 12 also functions as a data latch that stores data at the time of write. The sense amplifier 12 according to this embodiment includes a plurality of data latch circuits. For example, a sense amplifier applied to an MLC (Multi Level Cell) that stores 2-bit data in one cell includes three data latches.

The column address buffer/column decoder 13 temporarily stores a column address signal input from the memory controller 20 via the input/output buffer 19, and outputs a select signal to select one of the bit lines BL to the sense amplifier 12 in accordance with the column address signal.

<Row Decoder>

The row decoder 21 decodes a row address signal input via the row address buffer 18, selects the word lines WL and select gate lines SGD and SGS of the memory cell array, and drives them. The row decoder 21 includes a portion that selects a block of the memory cell array 11 and a portion that selects a page.

Note that the BiCS flash memory 10 according to this embodiment includes an external input/output terminal I/O (not shown). Data exchange between the input/output buffer 19 and the memory controller 20 is done via the external input/output terminal I/O. An address signal input via the external input/output terminal I/O is output to the row decoder 21 and the column address buffer/column decoder 13 via the row address buffer 18.

<Control Circuit>

The control circuit 15 controls data write and erase sequences and a read operation based on a command CMD and various external control signals (write enable signal WEn, read enable signal REn, command latch enable signal CLE, address latch enable signal ALE, and the like) supplied via the memory controller 20.

<Voltage Generation Circuit>

The voltage generation circuit 16 is controlled by the control circuit 15 and generates various internal voltages necessary for write, erase, and read operations. The voltage generation circuit 16 includes a boost circuit which generates an internal voltage higher than the power supply voltage.

<Plane Switch>

The plane switch 17 is connected to the control circuit 15, the voltage generation circuit 16, and the like. The plane switch 17 switches the output destination of a voltage from the voltage generation circuit 16 based on signals from the control circuit 15 and the like and supplies it to the row decoder 21.

<Memory Controller>

The memory controller 20 is connected to a host (to be also referred to as a host device or an external apparatus) 2 via a host interface 30. The memory controller 20 outputs a command or the like necessary for the operation of the BiCS flash memory 10 and performs read, write, and erase of the BiCS flash memory 10. The memory controller 20 includes a CPU, a ROM (Read only memory), a RAM (Random Access Memory), and an ECC (Error Correcting Code) circuit.

<Host>

The host 2 issues a data read request or write request to the memory controller 20 via the host interface 30. Data exchanged between the host 2 and the memory controller 20 will be referred to as "user data" hereinafter. User data is generally managed by assigning a unique number called a logic address for a predetermined unit such as 512 bytes.

<Memory Cell Array>

FIG. 2 shows the memory cell array 11 according to the first embodiment. Note that FIG. 2 shows four layers of word lines WL for a descriptive convenience.

FIG. 2 is a perspective view showing an example of the element structure of the memory cell array 11 according to this embodiment. The memory cell array according to this embodiment is a p-BiCS memory in which the lower ends of a plurality of adjacent memory cells which are series-connected are connected by a transistor called a pipe connection.

The memory cell array 11 includes m×n (m and n are natural numbers) NAND strings MS. FIG. 2 shows an example of m=6 and n=2. In each NAND string MS, the lower ends of adjacent structures of a plurality of series-connected transistors (MTr0 to MTr7) are pipe-connected, and a source-side select transistor SGSTr and a drain-side select transistor SGDTr are arranged on the upper ends.

In the nonvolatile semiconductor memory device according to this embodiment, the memory cell transistors MTr (to be referred to as "memory cells" hereinafter) of the NAND strings MS are formed by stacking a plurality of conductive layers. Each NAND string MS includes a U-shaped semiconductor structure SC, the word lines WL (WL0 to WL7), the source-side select gate line SGS, and the drain-side select gate line SGD. The NAND string MS also includes a back gate line BG.

The U-shaped semiconductor structure SC is formed into a U-shape when viewed from the row direction. The U-shaped semiconductor structure SC includes a pair of columnar portions CL extending in a direction almost perpendicular to a semiconductor substrate Ba, and a connecting portion JP formed to connect the lower ends of the pair of columnar portions CL.

The U-shaped semiconductor structure SC is arranged such that a line that connects the central axes of the pair of columnar portions CL runs in parallel to the column direction. The U-shaped semiconductor structures SC are arranged in a matrix in the plane formed in the row direction and the column direction.

The word lines WL of each layer extend in parallel to the column direction. The word lines WL of each layer are formed into a line shape while being insolated from each other at a predetermined interval in the column direction.

The gates of memory cells (MTr0 to MTr7) provided at the same position in the column direction and arranged in the row direction are connected to the same word line WL. Each word line WL is arranged to be almost perpendicular to the NAND strings MS.

The drain-side select gate line SGD is provided above the word line WL of the uppermost portion and extends in parallel to the row direction. The source-side select gate line SGS is provided above the word line WL of the uppermost portion and extends in parallel to the row direction, like the drain-side select gate line SGD.

The source-side select transistor SGSTr is connected to a common source line SL, and the drain-side select transistor SGDTr is connected to the bit lines BL of the uppermost layer.

<Arrangement of Strings>

FIG. 3 shows the arrangement of a plurality of U-shaped strings connected to one bit line out of one block of a general p-BiCS memory. The p-BiCS memory includes, for example, word lines of m (m is an integer of 1 or more) layers, and a plurality of U-shaped strings are connected to one bit line BL. U-shaped strings connected to the plurality of bit lines BL form one block.

In the embodiments, a group of strings having a common word lines will be referred to as a physical block hereinafter. In the embodiments, the block does not mean an erase unit. Data erase can be executed on the basis of, for example, strings that share the source line SL or another unit.

The configuration of the memory cell array 11 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

<Arrangement of Drivers According to First Embodiment>

FIG. 4 is a block diagram schematically showing the relationship between drivers and plane switches according to the first embodiment. FIG. 5 is a block diagram schematically showing a CG driver according to the first embodiment.

A case where the memory cell array 11 includes two planes will be explained with reference to FIG. 4 for the sake of simplicity. In this embodiment, a case where one plane includes four blocks will be described.

As shown in FIG. 4, the voltage generation circuit 16 includes a power supply 161, a CG driver (to be also referred to as a word line driver) 162, and an SG driver 163. The power supply 161 supplies power to the CG driver 162, the SG driver 163, and other circuits.

As shown in FIG. 5, the CG driver 162 includes CGN drivers 162b and 162d, CGD drivers 162c, a CGU driver 162e, and if the memory is a p-BiCS memory, a CGBD driver 162c, and the like. Each CGN driver drives the word lines WL (to be also referred to as Data WL) that store data on a line-by-line basis.

As will be described later, it is important to perform control at the time of program operation of the NAND semiconductor memory device to prevent generation of a tunnel current by boosting the channel of a cell not to be write-accessed on a selected word line WLi (i is an integer of 0 or more). To do this, the device is designed such that voltages can optimally be controlled within the range of unselected word lines WL(i±6) to WL(i±9) in the NAND strings, and optimum settings are done based on chip evaluation to enable mass production. Drivers for this purpose are CGN drivers.

An examination can be made to prepare a dedicated CGN driver for each word line WL for storing data in a NAND semiconductor memory device including, for example, 32 word lines WL in each NAND string and selectively apply optimum voltages to the word lines WL before and after any word line WL to be programmed. However, if the number of word lines WL in each NAND string increases to 64 or more, and one CGN driver is prepared for each word line WL, the number of CGN drivers increases along with the increase in the number of word lines WL. As a result, the chip area increases.

In this embodiment, CGN drivers capable of driving the unselected word lines WL(i±6) to WL(i±9) and the CGU driver (to be described later) that drives the remaining word lines WL altogether are appropriately switched based on selected word line WL information (zone). This is called a CGN driver decoding method. This can make the number of CGN drivers stay at about 16 to 24 even when the number of word lines WL in each NAND string increases to 64 to 128 or more and suppress the chip area.

Since the CGN drivers switch the connection on a division basis, they are grouped into, for example, CGNA drivers <0> to <3> (expressed as <3:0> or the like altogether), CGNB drivers <3:0>, CGNC drivers <3:022 , and CGND drivers <3:0>. Note that the CGNA drivers <3:0>, the CGNB drivers <3:0>, the CGNC drivers <3:0>, and the CGND drivers <3:0> will simply be referred to as CGN drivers, CGN*, or the like hereinafter if they need not be discriminated.

As shown in FIG. 5, the CG driver 162 according to the first embodiment includes a VCGSEL circuit 162a, the CGN drivers 162b and 162d (16 in total), the CGD drivers 162c (four in total), the CGBG driver 162c, and the CGU driver 162e. Each of the CG drivers other than the CGU driver 162e outputs one of voltages VCGSEL, VUSEL1, VUSEL2, and VSS. The CGU driver 162e outputs the voltages VUSEL1, VUSEL2, and VSS. The VCGSEL circuit 162a, the CGN drivers 162b and 162d, the CGD drivers 162c, the CGBG driver 162c, and the CGU driver 162e are controlled by a control signal from the control circuit 15.

The voltage VCGSEL is selected by the VCGSEL circuit 162a. For example, voltages VPGM and VCGRV are input to the VCGSEL circuit 162a, and the VCGSEL circuit 162a selects one of them in accordance with the control signal from the control circuit 15.

The voltage VPGM is a voltage (cell program voltage) to be applied to the selected word line WLi when programming a selected cell. The voltage VCGRV is a voltage (cell read voltage) to be applied to the selected word line WLi at the time of read or program verify. The voltage VUSEL1 is a voltage VPASS1 for channel boost at the time of program. It is a voltage VREADK to be applied to the unselected word line WL(i±1) at the time of read or program verify. The voltage VUSEL2 is a voltage VPASS2 for channel boost at the time of program. It is a voltage VREAD to be applied to the unselected word line WL except the selected word line WLi and the unselected word line WL(i±1) at the time of read or program verify. Voltages VCELSRC and VCPWELL are connected to the memory cell array 11.

As shown in FIG. 5, each of the CGN drivers 162b and 162d includes a circuit that has the function of a switch and selectively outputs various kinds of word line WL application voltages generated by the power supply 161.

The CGD drivers 162c drives the word lines WL (to be also referred to as Dummy WL) that do not store data on a line-by-line basis. The CGD drivers include a CGDDT driver, a CGDDB driver, a CGDSB driver, and a CGDST driver. In the read operation of this embodiment, the CGDDT driver and the CGDST driver selectively output, for example, the voltage VREADK. The CGDDB driver and the CGDSB driver selectively output the voltage VREAD. The CGDDT driver, the CGDDB driver, the CGDSB driver, and the CGDST driver will simply be referred to as CGD drivers, CGD*, or the like hereinafter if they need not be discriminated.

The CGU driver 162e can select only a few voltages but has a driving force. In the program or read operation, the word lines WL far part from the selected word line WL are equally driven by the same potential. The CGU driver is used for this purpose.

In the memory cell array 11 according to this embodiment, a back gate is provided under the U-shaped strings. The CGBG driver 162c is used to drive the back gate.

The SG driver 163 supplies power to a selected gate and the like of the memory cell array 11.

The plane switch 17 includes plane switches CGSW and SGSW for each plane of the memory cell array 11. More specifically, the plane switch 17 includes a plane switch CGSW 171a and a plane switch SGSW 171b in correspondence with a plane <0>, and a plane switch CGSW 172a and a plane switch SGSW 172b in correspondence with a plane <1>.

The plane switch CGSW 171a receives a zone signal ZONE_P0<3:0>, a mode signal MODE_P0<1:0>, and CGD*SW_P0 from the control circuit 15. The plane switch CGSW 171a also receives signals from the CGNA driver <3:0>, the CGNB driver <3:0>, the CGNC driver <3:0>, and the CGND driver <3:0>, the CGDDT driver, the CGDDB driver, the CGDSB driver, and the CGDST driver, the CGBG driver, and the CGU driver. The plane switch CGSW 171*a* supplies the signals received from the CG driver 162 to the row decoder 21 based on the signals from the control circuit 15. The plane switch SGSW 171*b* supplies the SGS signal and the SGD signal received from the SG driver 163 to the row decoder 21 based on the signals from the control circuit 15.

The row decoder 21 includes a dedicated row decoder for each plane. More specifically, the row decoder 21 includes a row decoder 211 corresponding to the plane <0> and a row decoder 212 corresponding to the plane <1>.

The row decoder 211 receives a signal BLKADD_P0<1: 0> and a signal RDEC_P0 from the control circuit 15. The row decoder 211 also receives signals from the plane switch CGSW 171*a* via signal lines CGI<31:0>, CGDDTI, CGDDBI, CGDSBI, CGDSTI, and CGBGI. The row decoder 211 also receives signals from the plane switch SGSW 171*b* via signal lines SGSI, SGDI, USGDI, and USGDI. The row decoder 211 supplies the signals to the plane <0> based on the received signals. The row decoder 212 operates like the row decoder 211.

<Arrangement of Switches Concerning CGN in Plane Switch CGSW>

The arrangement of switches concerning CGN in the plane switch CGSW according to the first embodiment will briefly be described next with reference to FIG. 6. FIG. 6 is a circuit diagram of switches concerning CGN in the plane switch CGSW according to the first embodiment.

For example, in this embodiment, the plane switch CGSW 171*a* includes switches 17*a*0 to 17*a*7, 17*b*0 to 17*b*7, and 17*c*0 to 17*c*7.

CGNA<3:0> is input to one end of the voltage path of each of the switches 17*a*0 and 17*a*4, and CGNB<3:0> is input to one end of the voltage path of each of the switches 17*a*1 and 17*a*5. CGNC<3:0> is input to one end of the voltage path of each of the switches 17*a*2 and 17*a*6, and CGND<3:0> is input to one end of the voltage path of each of the switches 17*a*3 and 17*a*7.

The other end of the voltage path of the switch 17*a*0 is connected to the signal line CGI<3:0>, and the other end of the voltage path of the switch 17*a*1 is connected to the signal line CGI<7:4>. The other end of the voltage path of the switch 17*a*2 is connected to the signal line CGI<11:8>, and the other end of the voltage path of the switch 17*a*3 is connected to the signal line CGI<15:12>. The other end of the voltage path of the switch 17*a*4 is connected to the signal line CGI<19:16>, and the other end of the voltage path of the switch 17*a*5 is connected to the signal line CGI<23:20>. The other end of the voltage path of the switch 17*a*6 is connected to the signal line CGI<27:24>, and the other end of the voltage path of the switch 17*a*7 is connected to the signal line CGI<31:28>.

CGNC<3:0> is input to one end of the voltage path of each of the switches 17*b*0 and 17*b*4, and CGND<3:0> is input to one end of the voltage path of each of the switches 17*b*1 and 17*b*5. CGNA<3:0> is input to one end of the voltage path of each of the switches 17*b*2 and 17*b*6, and CGNB<3:0> is input to one end of the voltage path of each of the switches 17*b*3 and 17*b*7.

The other end of the voltage path of the switch 17*b*0 is connected to the signal line CGI<3:0>, and the other end of the voltage path of the switch 17*b*1 is connected to the signal line CGI<7:4>. The other end of the voltage path of the switch 17*b*2 is connected to the signal line CGI<11:8>, and the other end of the voltage path of the switch 17*b*3 is connected to the signal line CGI<15:12>. The other end of the voltage path of the switch 17*b*4 is connected to the signal line CGI<19:16>, and the other end of the voltage path of the switch 17*b*5 is connected to the signal line CGI<23:20>. The other end of the voltage path of the switch 17*b*6 is connected to the signal line CGI<27:24>, and the other end of the voltage path of the switch 17*b*7 is connected to the signal line CGI<31:28>.

CGU is input to one end of the voltage path of each of the switches 17*c*0 to 17*c*7. The other end of the voltage path of the switch 17*c*0 is connected to the signal line CGI<3:0>, and the other end of the voltage path of the switch 17*c*1 is connected to the signal line CGI<7:4>. The other end of the voltage path of the switch 17*c*2 is connected to the signal line CGI<11:8>, and the other end of the voltage path of the switch 17*c*3 is connected to the signal line CGI<15:12>. The other end of the voltage path of the switch 17*c*4 is connected to the signal line CGI<19:16>, and the other end of the voltage path of the switch 17*c*5 is connected to the signal line CGI<23:20>. The other end of the voltage path of the switch 17*c*6 is connected to the signal line CGI<27:24>, and the other end of the voltage path of the switch 17*c*7 is connected to the signal line CGI<31:28>.

Two types of signals for the control circuit 15 are input to the gates of the switches 17*a*0 to 17*a*7, 17*b*0 to 17*b*7, and 17*c*0 to 17*c*7. More specifically, signals based on the mode signal MODE<1:0> and the zone signal ZONE<2:0> are input to the gates of the switches 17*a*0 to 17*a*7, 17*b*0 to 17*b*7, and 17*c*0 to 17*c*7. The mode signal MODE<1:0> and the zone signal ZONE<2:0> will be described later.

<Arrangement of Switches Concerning CGD in Plane Switch CGSW>

Figure 7:
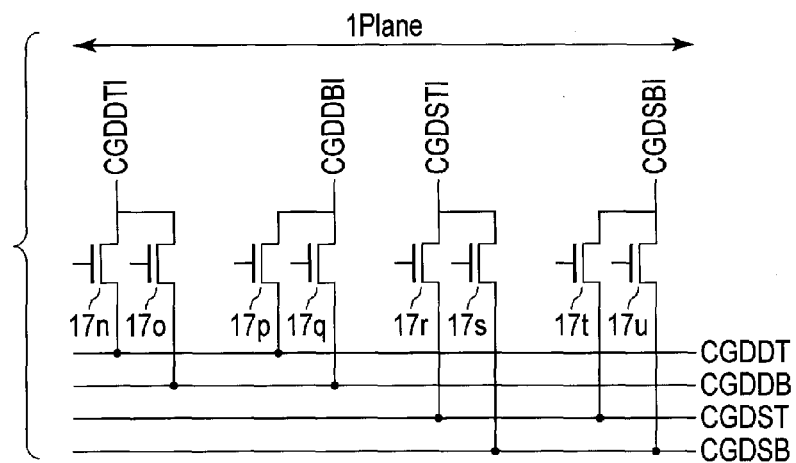
FIG. 7 is a circuit diagram of switches concerning CGD in the plane switch CGSW according to the first embodiment.

The arrangement of switches concerning CGD in the plane switch CGSW according to the first embodiment will briefly be described next with reference to FIG. 7. FIG. 7 is a circuit diagram of switches concerning CGD in the plane switch CGSW according to the first embodiment.

For example, in this embodiment, the plane switch CGSW 171*a* includes switches 17*n*, 17*o*, 17*p*, 17*q*, 17*r*, 17*s*, 17*t*, and 17*u*.

CGDDT is input to one end of the voltage path of the switch 17*n*. The other end of the voltage path is connected to the signal line CGDDTI. A signal CGDDTSW from the control circuit 15 is input to the gate.

CGDDB is input to one end of the voltage path of the switch 17*o*. The other end of the voltage path is connected to the signal line CGDDTI. The signal CGDDTSW from the control circuit 15 is input to the gate.

CGDDT is input to one end of the voltage path of the switch 17*p*. The other end of the voltage path is connected to the signal line CGDDBI. A signal CGDDBSW from the control circuit 15 is input to the gate.

CGDDB is input to one end of the voltage path of the switch 17*q*. The other end of the voltage path is connected to the signal line CGDDBI. The signal CGDDBSW from the control circuit 15 is input to the gate.

CGDST is input to one end of the voltage path of the switch 17*r*. The other end of the voltage path is connected to the signal line CGDSTI. A signal CGDSTSW from the control circuit 15 is input to the gate.

CGDSB is input to one end of the voltage path of the switch 17*s*. The other end of the voltage path is connected to the signal line CGDSTI. The signal CGDSTSW from the control circuit 15 is input to the gate.

CGDST is input to one end of the voltage path of the switch 17*t*. The other end of the voltage path is connected to the signal line CGDSBI. A signal CGDSBSW from the control circuit 15 is input to the gate.

CGDSB is input to one end of the voltage path of the switch 17u. The other end of the voltage path is connected to the signal line CGDSBI. The signal CGDSBSW from the control circuit 15 is input to the gate.

<Arrangement of Row Decoder>

Figure 8:
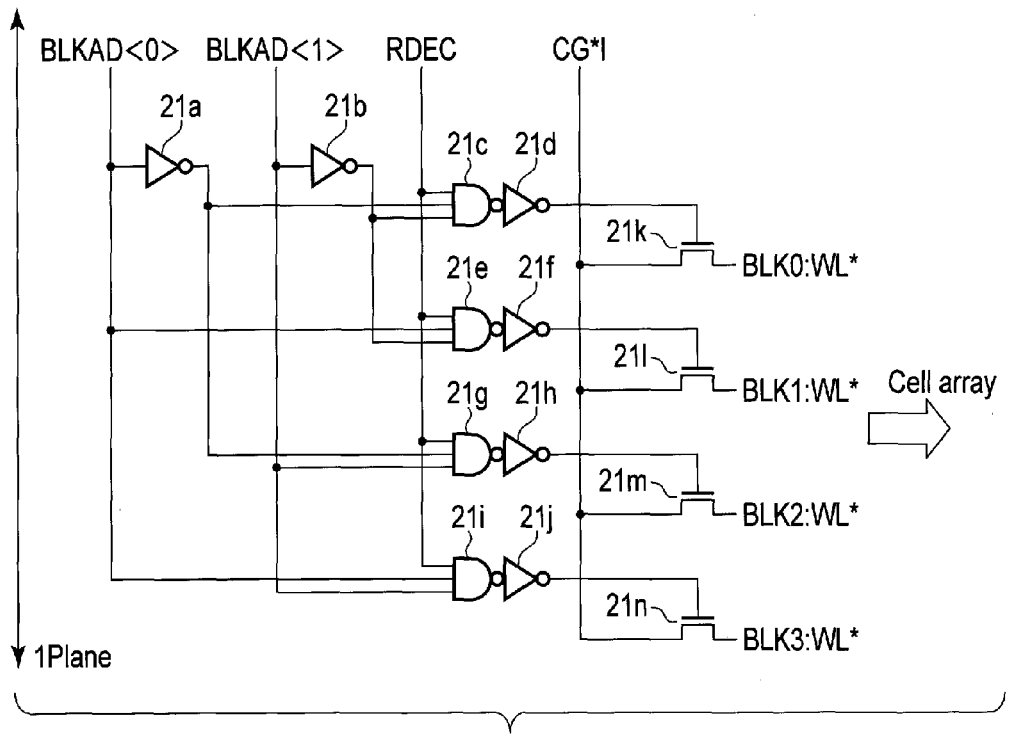
FIG. 8 is a circuit diagram of a row decoder according to the first embodiment.

The arrangement of the row decoder according to the first embodiment will briefly be described next with reference to FIG. 8. FIG. 8 is a circuit diagram of the row decoder according to the first embodiment.

The row decoder 21 selects the block BLK based on block addresses BLKAD<0> and BLKAD<1>, a decoding result RDEC, and the like.

That is, MOS transistors 21k, 21l, 21m, and 21n corresponding to the block BLK including the selected memory cell transistor MT are turned on.

For example, when the block address BLKAD<0> is "H", and the block address BLKAD<1> is "L", "H" is input to an inverter 21a, and "L" is input to an inverter 21b.

A NAND gate 21c receives "L" from the inverter 21a and "H" from the inverter 21b. Since "L" is input to the NAND gate 21c, the NAND gate 21c outputs "H" independently of RDEC. For this reason, an inverter 21d outputs "L" to the gate of the MOS transistor 21k.

A NAND gate 21e receives "H" as the block address BLKAD<0> and "H" from the inverter 21b. If RDEC is "H", the NAND gate 21C outputs "L". For this reason, an inverter 21f outputs "H" to the gate of the MOS transistor 21l. Hence, if RDEC is "H", a block BLK1 is selected.

A NAND gate 21g receives "L" from the inverter 21a and "L" as the block address BLKAD<1>. Since "L" is input to the NAND gate 21g, the NAND gate 21g outputs "H" independently of RDEC. For this reason, an inverter 21h outputs "L" to the gate of the MOS transistor 21m.

A NAND gate 21i receives "H" as the block address BLKAD<0> and "L" as the block address BLKAD<1>. Since "L" is input to the NAND gate 21i, the NAND gate 21i outputs "H" independently of RDEC. For this reason, an inverter 21j outputs "L" to the gate of the MOS transistor 21n.

<Example of CG Mapping>

Figure 9:
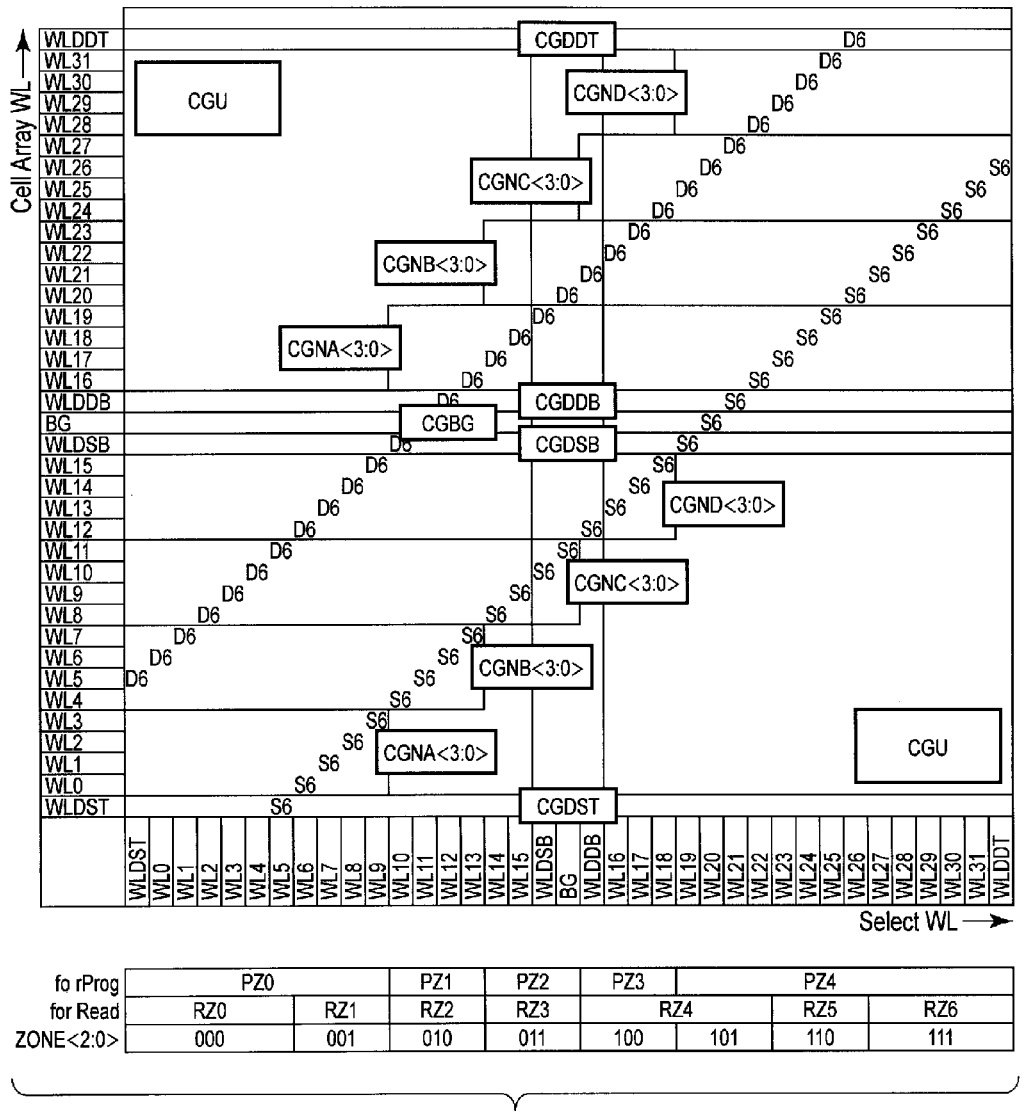
FIG. 9 is a view showing CG mapping in the program operation of the semiconductor memory device according to the first embodiment or a view showing CG mapping in the program and read operations of a related art.
Figure 10:
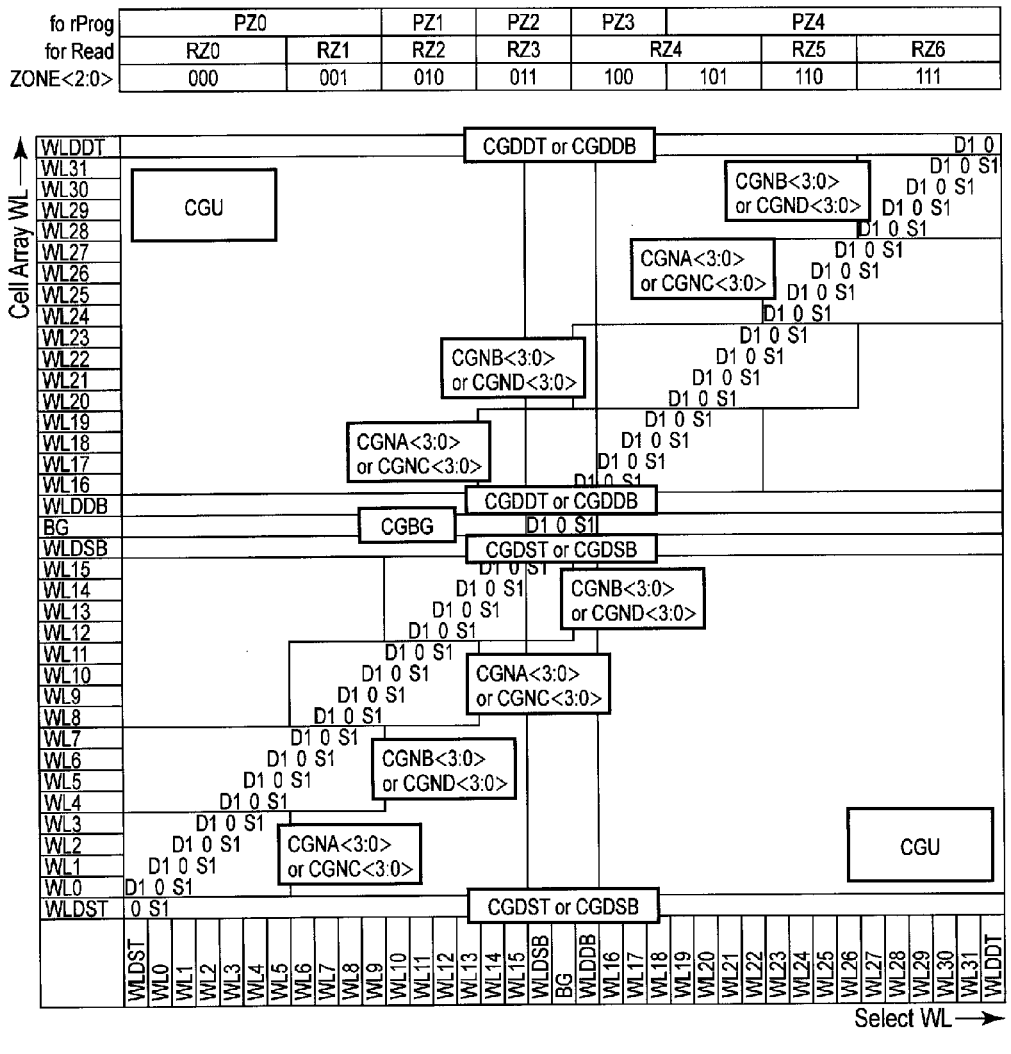
FIG. 10 is a view showing CG mapping in the read operation of the semiconductor memory device according to the first embodiment.
Figure 11:
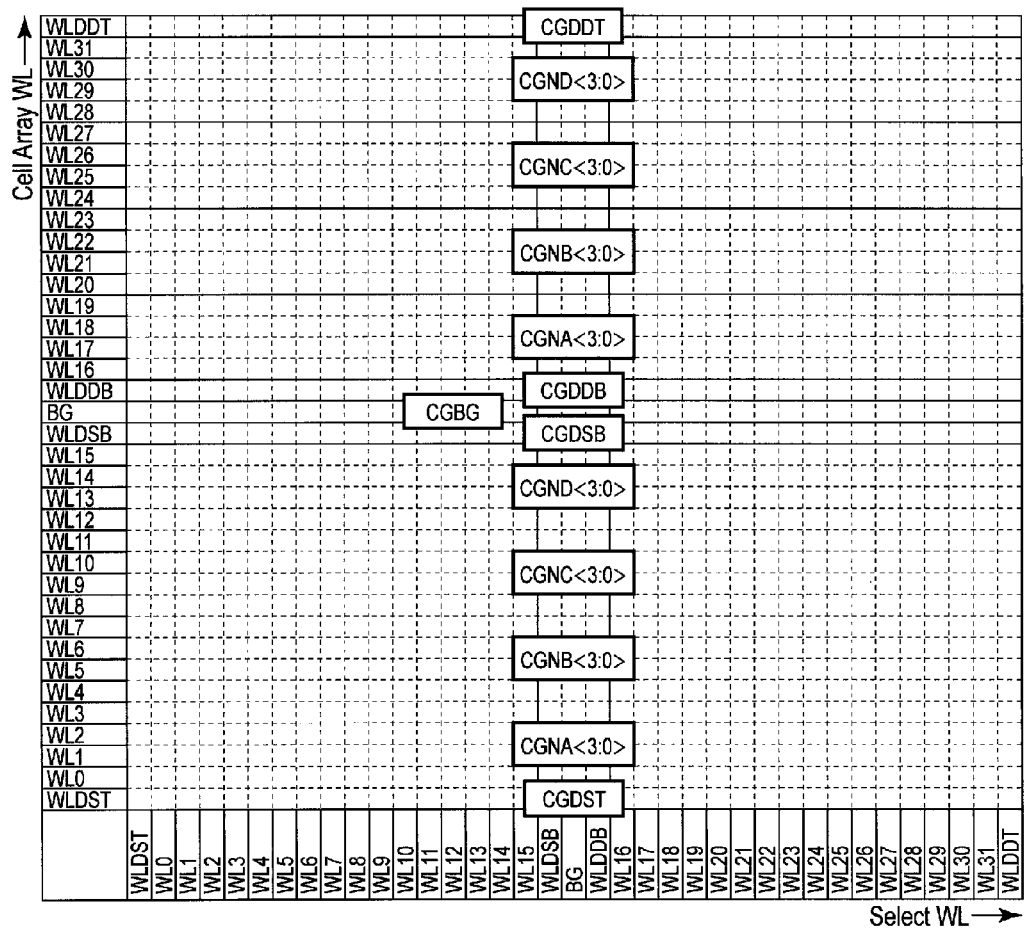
FIG. 11 is a view showing CG mapping in the erase operation of the semiconductor memory device according to the first embodiment.

CG mapping according to the first embodiment will briefly be described with reference to FIGS. 9, 10, and 11. FIG. 9 is a view showing CG mapping in the program operation of the semiconductor memory device according to the first embodiment. FIG. 10 is a view showing CG mapping in the read operation of the semiconductor memory device according to the first embodiment. FIG. 11 is a view showing CG mapping in the erase operation of the semiconductor memory device according to the first embodiment. Referring to FIGS. 9, 10 and 11, the ordinate represents CG driver assignment to the word lines WL, and the abscissa represents the selected word line WL.

Note that in the first embodiment, the CGDST driver always applies a dedicated voltage to a word line WLDST, and the CGDSB driver always applies a dedicated voltage to a word line WLDSB. Additionally, in the first embodiment, the CGDDB driver always applies a dedicated voltage to a word line WLDDB, and the CGDDT driver always applies a dedicated voltage to a word line WLDDT. Furthermore, in the first embodiment, the CGBG driver always applies a dedicated voltage to the back gate BG.

<Example of CG Mapping in Program Operation>

CG mapping in the program operation will be described first. As shown in FIG. 9, depending on the selected word line WL, the CG drivers that apply voltages to the word lines WL are appropriately switched.

The zone on the abscissa of FIG. 9 is information with which the control circuit 15 designates one of the CGN drivers and the CGU driver to be connected to each Data WL. For example, when an access type (program/read/erase) and the plane and page address to be accessed are input from the memory controller 20 to the BiCS flash memory 10, the control circuit 15 transmits MODE<1:0> and zone signal ZONE<3:0> (to be described later) to the plane switch circuit of the plane of interest, thereby designating how to connect the CGN or CGU driver to the CGI, that is, Data WL.

For example, when programming the word lines WLDST and WL0 to WL9, the CGNA driver applies a desired voltage to the word lines WL0 to WL3. Similarly, the CGNB driver, the CGNC driver, the CGND driver, and the CGU driver apply desired voltages to the word lines WL4 to WL7, WL8 to WL11, WL12 to WL15, and WL16 to WL31, respectively.

When programming the word lines WL10 to WL13, switching occurs to connect the CGNA driver to the word lines WL16 to WL19 and the CGU driver to the word lines WL0 to WL3. In this way, predetermined connection of the CGN and CGU drivers to the CGI is done in accordance with the word lines WL to be programmed. There are five types of connection combinations corresponding to zones PZ0 to PZ4.

Each of the zones PZ0 to PZ4 is called a zone for the program. As the ZONE signal input from the memory controller 20 to the plane switch circuit 17, a signal simply indicated as "zone", which is combined with the zone at the time of read (to be described later), is input to simplify the switching circuit. At this time, consideration is given to set regions that are as identical as possible as the zones for the program and read and minimize the circuit area of the CG driver system, which is mostly determined by the number of CGN drivers and the number of zones.

When the zone PZ0 is selected, the zone signal is "000" or "001". When the zone PZ1 is selected, the zone signal is "010". When the zone PZ2 is selected, the zone signal is "011". When the zone PZ3 is selected, the zone signal is "100". When the zone PZ4 is selected, the zone signal is "101", "110", or "111".

In this embodiment, the device is designed using a total of 16 CGN drivers so that the voltages of the unselected word lines WL(i+1) to WL(i+6) (see D6 in FIG. 9) or the unselected word lines WL(i−1) to WL(i−6) (see S6 in FIG. 9) with respect to the selected word line WLi (i: 0 to 31) at the time of program can optimally be controlled by the CGN drivers.

<Example of CG Mapping in Read Operation>

CG mapping in the read operation will be described next.

At the time of read of the NAND semiconductor memory device, applying a read voltage to the selected word line WLi, a voltage called VREADK to the word lines WL of the unselected word lines WL(i±1), and a voltage called VREAD to the remaining word lines WL suffices. It is possible to reduce the range of the word lines WL that need to be controlled and the necessary number of CGN drivers as compared to those in the program. For the program operation, 16 to 24 CGN drivers are prepared. Hence, in the read, there exist CGN drivers that can be replaced with the CGU driver for WL voltage application. In this embodiment, replacing the CGN drivers with the CGU driver and the CGN drivers ensured by this are effectively used to select the different word lines WL in the planes in a multi-plane read operation.

As shown in FIG. 10, depending on the selected word line WL, the CG drivers that apply voltages to the word lines WL are appropriately switched.

Zones RZ0 to RZ6 for the read are set, as represented by the abscissa of FIG. 10.

More specifically, when reading from the word lines WLDST and WL0 to WL5, the CGNA driver or CGNC driver applies a desired voltage to the word lines WL0 to WL3. Similarly, the CGNB driver or CGND driver applies a desired voltage to the word lines WL4 to WL7, and the CGU driver applies a desired voltage to the word lines WL8 to WL31. When reading from the word lines WL6 to WL9, switching occurs to connect the CGNA driver or CGNC driver to the word lines WL8 to WL11 and the CGU driver to the word lines WL0 to WL3. Predetermined connection is done in accordance with the word lines WL to be read-accessed. There are seven types of connection combinations corresponding to the zones RZ0 to RZ6. Each of the zones RZ0 to RZ6 is called a zone for the read.

When the zone RZ0 is selected, the zone signal is "000". When the zone RZ1 is selected, the zone signal is "001". When the zone RZ2 is selected, the zone signal is "010". When the zone RZ3 is selected, the zone signal is "011". When the zone RZ4 is selected, the zone signal is "100" or "101". When the zone RZ5 is selected, the zone signal is "110". When the zone RZ6 is selected, the zone signal is "111".

As described above, in this embodiment, at least the voltage of the unselected word line WL(i+1) (see D1 in FIG. 10) or the unselected word line WL(i−1) (see S1 in FIG. 10) with respect to the selected word line WLi (i: 0 to 31) can be switched by the CGN driver. When the CGNA and CGNB drivers and the CGNC and CGND drivers are assigned as drivers to apply voltages to the word lines WL of different planes, two types of word lines WL can freely be designated in the multi-plane read. To select two types of word lines WL in the multi-plane read by, for example, 16 CGN drivers, the 16 CGN drivers are divided into four groups. Two groups out of the four groups are assigned to select one type of word lines WL, and the remaining two groups are assigned to select the other type of word lines WL.

When there are four planes, the same multi-plane read can be performed by dividing the 16 CGN drivers into eight groups. Either operation can be implemented without increasing the number of CGN drivers having a large circuit area.

<Example of CG Mapping in Erase Operation>

CG mapping in the erase operation will be described next.

As shown in FIG. 11, in the erase operation, the CGNA driver applies a voltage to the word lines WL0 to WL3 and WL16 to WL19, and the CGNB driver applies a voltage to the word lines WL4 to WL7 and WL20 to WL23. The CGNC driver applies a voltage to the word lines WL8 to WL11 and WL24 to WL27, and the CGND driver applies a voltage to the word lines WL12 to WL15 and WL28 to WL31. Note that this embodiment is irrelevant to the erase operation, and a detailed description thereof will be omitted.

<CG Connection Table>

Figures 12B, 13:
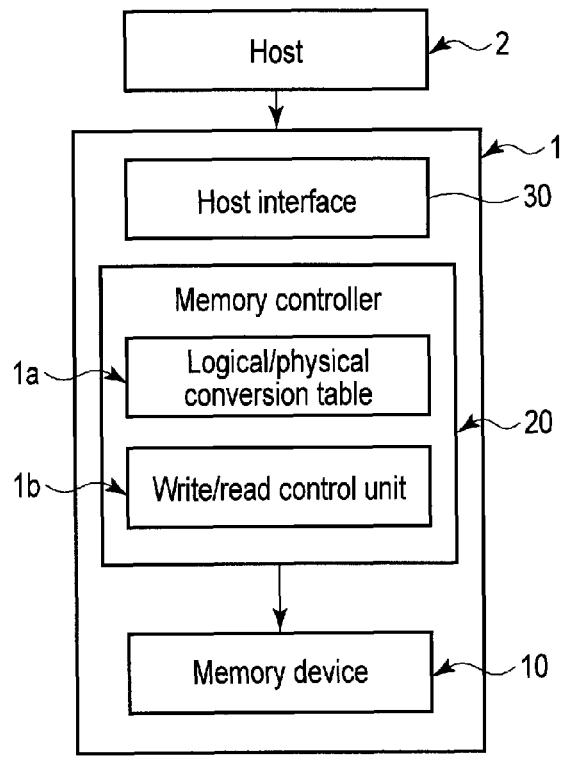
FIG. 12B shows the relationship between switch signals and output signals.
FIG. 13 is a block diagram schematically showing the basic arrangement of a semiconductor memory device according to the second embodiment.

A CG connection table will be described next with reference to FIGS. 12A and 12B. FIG. 12A shows the connection relationship from the CGN/CGU driver to the CGI for the zone signals in the erase operation, program operation, and read operation. FIG. 12B shows the relationship between switch signals and output signals.

As shown in FIG. 12A, the mode signal MODE<1:0> is "00" in the erase and "01" in the program. The mode signal MODE<1:0> is "10" in the read (Read-A) and "11" in the read (Read-B). The read operation itself does not substantially change but the CG drivers to be used change between read (Read-A) and read (Read-B) shown in FIG. 12A.

FIG. 12B shows the connection relationship from the CGD driver to the CGD*I. When the signal CGDDTSW is "0", the output of the signal line CGDDTI is the output of the CGDDT driver. When the signal CGDDTSW is "1", the output of the signal line CGDDTI is the output of the CGDDB driver. When the signal CGDDBSW is "0", the output of the signal line CGDDBI is the output of the CGDDB driver. When the signal CGDDBSW is "1", the output of the signal line CGDDBI is the output of the CGDDT driver. When the signal CGDSTSW is "0", the output of the signal line CGDSTI is the output of the CGDST driver. When the signal CGDSTSW is "1", the output of the signal line CGDSTI is the output of the CGDSB driver. When the signal CGDSBSW is "0", the output of the signal line CGDSBI is the output of the CGDSB driver. When the signal CGDSBSW is "1", the output of the signal line CGDSBI is the output of the CGDST driver.

<Functions and Effects of First Embodiment>

According to the above-described first embodiment, the BiCS flash memory 10 includes a plurality of memory cells capable of rewriting data and the plurality of word lines WL connected to the plurality of memory cells. The BiCS flash memory 10 also includes a page including a plurality of memory cells connected to the same word line WL, a plane including a plurality of pages, and the memory cell array 11 including a plurality of planes. The BiCS flash memory 10 further includes the plurality of word line drivers (CG drivers) 162 that apply voltages to the plurality of word lines WL, and the plurality of plane switches 17 that are respectively provided for the planes and assign the word line driver 162 to each word line WL. When accessing a given page existing in the BiCS flash memory 10, the memory controller 20 designates, in the flash memory, a number (to be referred to as a plane number) to identify a plane to which the page belongs, a number (to be referred to as a block number) to identify a block in the same plane, and a number (to be referred to as a page number) to identify each page in the same block. These numbers will be referred to as "plane number", "block number", and "page number" hereinafter.

In recent NAND flash memories, the types of necessary voltages increase along with the progress of micronization and multi-level technologies. For example, when focus is placed on data program, a plurality of types of voltages should be applied to unselected word lines alone.

For example, the voltage VPGM is applied to the selected word line WLi (for example, i is 0 to 31) at the time of program. A voltage VPASSH is applied to the unselected word line WL(i+1) adjacent to the selected word line WLi on the side of the select gate line SGD at the time of program. Voltages VPASS, VPASSL, VGP, VISO, and the like are applied to the remaining unselected word lines WL at the time of program.

For example, the voltage VCGRV is applied to the selected word line WLi at the time of read. The voltage VREADK is applied to the unselected word line WL(i+1) or WL(i−1) adjacent to the selected word line WLi on the side of the select gate line SGD at the time of read operation. The voltages VREAD and the like are applied to the remaining unselected word lines WL.

It is therefore necessary to control the word lines WL adjacent to the selected word line WL by CGN drivers capable of selectively outputting various voltages. However, the CGN drivers have a large circuit area. For this reason, the word lines WL need to be efficiently controlled by a small number of CGN drivers.

In this embodiment, however, the plane switch 17 can assign the CGN drivers to the word lines WL which are adjacent to the selected word line WL and need detailed voltage adjustment. To the remaining word lines WL for which simple VPASS application suffices, the plane switch 17 can assign the CGU driver that can selectively output fewer types of voltages and has a circuit area smaller than that of the CGN drivers.

As described above, according to this embodiment, the plane switch 17 is provided and controlled by the zone signals and the like, thereby efficiently controlling the word lines WL using a smaller number of CG drivers.

When simultaneous access to pages (P0, B0, x), (P1, B1, x), . . . , (Pn, Bn, x) having the same page number x and block numbers B0, B1, . . . , Bn in different planes P0, P1, . . . , Pn occurs, access requests can be issued to the memory device at once, and parallel access can be performed without controlling switching of the CG drivers by the plane switch 17 and the like.

On the other hand, assume that access requests to pages (P0, B0, x), (P1, B1, y), . . . , (Pn, Bn, z) belonging to different page numbers x, z and existing in the blocks B0, B1, . . . , Bn in the different planes P0, P1, . . . , Pn, occur. In this case, the requests cannot be processed at once without using the BiCS flash memory 10 described in the first embodiment because pages of different page numbers may belong to different word lines.

The BiCS flash memory 10 according to this embodiment can appropriately assign the CG drivers to the word lines WL for each plane by the plane switch 17. It is therefore possible to parallelly access pages having different page numbers and located in a plurality of different planes. That is, in the BiCS flash memory 10 according to this embodiment, the program command and the read command have no constraint to designate pages of the same lower/upper data and the same word line WL because of the constraints of the word line drivers (CG drivers). This can improve the performance of the NAND system.

(Second Embodiment)

The second embodiment will be described next. In the second embodiment, multi-plane access using the semiconductor memory device described in the first embodiment will be explained. Note that in the second embodiment, the same reference numerals as in the above-described first embodiment denote constituent elements having almost the same functions and arrangements, and a repetitive description thereof will be made only when necessary.

<Arrangement of Semiconductor Memory Device according to Second Embodiment>

The basic arrangement of a semiconductor memory device according to the second embodiment will briefly be described with reference to FIG. 13. FIG. 13 is a block diagram schematically showing the basic arrangement of the semiconductor memory device according to the second embodiment.

As shown in FIG. 13, a memory controller 20 includes a logical/physical conversion table 1a and a write/read control unit 1b.

The logical/physical conversion table 1a holds information representing a physical memory cell position (physical address) in a BiCS flash memory 10, where user data having a logical address and supplied from a host 2 via a host interface 30 is stored. When receiving a logical address supplied from the host 2, the memory controller 20 derives a physical address corresponding to the received logical address using the logical/physical conversion table 1a.

The write/read control unit 1b can be implemented by hardware such as a CPU (not shown) or software that operates on a CPU, a RAM, and the like. A detailed operation of the write/read control unit 1b will be described later.

<Access Combination Operation According to Second Embodiment>

An access combination operation according to the second embodiment will be described next with reference to FIGS. 14 and 15. FIG. 14 is a flowchart showing the access combination operation according to the second embodiment. FIG. 15 describes parallel access to pages having different page numbers, where each page is included in a block in a different plane of the BiCS flash memory 10 according to the second embodiment. A kth page in a jth block of an ith plane will be referred to as a page (i, j, k) for the sake of simplicity.

[Step S1001]

The memory controller 20 receives an access request (access command) from the host 2. The access request includes a read request (read command) and a write request (write command).

[Step S1002]

When the start of processing becomes possible after receiving the access request from the host 2, the memory controller 20 starts processing the received access request.

[Step S1003]

The write/read control unit 1b determines whether there exist a plurality of access requests to be processed. For example, the memory controller 20 includes, for example, a command queue area (not shown) and the like. The command queue area stores the command received from the host 2. The write/read control unit 1b can refer to the access request stored in the command queue area and determine whether a plurality of access requests exist.

[Step S1004]

When determining in step S1003 that a plurality of access requests to be processed exist, the write/read control unit 1b determines whether the plurality of access requests can be combined. If the plurality of access requests to be processed aim at pages in different planes of the same BiCS flash memory 10, the write/read control unit 1b determines that the access requests can be combined. Otherwise, the write/read control unit 1b determines that the access requests cannot be combined. More specifically, the write/read control unit 1b refers to the physical address (derived in step S1002) of the access destination of each of the plurality of access requests to be processed. If the physical addresses of the access destinations of the plurality of access requests designate pages on different planes, and all the access requests indicate read requests or write requests, it is determined that the plurality of access requests can be combined. If the above conditions are not met, it is determined that the access requests cannot be combined. Combining access requests means performing a read operation or program operation at once for a plurality of data requested to be accessed by one command sequence issuance to the BiCS flash memory.

[Step S1005]

When determining in step S1004 that the plurality of access requests can be combined, the write/read control unit 1b combines the plurality of access requests.

[Step S1006]

When determining in step S1003 that a plurality of access requests to be processed do not exist (that is, when determining that there is one access request to be processed), the write/read control unit 1b accesses the BiCS flash memory 10 based on the access request to be processed.

When determining in step S1004 that the plurality of access requests cannot be combined, the write/read control unit 1b sequentially accesses the BiCS flash memory 10 based on each access request.

When combining the plurality of access requests, the write/read control unit 1b performs access (to be referred to as parallel access or multi-plane access) to the BiCS flash memory 10 based on the combined access request.

Access to the BiCS flash memory 10 based on the combined access request will be described with reference to FIG. 15.

As described above, when the plurality of access requests to be processed aim at pages in different planes of the same BiCS flash memory 10, the write/read control unit 1b combines the plurality of access requests and accesses the BiCS flash memory 10 based on the combined access request. FIG. 15 shows access to the BiCS flash memory 10 based on the combined access request.

FIG. 15 illustrates access based on an combined access request generated by combining an access request to user data A existing on a page (0, 1, 1), an access request to user data B existing on a page (1, 2, 0), and an access request to user data C existing on a page (n, 1, 2).

As shown in FIG. 15, in the semiconductor memory device according to the second embodiment, it is possible to parallelly access the user data A, B, and C stored on the pages (0, 0, 1), (1, 2, 0), . . . , (n, 1, 2) having different page numbers. Note that the parallel access means simultaneously performing the read operation or program operation for memory cells where the user data A, B, and C requested to be accessed are stored.

<Functions and Effects of Second Embodiment>

According to the above-described second embodiment, using the BiCS flash memory described in the first embodiment, which can parallelly access pages having different page numbers located in a plurality of different planes, access requests to data stored on pages having different page numbers in different planes are combined, and parallel access is performed.

As described above, when a plurality of access requests are combined, data access need not be performed sequentially, and the throughput of data access to the BiCS flash memory can improve.

(Third Embodiment)

The third embodiment will be described next. In the third embodiment, another example of multi-plane access will be described. Note that in the third embodiment, the same reference numerals as in the above-described second embodiment denote constituent elements having almost the same functions and arrangements, and a repetitive description thereof will be made only when necessary.

<Access Combination Operation According to Third Embodiment>

An access combination operation according to the third embodiment will be described next with reference to FIGS. 16 and 17. FIG. 16 is a flowchart showing the access combination operation according to the third embodiment. FIG. 17 describes parallel access to pages having different page numbers, where each page is included in a block in a different plane of a BiCS flash memory 10 according to the third embodiment. In general, when receiving a request from a host 2 and accessing user data, a memory controller 20 may use, as secondary information, some data that corresponds to the user data but is not the user data itself. Such data internally used by the memory controller 20 for user data management will be referred to as metadata hereinafter.

In the third embodiment, the memory controller 20 stores metadata corresponding to user data in a different plane of the same flash memory device. At this time, the pages on which the user data and the metadata corresponding to it are stored may have different page numbers and different block numbers. In the third embodiment, user data are stored in planes 0 to n−1, and metadata are stored in the plane n. However, the storage positions are not limited to these.

When deciding the storage position (physical address) of metadata corresponding to certain user data, it may be possible to easily calculate the storage position of the metadata from an attribute such as the storage position (physical address) of the corresponding user data. This arrangement makes it possible to attain an advantage that the position of metadata corresponding to user data can easily be obtained.

[Step S2001]

The memory controller 20 receives a read request from the host 2 (see step S1001 of FIG. 14).

[Step S2002]

After receiving the read request from the host 2, the memory controller 20 starts processing the received read request (see step S1002 of FIG. 14).

[Step S2003]

After starting processing the access request from the host 2, the memory controller 20 acquires a position where metadata corresponding to user data requested to be accessed is stored.

[Step S2004]

A write/read control unit 1b issues, to the BiCS flash memory 10, a command sequence to parallelly access the user data requested from the host 2 to be accessed and the metadata corresponding to the user data (see step S1006 of FIG. 14).

The memory controller 20 can thus parallelly access the user data requested from the host 2 to be accessed and the metadata corresponding to the user data.

As shown in FIG. 17, the memory controller 20 associates user data A stored on a page (0, 0, 1) with metadata A stored on a page (n, 1, 2). Similarly, the write/read control unit 1b associates user data B stored on a page (1, 2, 0) with metadata B stored on a page (n, 1, 1).

As shown in FIG. 17, the write/read control unit 1b can parallelly access the sets of user data and metadata. This is because the memory controller 20 stores the user data A and B and corresponding to metadata A and B in different planes of the same BiCS flash memory 10.

<Functions and Effects of Third Embodiment>

According to the above-described third embodiment, user data and metadata associated with the user data are stored in different planes on the same BiCS flash memory 10. When accessing the user data and the metadata associated with the user data, the memory controller 20 issues, to the BiCS flash memory 10, a command sequence to parallelly access the two data. This makes it possible to parallelly access the user data and the metadata associated with the user data.

When parallel access to user data and metadata associated with the user data is performed, data access need not be performed sequentially, and the throughput can be improved.

(Fourth Embodiment)

The fourth embodiment will be described next. In the fourth embodiment, the program operation and the read operation of the semiconductor memory devices described in the first, second, and third embodiments will be described. Note that in the fourth embodiment, the same reference numerals as in the above-described embodiments denote constituent elements having almost the same functions and arrangements, and a repetitive description thereof will be made only when necessary.

<Example of Data Program Method>

Cases where the threshold voltage of a memory cell transistor MT is raised by injecting charges into a charge storage layer will be referred to as "x0" program, "00" program, "10" program, "0" program, and the like. On the other hand, cases where no charges are injected into the charge storage layer, and the threshold voltage is not changed (in other words, cases where charges are injected so as not to cause a transition of stored data to another level) will be referred to as "x1" program, "11" program, "1" program, and the like.

An example of a data program method in a memory according to this embodiment will be described with reference to FIG. 18. A 4-level or 2-level NAND flash memory will be exemplified below for the descriptive convenience. This also applies to any other multi-bit NAND flash memory.

Figure 18:
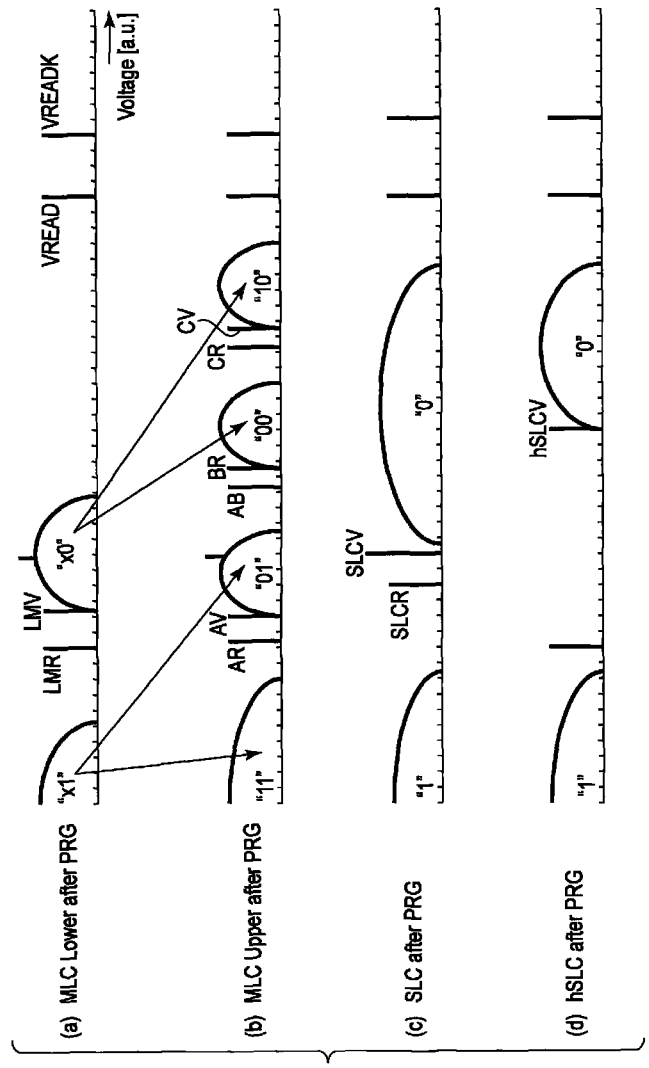
FIG. 18 is a graph showing the threshold distribution of a memory cell transistor MT.

FIG. 18 is a graph showing the threshold distribution of the memory cell transistor MT. When the memory cell transistor MT can store 4-level data (2-bit data), it can store four types of data "11", "01", "00", and "10" in ascending order of threshold voltage Vth.

<Example of MLC Program Method>

In FIG. 18, (a) is a graph showing the threshold distribution of the memory cell transistor MT and a change in the threshold distribution after programming a Lower page at the time of MLC (Multi Level Cell) program. In FIG. 18, (b) is a graph showing the threshold distribution of the memory cell transistor MT and a change in the threshold distribution after programming an Upper page at the time of MLC program.

As shown in (a) and (b) of FIG. 18, data are written in one page at once. In addition, 2-bit data is written on a bit-by-bit basis. At this time, as shown in FIG. 18, lower bit data out of two bits is written first, and upper bit data is written next. When programming "0" in the lower bit, the program is coarsely performed. When programming the upper bit, "00" is programmed such that the threshold becomes higher than BV, and "10" is programmed such that the threshold becomes higher than CV.

<Example of SLC Program Method>

In FIG. 18, (c) is a graph showing the threshold distribution of the memory cell transistor MT and a change in the threshold distribution after SLC (Single Level Cell) program.

As shown in (c) of FIG. 18, the program is coarsely performed as compared to the MLC program. When programming "0", the program is performed such that the threshold becomes higher than SLCV.

The SLC data is used in, for example, metadata.

<Example of hSLC Program Method>

In FIG. 18, (d) is a graph showing the threshold distribution of the memory cell transistor MT and a change in the threshold distribution after hSLC (higher Single Level Cell) program.

As shown in (d) of FIG. 18, when programming "0", the program is performed with a threshold higher than that for "0" of SLC program. More specifically, when programming "0", the program is performed such that the threshold becomes higher than hSLCV. At the time of hSLC program, the program is performed using parameters dedicated to hSLC as shown in FIG. 19. A parameter F_VPGMHSLC defines a voltage VPGM for the first time in the hSLC program. A parameter F_DVPGMHSLC defines the increase amount of VPGM in the hSLC program. A parameter F_VCG_HSLCV defines the verify level in the hSLC program. A parameter F_NLP_HSLC defines the maximum loop count in the hSLC program. Note that these parameters are stored in part of a memory cell array 11 and transferred to a register in a control circuit 15 when power-on.

The hSLC data is used in, for example, metadata. "0" of the hSLC data is written by a voltage equal to or higher than BV of MLC for instance.

<Read Sequence>

Operation options according to the fourth embodiment will be described next with reference to FIG. 20. FIG. 20 is a view showing the read sequence in operation options according to the fourth embodiment. A description will be made here by extracting two planes 0 and 1 for the sake of simplicity.

<Operation Option A>

An operation option A will be described first. For hSLC data, the threshold voltage of the memory cell is set to BV or more in the MLC by a dedicated command. For this reason, in the operation option A, read of hSLC data is performed at the same time as read of SLC data and MLC Lower/Upper data. The operation option A can prevent an increase in the read time.

When reading SLC data of plane 0 and hSLC data of plane 1, SLCR is applied to the selected word line WL, thereby reading both data.

When reading MLC-Lower (not yet undergone Upper program) data of plane 0 and hSLC data of plane 1, BR is applied to the selected word line WL, thereby reading the hSLC data. After that, LMR is applied to the selected word line WL, thereby reading the MLC-Lower data.

When reading MLC-Upper (not yet undergone Upper program) data of plane 0 and hSLC data of plane 1, AR is applied to the selected word line WL, thereby reading the hSLC data. After that, CR is applied to the selected word line WL, thereby reading the MLC-Upper data.

When reading MLC-Lower (undergone Upper program) data of plane 0 and hSLC data of plane 1, BR is applied to the selected word line WL, thereby reading both data.

When reading MLC-Upper (undergone Upper program) data of plane 0 and hSLC data of plane 1, AR is applied to the selected word line WL, thereby reading the hSLC data. After that, CR is applied to the selected word line WL, thereby reading the MLC-Upper data.

In the operation option A, data (user data) of plane 0 and data (metadata) of plane 1 can be read without increasing a read time tR.

Note that when this option is selected, F_HSLC_MODE is set to "1".

<Operation Option B>

An operation option B will be described next. For hSLC data, the threshold voltage of the memory cell is set within the range of LMV (inclusive) to SLC (inclusive) in the MLC by an SLC command. For this reason, in the operation option B, read of hSLC data is performed at the same time as read of SLC data and MLC Lower/Upper data. In the operation option B, since the write level of SLC and that of hSLC are almost the same, the W/E count of hSLC data almost equals that of SLC data. When the program level of hSLC data is the same as that of SLC, the SLC program command may be used to program hSLC data. To adjust the write level, the dedicated command of hSLC data is used.

When reading SLC data of plane 0 and hSLC data of plane 1, SLCR is applied to the selected word line WL, thereby reading both data.

When reading MLC-Lower (not yet undergone Upper program) data of plane 0 and hSLC data of plane 1, LMR is applied to the selected word line WL, thereby reading the hSLC and MLC-Lower data.

When reading MLC-Upper (not yet undergone Upper program) data of plane 0 and hSLC data of plane 1, AR is applied to the selected word line WL, thereby reading the hSLC data. After that, CR is applied to the selected word line WL, thereby reading the MLC-Upper data.

When reading MLC-Lower (undergone Upper program) data of plane 0 and hSLC data of plane 1, LMR is applied to the selected word line WL, thereby reading the MLC-Lower data. After that, BR is applied to the selected word line WL, thereby reading the hSLC data.

When reading MLC-Upper (undergone Upper program) data of plane 0 and hSLC data of plane 1, AR is applied to the selected word line WL, thereby reading the hSLC data. After that, CR is applied to the selected word line WL, thereby reading the MLC-Upper data.

In the operation option B, writing hSLC data by SLCV or more suffices, and the same tPROG/reliability (W/E count) as the SLC can be attained. In the operation option B, since the SLC program command can be used for hSLC program, multi-plane program with SLC data can be performed (the word lines WL at the time of program need to be the same in all planes). In the operation option B, when the hSLC program command is used for hSLC program, a Vth distribution (threshold distribution) different from that of SLC can be obtained. Note that when this option is selected, F_HSLC_MODE is set to "0".

<Operation Waveform>

Operation waveforms in the read operation according to this embodiment will be described next with reference to FIGS. 21A, 21B, 21C, 22A, 22B, 22C, 23A, 23B, and 23C.

Figure 21A:
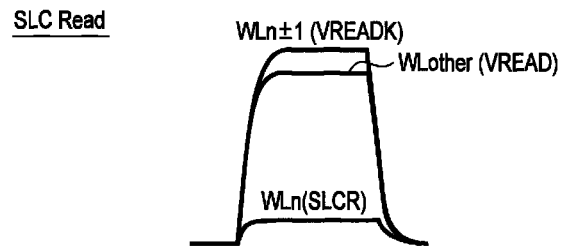
FIG. 21A shows a read operation waveform in case of read of SLC data.
Figure 21B:
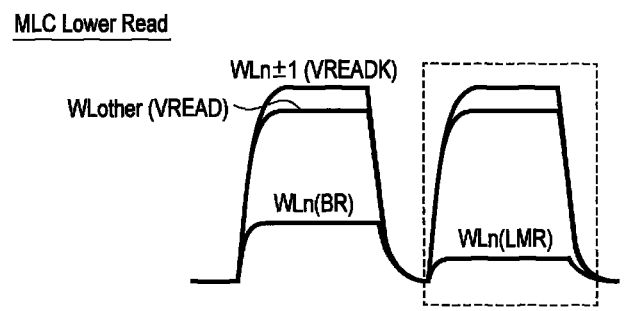
FIG. 21B shows a read operation waveform in case of read of MLC-Lower data.
Figure 21C:
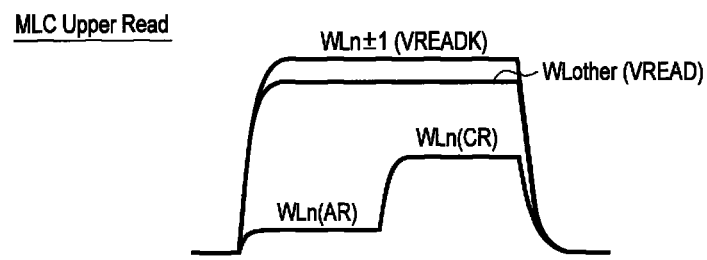
FIG. 21C shows a read operation waveform in case of read of MLC-Upper data.

FIG. 21A shows a read operation waveform in case of read of SLC data. FIG. 21B shows a read operation waveform in case of read of MLC-Lower data. FIG. 21C shows a read operation waveform in case of read of MLC-Upper data.

FIG. 22A shows a read operation waveform in case of read of SLC data and hSLC data in the operation option A according to this embodiment. FIG. 22B shows a read operation waveform in case of read of MLC-Lower data and hSLC data. FIG. 22C shows a read operation waveform in case of read of MLC-Upper data and hSLC data.

FIG. 23A shows a read operation waveform in case of read of SLC data and hSLC data in the operation option B according to this embodiment. FIG. 23B shows a read operation waveform in case of read of MLC-Lower data and hSLC data. FIG. 23C shows a read operation waveform in case of read of MLC-Upper data and hSLC data.

As shown in FIG. 21A, when reading SLC data, the voltage SLCR is applied to a selected word line WLn, a voltage VREADK (VREADK>SLCR) is applied to unselected word lines WL(n+1) and WL(n−1), and a voltage VREAD (VREAD>VREADK>SLCR) is applied to the remaining unselected word lines WL (to the referred to as WLother or the like).

As shown in FIG. 21B, when reading MLC-Lower data, the voltage BR is applied to the selected word line WLn, the voltage VREADK (VREADK>BR) is applied to the unselected word lines WL(n+1) and WL(n−1), and the voltage VREAD (VREADK>VREAD>BR) is applied to the remaining unselected word lines WLother. When upper program has not been executed (see the broken line portion), the voltage LMR (BR>LMR) is applied to the selected word line WLn, the voltage VREADK (VREADK>BR>LMR) is applied to the unselected word lines WL(n+1) and WL(n−1), and the voltage VREAD (VREADK>VREAD>BR>LMR) is applied to the remaining unselected word lines WLother, thereby performing re-read.

As shown in FIG. 21C, when reading MLC-Upper data, the voltage AR is applied to the selected word line WLn. After that, the voltage CR (CR>AR) is applied to the selected word line WLn, the voltage VREADK (VREADK>CR>AR) is applied to the unselected word lines WL(n+1) and WL(n−1), and the voltage VREAD (VREADK>VREAD>CR>AR) is applied to the remaining unselected word lines WLother.

As shown in FIGS. 21A and 22A, the operation waveform in case of read of SLC data and hSLC data in the operation option A is the same as in the case of read of SLC data.

As shown in FIGS. 21B and 22B, the operation waveform in case of read of MLC-Lower data and hSLC data in the operation option A is the same as in the case of read of MLC-Lower data.

As shown in FIGS. 21C and 22C, the operation waveform in case of read of MLC-Upper data and hSLC data in the operation option A is the same as in the case of read of MLC-Upper data.

As shown in FIGS. 21A and 23A, the operation waveform in case of read of SLC data and hSLC data in the operation option B is the same as in the case of read of SLC data.

As shown in FIG. 23B, when reading MLC-Lower data and SLC data, the voltage LMR is applied to the selected word line WLn. After that, the voltage BR (BR>LMR) is applied to the selected word line WLn, the voltage VREADK (VREADK>BR>LMR) is applied to the unselected word lines WL(n+1) and WL(n−1), and the voltage VREAD (VREADK>VREAD>BR>LMR) is applied to the remaining unselected word lines WLother. In this operation, the voltage LMR is needed to read the SLC data, and the frequency of read operation is higher after Upper program execution than before Upper program execution. The frequency of performing the read twice by applying the voltages LMR and BR is high. Hence, the operation can be speeded up by reducing the discharge of the unselected word lines WL and the reset time of a sense amplifier (not shown) by continuously applying the voltages LMR and BR in order. Note that the method as shown in in FIG. 22B may be used without continuously applying the voltages.

As shown in FIGS. 21C and 23C, the operation waveform in case of read of MLC-Upper data and hSLC data in the operation option B is the same as in the case of read of MLC-Upper data.

<Example of Program Sequence>

A program sequence according to the fourth embodiment will be described next with reference to FIGS. 24 and 25.

FIG. 24 is a table showing symbols used in a command sequence and the meanings of the symbols for easy understanding of the command sequence.

FIG. 25 is a view showing the command sequence when programming hSLC data and its internal operation waveform. An example in which hSLC data is programmed in plane 0, block BLKx, and the selected word line WLn will be described here. Note that R/B in FIG. 25 indicates ready/busy of a signal line between a memory controller 20 and a BiCS flash memory 10.

As shown in FIG. 25, when programming hSLC data, the memory controller 20 issues an xxh command and an 80h command to the BiCS flash memory 10. The memory controller 20 then issues predetermined command, address, write data, and the like to the BiCS flash memory 10.

As shown in FIG. 25, when the hSLC data program command is input from the memory controller 20, the BiCS flash memory 10 performs the program operation for the memory cell array 11.

As shown in FIG. 25, at the time of first program (LOOP#=1), the voltage VPGM is applied to the selected word line WL, and various voltages Vxxxx (VPGM>Vxxxx) as described above are applied to the remaining unselected word lines WLother. Note that the voltage VPGM can be set by the parameter F_VPGMHSLC.

To determine whether the program has normally been done, a first verify operation is performed. In the verify operation, the voltage HSLCV is applied to the selected word line WLn, the voltage VREADK (VREADK>HSLCV) is applied to the unselected word lines WL(n+1) and WL(n−1), and the voltage VREAD (VREADK>VREAD>HSLCV) is applied to the remaining unselected word lines WLother. Note that the voltage HSLCV can be set by the parameter F_VCG_HSLCV.

If the program is not completed by the first program operation, the second program operation is performed.

At the time of second program (LOOP#=2), the voltage VPGM higher than the voltage VPGM in the first program operation is applied to the selected word line WL, and various voltages Vxxxx (VPGM>Vxxxx) as described above are applied to the remaining unselected word lines WLother. Note that the increase width from the voltage VPGM of the previous program operation to the voltage VPGM of the current program operation can be set by the parameter F_DVPGHSLC.

Like the first verify operation, a second verify operation is performed to determine whether the program has normally been done.

As shown in FIG. 25, if the verify is not OK even when the program operation has been performed up to the maximum count (LOOP#=MAX), fail is set in the status register (not shown) of the BiCS flash memory 10, and the program operation is completed. Note that the loop count can be set by the parameter F_NLP_HSLC.

<Example of Read Sequence>

A read sequence according to the fourth embodiment will be described next with reference to FIG. 26.

FIG. 26 is a view showing the command sequence when reading hSLC data and the operation waveform at the time of program. An example will be described here in which hSLC data stored in plane 0, block BLKx, and the selected word line WLn and MLC-Upper data stored in plane 1, block BLKy, and a selected word line WLm are read at the same time. The read operation performed simultaneously for different planes will be referred to as multi-plane read or the like. The multi-plane read is synonymous with the above-described parallel access. Note that R/B in FIG. 26 indicates ready/busy of a signal line between the memory controller 20 and the BiCS flash memory 10.

As shown in FIG. 26, when reading hSLC data, the memory controller 20 issues an xxh command and a 00h command to the BiCS flash memory 10. The memory controller 20 then issues predetermined command, address, and the like to the BiCS flash memory 10. Additionally, the memory controller 20 issues a 00h command to the BiCS flash memory 10 to read the MLC-Upper data. The memory controller 20 then issues predetermined command, address, and the like to the BiCS flash memory 10.

As shown in FIG. 26, when the commands are input from the memory controller 20, the BiCS flash memory 10 performs the read operation from the memory cell array 11.

In plane 0, block BLKx, and page hSLC, the voltage AR is applied to the selected word line WLn. After that, the voltage CR (CR>AR) is applied to the selected word line WLn, the voltage VREADK (VREADK>CR>AR) is applied to the unselected word lines WL(n+1) and WL(n−1), and the voltage VREAD (VREADK>VREAD>CR>AR) is applied to the remaining unselected word lines WLother. Note that the hSLC data is read by applying the voltage AR to the selected word line WL.

In plane 1, block BLKy, and page MLC-Upper, the voltage AR is applied to the selected word line WLm. After that, the voltage CR (CR>AR) is applied to the selected word line WLm, the voltage VREADK (VREADK>CR>AR) is applied to unselected word lines WL(m+1) and WL(m−1), and the voltage VREAD (VREADK>VREAD>CR>AR) is applied to the remaining unselected word lines WLother.

Note that planes 0 and 1 can simultaneously be accessed using the BiCS flash memory 10 described in the first embodiment.

In this way, the hSLC data and the MLC-Upper data are continuously read.

<Detailed Example of Data Out Sequence>

Figure 27:
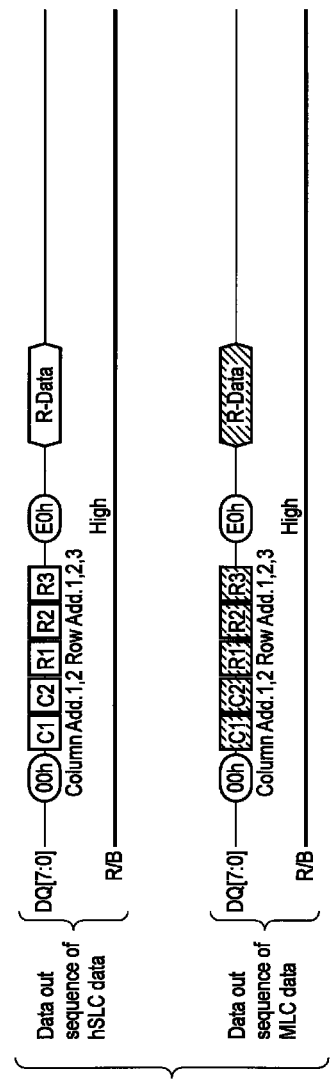
FIG. 27 shows a detailed example of a data out sequence.

A detailed example of the read sequence and a data out sequence will briefly be described next with reference to FIGS. 27 and 28. FIG. 27 shows a detailed example of the data out sequence. FIG. 28 shows an example of addresses used in multi-plane access. Note that R/B in FIG. 27 indicates ready/busy of a signal line between the memory controller 20 and the BiCS flash memory 10.

As shown in FIG. 27, when performing data out of hSLC data stored by plane 0, the memory controller 20 issues a 00h command to the BiCS flash memory 10. The memory controller 20 then issues addresses C1, C2, R1, R2, and R3 and a command E0h to the BiCS flash memory 10. The hSLC data (R-Data) is thus output from the BiCS flash memory 10.

As shown in FIG. 27, when performing data out of MLC data stored by plane 1, the memory controller 20 issues a 00h command to the BiCS flash memory 10. The memory controller 20 then issues the addresses C1, C2, R1, R2, and R3 and the command E0h to the BiCS flash memory 10. The MLC data (R-Data) is thus output from the BiCS flash memory 10.

As shown in FIG. 28, in this embodiment, physical positions on the flash memory are expressed as addresses of 8 bits×5 cycles for instance.

For example, in this embodiment, the bits of R1-1 to R1-5 are used to indicate the numbers of the word lines WL, and the bits of R2-3 and R2-4 are used to indicate the plane numbers.

In this embodiment, when performing multi-plane access to hSLC data and MLC data, the number of the word line WL and the plane number of the hSLC data may be different from those of the MLC data.

<Functions and Effects of Fourth Embodiment>

According to the above-described fourth embodiment, MLC data or SLC data is used as user data, and hSLC data or SLC data is used as metadata. It is possible to perform normal read (SLC or MLC-Lower/Upper data) for a given plane and simultaneously read hSLC data (metadata) from another plane.

For example, when reading SLC or MLC-Lower/Upper data, the read operation of hSLC data stored in a plane different from the plane to be read-accessed can be performed at the same time as the read operation of the SLC or MLC-Lower/Upper data.

When accessing MLC-Lower/Upper data, SLC data, or hSLC data, different word lines WL in each plane can be selected in the multi-plane operation.

As described above, when a plurality of planes are simultaneously accessed in parallel, data access need not be performed sequentially, and the throughput can thus be improved. Hence, the performance of the NAND system can be improved.

(Fifth Embodiment)

The fifth embodiment will be described next. In the fifth embodiment, a read operation near a dummy word line will be described. Note that in the fifth embodiment, the same reference numerals as in the above-described embodiments denote constituent elements having almost the same functions and arrangements, and a repetitive description thereof will be made only when necessary.

A read operation when a selected word line WL is located near a dummy word line WLD will be described with reference to FIGS. 29A and 29B. FIG. 29A is a view showing a zone signal ZONE<3:0>, a mode signal MODE<1:0>, and signals CGDDTSW, CGDDBSW, CGDSTSW, and CGDSBSW when the selected word line WL is located near the dummy word line WLD in the read operation. FIG. 29B is a view showing the types of CG drivers used for the word lines WL and voltages applied to the word lines WL. Note that focus is placed here on planes 0 and 1, and a case where hSLC data is read from plane 1 will be explained for the sake of simplicity.

As shown in FIGS. 29A and 29B, in plane 0, when the selected word line WL is, for example, a word line WL31 adjacent to a dummy word line WLDDT, the zone signal ZONE<3:0> is "111", the mode signal MODE<1:0> is "10", the signal CGDDTSW is "0", the signal CGDDBSW is "0", the signal CGDSTSW is "1", and the signal CGDSBSW is "0".

A voltage VCGRV is applied to the selected word line WL31 by a CGNB<3> driver, and a voltage VREADK (VREADK>VCGRV) is applied to an unselected word line WL30 by a CGNB<2> driver. The voltage VREADK (VREADK>VCGRV) is applied to the dummy word line WLDDT by a CGDDT driver.

As shown in FIGS. 29A and 29B, in plane 1, when the selected word line WL is, for example, a word line WL15 adjacent to a dummy word line WLDSB, the zone signal ZONE<3:0> is "011", the mode signal MODE<1:0> is "11", the signal CGDDTSW is "1", the signal CGDDBSW is "0", the signal CGDSTSW is "1", and the signal CGDSBSW is "1".

The voltage VCGRV is applied to the selected word line WL15 by the CGNB<3> driver, and the voltage VREADK (VREADK>VCGRV) is applied to an unselected word line WL14 by the CGND<2> driver. The voltage VREADK (VREADK>VCGRV) is applied to the dummy word line WLDSB by a CGDST driver.

(Sixth Embodiment)

The sixth embodiment will be described next. In the sixth embodiment, CG drivers and a power supply different from those described in the first embodiment will be described. Note that in the sixth embodiment, the same reference numerals as in the above-described embodiments denote constituent elements having almost the same functions and arrangements, and a repetitive description thereof will be made only when necessary.

Figure 30:
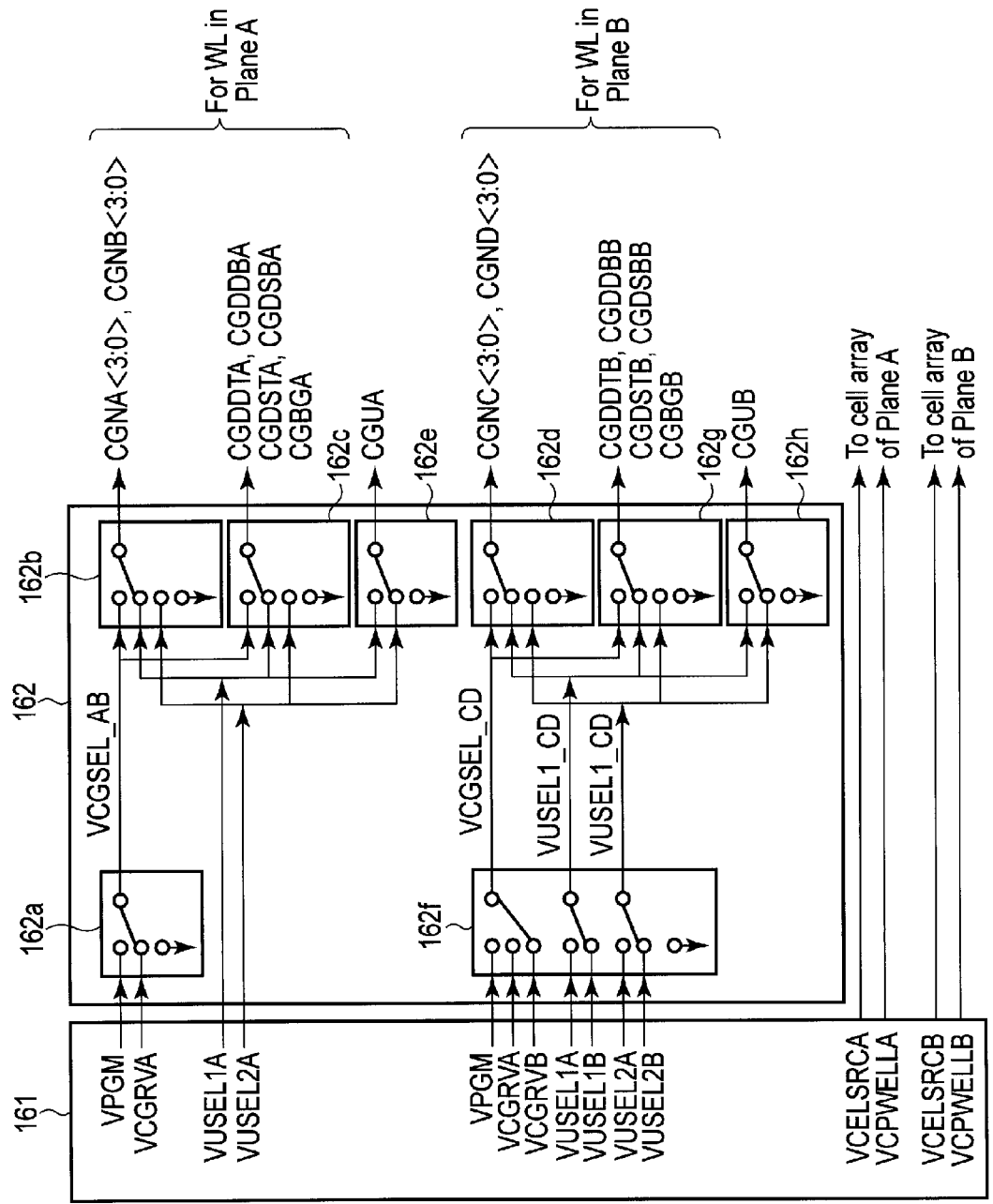
FIG. 30 is a block diagram schematically showing CG drivers according to the sixth embodiment.

As shown in FIG. 30, in a power supply 161 and a CG driver 162 according to the sixth embodiment, the power supply is divided for planes A and B. As shown in FIG. 30, the CG driver 162 according to the sixth embodiment includes a VCGSEL circuit 162a, CGN drivers 162b and 162d (16 in total), CGD drivers 162c (four in total), a CGBG driver 162c, a CGU driver 162e, a VCGSEL2 circuit 162f, CGD drivers 162g (four in total), a CGBG driver 162g, and a CGU driver 162h.

The VCGSEL circuit 162a outputs a voltage VPGM or VCGRVA as a voltage VCGSEL_AB in accordance with a control signal from a control circuit 15.

The CGN driver 162b, the CGD driver 162c, and the CGBG driver 162c output one of the voltages VCGSEL_AB, VUSEL1A, VUSEL2A, and VSS to the plane A in accordance with a control signal from the control circuit 15.

The CGU driver 162e outputs one of the voltages VUSEL1A, VUSEL2A, and VSS to the plane A in accordance with a control signal from the control circuit 15.

The VCGSEL2 circuit 162f outputs the voltages VPGM, VCGRVA, and VCGRVB as a voltage VCGSEL_CD in accordance with a control signal from the control circuit 15. The VCGSEL2 circuit 162f also outputs the voltages VUSEL1A and VUSEL1B as a voltage VUSEL1_CD in accordance with a control signal from the control circuit 15. The VCGSEL2 circuit 162f also outputs voltages VUSEL2A and VUSEL2B as a voltage VUSEL2_CD in accordance with a control signal from the control circuit 15.

The CGN driver 162d, the CGD driver 162g, and the CGBG driver 162g output one of the voltages VCGSEL_CD, VUSEL1_CD, VUSEL2_CD, and VSS to the plane B in accordance with a control signal from the control circuit 15.

The CGU driver 162h outputs one of the voltages VUSEL1_CD, VUSEL2_CD, and VSS to the plane B in accordance with a control signal from the control circuit 15. Voltages VCELSRCA and VCPWELLA are connected to a memory cell array 11 of the plane A. Voltages VCELSRCB and VCPWELLB are connected to the memory cell array 11 of the plane B. Note that the planes A and B can be arbitrary planes.

<Functions and Effects of Sixth Embodiment>

According to the above-described sixth embodiment, the power supply 161 according to the sixth embodiment includes two voltage systems for two planes, as compared to the power supply 161 according to the first embodiment. In addition, a CGN driver arrangement capable of simultaneously applying voltages to the two planes is formed. It is therefore possible to simultaneously read, for example, MLC data and hSLC data or SLC data and hSLC data as described above.

(Seventh Embodiment)

The seventh embodiment will be described next. In the seventh embodiment, a memory cell array different from the memory cell array 11 described in the first embodiment will be explained. Note that in the seventh embodiment, the same reference numerals as in the above-described embodiments denote constituent elements having almost the same functions and arrangements, and a repetitive description thereof will be made only when necessary.

<Arrangement of String Unit STU>

In a BiCS flash memory, a columnar semiconductor structure that forms a channel is formed in an opening having a high aspect ratio. Along with the progress of BiCS flash memory micronization, the pitch (distance) between the openings is required to be shorter, and an arrangement that arranges the openings in a staggered pattern has been examined.

FIGS. 31, 32, 33, and 34 show the arrangement according to the seventh embodiment. In the seventh embodiment, the arrangement of a string unit is different from the first to fifth embodiments.

Figure 31:
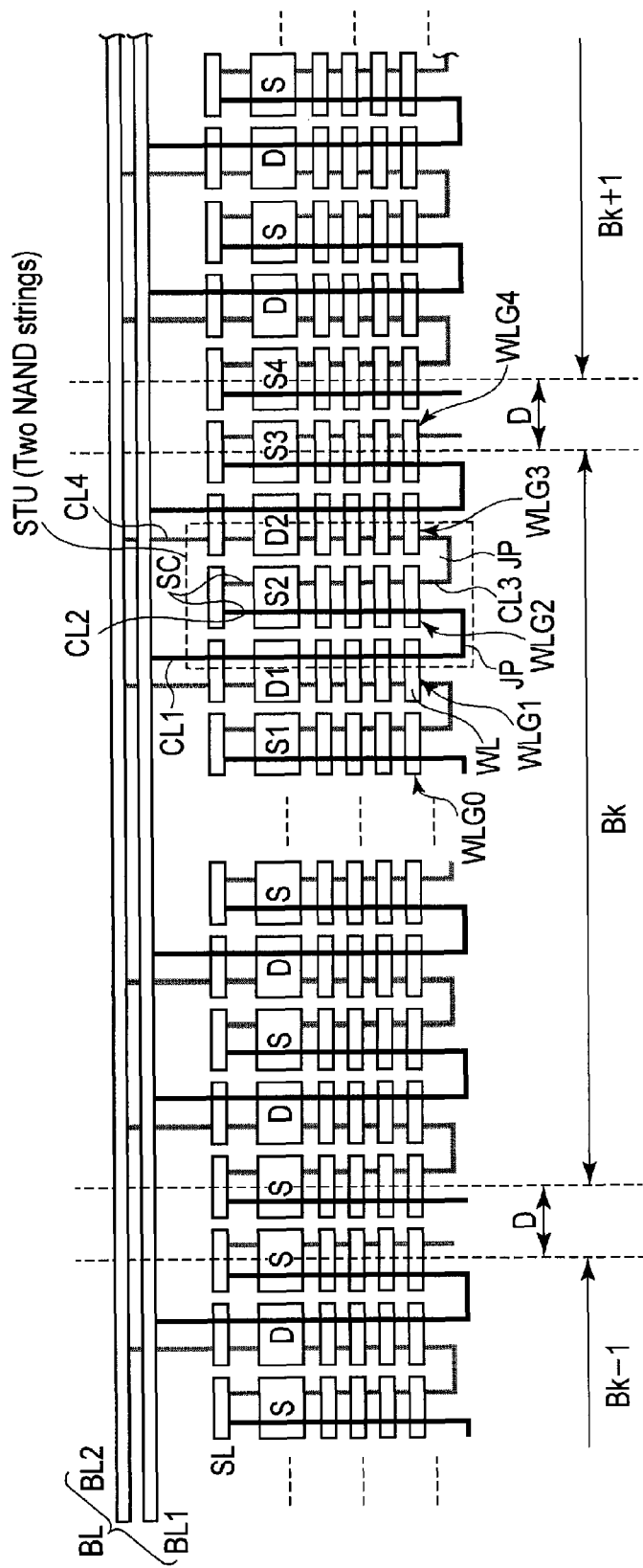
FIG. 31 shows a plurality of blocks of a memory cell array.

FIG. 31 shows a plurality of blocks Bk−1, Bk, and Bk+1 of the memory cell array. The plurality of blocks Bk−1, Bk, and Bk+1 are arranged along a plurality of bit lines BL. Each of the plurality of blocks Bk−1, Bk, and Bk+1 includes a plurality of string units STU arranged in the bit line direction. Each string unit STU is formed from, for example, three select gate lines and there word line groups.

Dummy strings D are arranged between the blocks. Since the plurality of blocks Bk−1, Bk, and Bk+1 have the same arrangement, the arrangement of the string unit STU will be explained using the block Bk.

Figure 32:
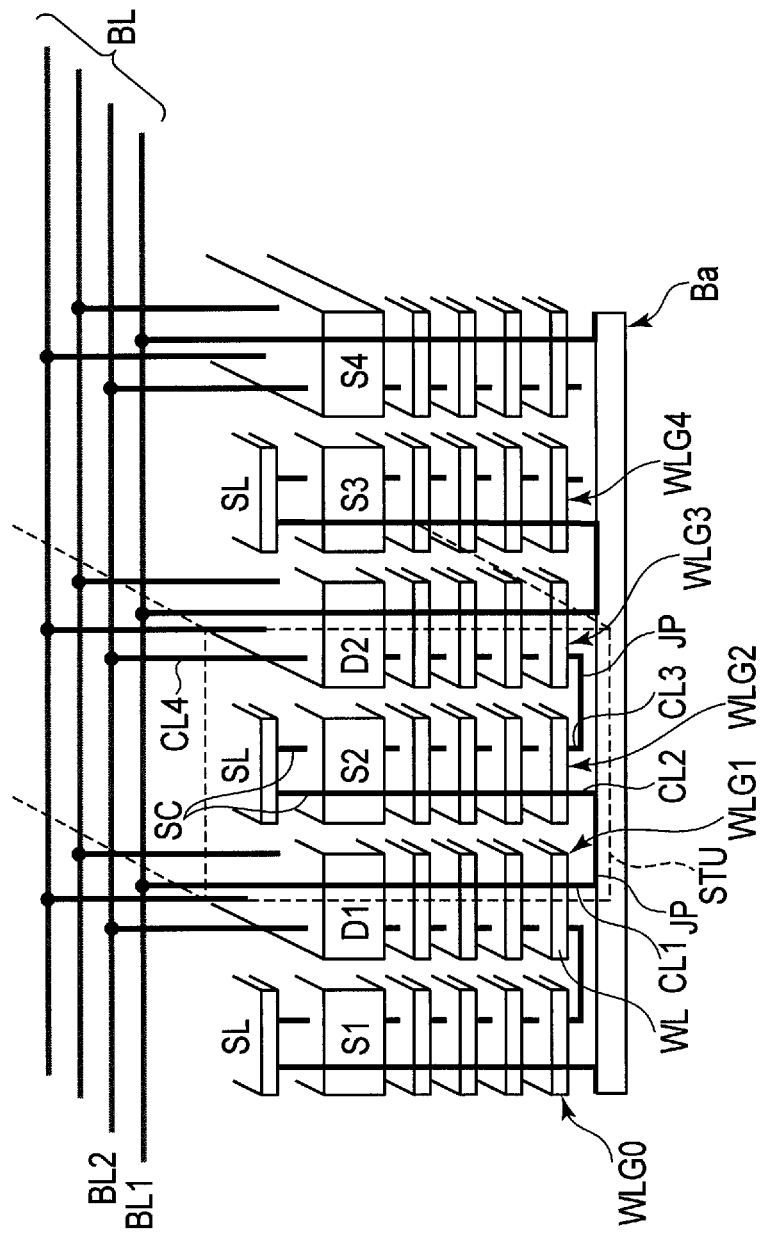
FIG. 32 shows a plurality of blocks of a memory cell array.

As shown in FIGS. 31 and 32, in this embodiment, the string unit STU is formed by arranging two NAND strings in the word line direction. The two NAND strings are formed by sharing first and third select gate lines D1 and D2 each serving as a drain-side select gate line SGD, a second select gate line S2 serving as a source-side select gate line SGS located between the first and third select gate lines D1 and D2, word line groups WLG1 and WLG3 formed from a plurality of word lines WL arranged in correspondence with the first and third select gate lines D1 and D2, and a word line group WLG2 formed from a plurality of word lines WL arranged in correspondence with the second select gate line S2.

That is, the first and third select gate lines D1 and D2, the second select gate line S2, the word line groups WLG1 and WLG3 arranged in correspondence with the first and third select gate lines D1 and D2, and the word line group WLG2 arranged in correspondence with the second select gate line S2 are shared by two U-shaped semiconductor structures SC. The two U-shaped semiconductor structures SC are formed from first to fourth semiconductor structures CL1 to CL4 and a connecting portion JP.

The arrangement of the string unit STU will be described next in detail. Each of the word line groups WLG1, WLG2, and WLG3 is formed by stacking the plurality of word lines WL on a semiconductor substrate Ba. The first, second, and third word line groups WLG1, WLG2, and WLG3 and the first, second, and third select gate lines D1, S2, and D2 are arranged in a direction perpendicular to the bit lines BL.

The first columnar semiconductor structure CL1 extends through the first select gate line D1 and the word line group WLG1. One end of the first semiconductor structure CL1 is connected to a bit line BL1.

Figure 33:
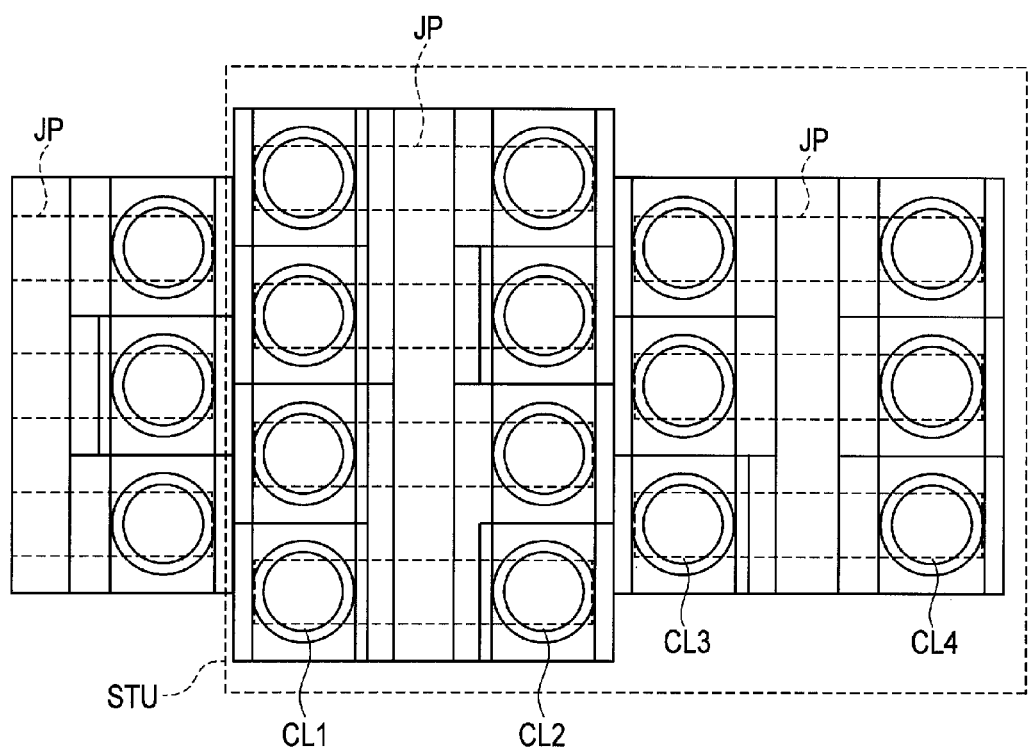
FIG. 33 is a plan view of the memory cell array.

The second columnar semiconductor structure CL2 extends through the second select gate line S2 and the word line group WLG2. As shown in FIG. 33, the second semiconductor structure CL2 is arranged at the same position as the first semiconductor structure CL1 in the word line direction. One end of the second semiconductor structure CL2 is connected to a source line SL. The other end of the second semiconductor structure CL2 is electrically connected to the other end of the first semiconductor structure CL1 via the connecting portion JP formed in the semiconductor substrate Ba.

The third columnar semiconductor structure CL3 extends through the second select gate line S2 and the word line group WLG2. As shown in FIG. 33, the third semiconductor structure CL3 is arranged at a position shifted in the word line direction with respect to the second semiconductor structure CL2. One end of the third semiconductor structure CL3 is connected to the source line SL.

The fourth columnar semiconductor structure CL4 extends through the third select gate line D2 and the word line group WLG3. As shown in FIG. 33, the fourth semiconductor structure CL4 is arranged at the same position as the third semiconductor structure CL3 in the word line direction. One end of the fourth semiconductor structure CL4 is connected to a bit line BL2. The other end of the fourth semiconductor structure CL4 is electrically connected to the other end of the third semiconductor structure CL3 via the connecting portion JP formed in the semiconductor substrate Ba.

Select transistors are formed at the positions of intersections between the first, second, third, and fourth semiconductor structures CL1 to CL4 and the first, second, and third select gate lines D1, S2, and D2. Memory cells are formed at the positions of intersections between the first, second, third, and fourth semiconductor structures CL1 to CL4 and the word line groups WLG1, WLG2, and WLG3.

Each string unit forms a logical block and is managed by a first logical block address. Note that a half string unit including one source line may be formed by a half logical block, and the half logical block may be defined as a second logical block address.

Figure 34:
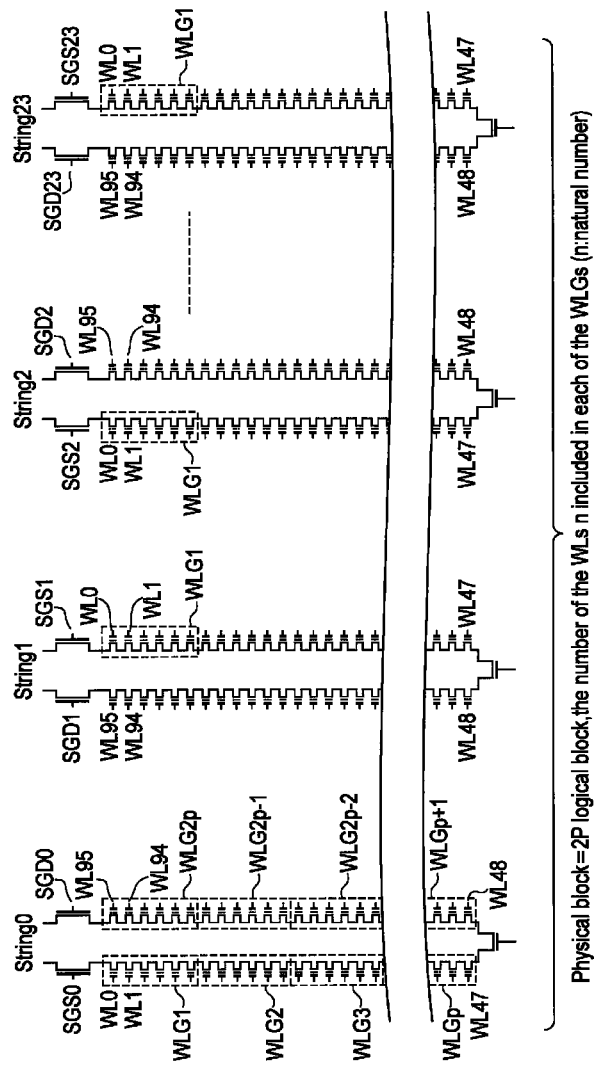
FIG. 34 representatively shows a logical block formed from a word line group.

Note that the arrangement of the logical block is not limited to the arrangement of the above-described embodiments. The logical block may be set as shown in FIG. 34. FIG. 34 shows a plurality of string units connected to one bit line (not shown). In fact, a plurality of memory cells (not shown) which share the word lines are arranged in a direction perpendicular toe the drawing surface.

Referring to FIG. 34, out of the plurality of series-connected memory cells of each string unit, for example, six adjacent memory cells form word line groups WLG1 to WLGp and WLGp+1 to WLG2p. Each of the common word line groups WLG1 to WLGp and WLGp+1 to WLG2p of each string unit forms a logical block. For this reason, in this example, 2p logical blocks exist. FIG. 34 representatively shows a logical block formed from the word line group WLG1.

<Functions and Effects of Seventh Embodiment>

According to the above-described seventh embodiment, even in a memory device using the BiCS flash memory according to the seventh embodiment, the same effects as in the above-described embodiments can be obtained.

(Eighth Embodiment)

A nonvolatile semiconductor memory device according to the eighth embodiment will be described next. In the eighth embodiment, an example in which a film mainly made of carbon is applied to the charge storage layer of a planar, so-called floating gate type NAND flash memory will be described. Note that in the eighth embodiment, the same reference numerals as in the above-described embodiments denote constituent elements having almost the same functions and arrangements, and a repetitive description thereof will be made only when necessary.

<Overall Arrangement of NAND Flash Memory>

Figure 35:
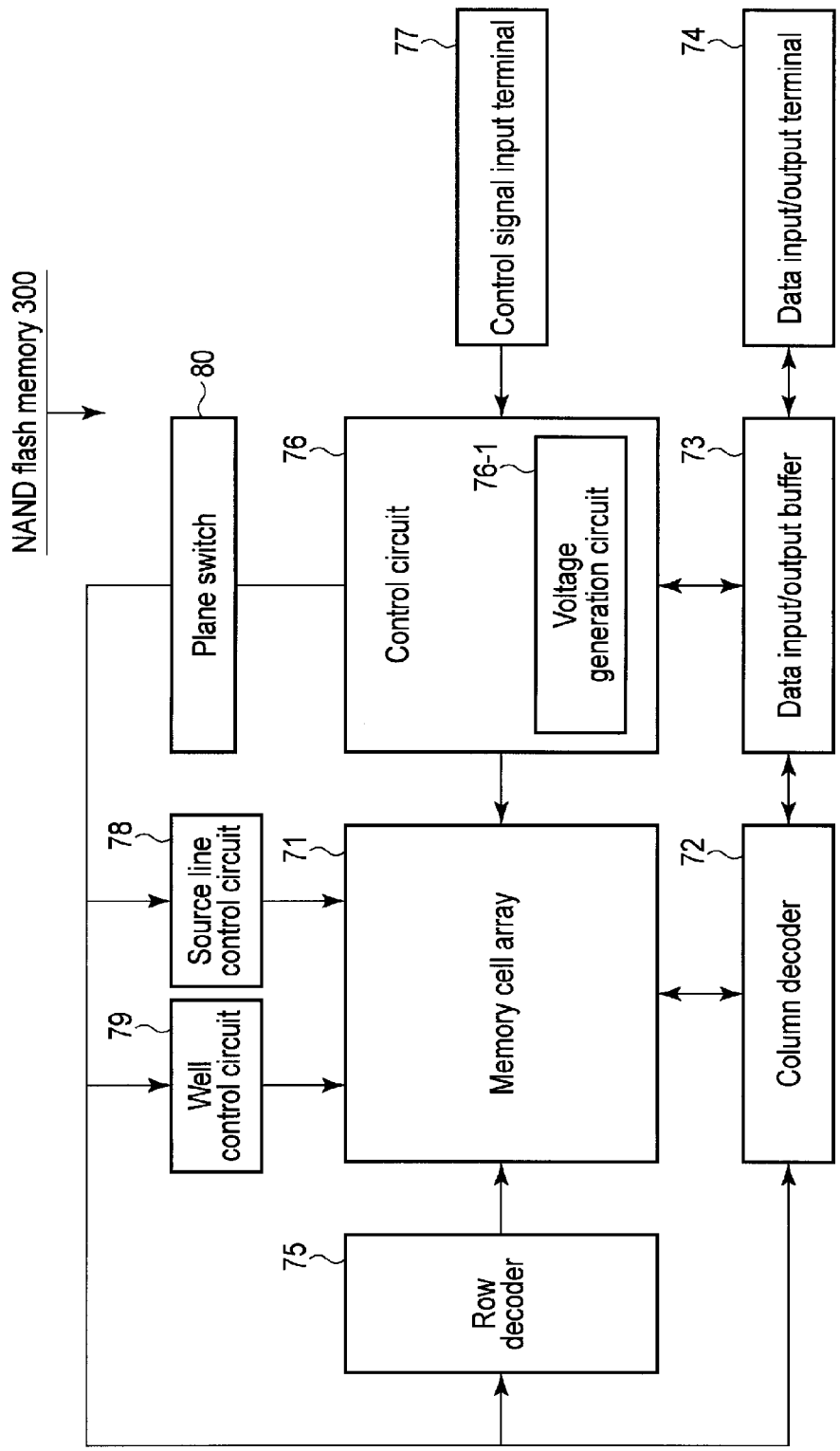
FIG. 35 is a block diagram schematically showing the basic arrangement of a NAND flash memory according to the eighth embodiment.

The arrangement of a NAND flash memory 300 according to the eighth embodiment will briefly be described with reference to FIG. 35. FIG. 35 is a block diagram schematically showing the basic arrangement of the NAND flash memory 300 according to the eighth embodiment.

As shown in FIG. 35, the NAND flash memory 300 includes a memory cell array 71, a column decoder 72, a data input/output buffer 73, a data input/output terminal 74, a row decoder 75, a control circuit 76, a control signal input terminal 77, a source line control circuit 78, a well control circuit 79, and a plane switch 80.

The memory cell array 71 includes a plurality of bit lines BL, a plurality of word lines WL, and a source line SL. The memory cell array 71 is formed from a plurality of blocks BLK in which electrically rewritable memory cell transistors (to be also simply referred to as memory cells) MT are arranged in a matrix. The memory cell transistor MT includes, for example, a stacked gate including a control gate electrode and a charge storage layer (for example, floating gate electrode), and stores binary or multi-level data in accordance with a change in the threshold of the transistor which is decided by the amount of charges injected into the floating gate electrode. The memory cell transistor MT may have a MONOS (Metal-Oxide-Nitride-Oxide-Silicon) structure in which a nitride film traps electrons.

The column decoder 72 includes a sense amplifier (not shown) that senses and amplifies the voltage of the bit line BL in the memory cell array 71, a data storage circuit (not shown) which latches data to be written, and the like. The column decoder 72 reads data of the memory cell transistor MT in the memory cell array 71 via the bit line BL, detects the state of the memory cell transistor MT via the bit line BL, or performs write to the memory cell transistor MT by applying a write control voltage to the memory cell transistor MT via the bit line BL.

The column decoder 72 also selects a data storage circuit in the column decoder 72, and outputs data of the memory cell transistor MT, read to the data storage circuit, from the data input/output terminal 74 to the outside (host) via the data input/output buffer 73.

The data input/output buffer 73 receives data from the data input/output terminal 74, and stores it in the data storage circuit selected by the column decoder 72. The data input/output buffer 73 also outputs data to the outside via the data input/output terminal 74.

The data input/output terminal 74 receives not only write data but also various commands and addresses for write, read, erase, status read, and the like.

In a data read operation, write operation, or erase operation, the row decoder 75 selects one block BLK and unselects the remaining blocks BLK. That is, the row decoder 75 applies voltages necessary in the read operation, write operation, and erase operation to the word lines WL and select gate lines VSGS and VSGD of the memory cell array 71.

The source line control circuit 78 is connected to the memory cell array 71. The source line control circuit 78 controls the voltage of the source line SL.

The well control circuit 79 is connected to the memory cell array 71. The well control circuit 79 controls the voltage of the semiconductor substrate (well) where the memory cell transistor MT is formed.

The control circuit 76 controls the memory cell array 71, the column decoder 72, the data input/output buffer 73, the row decoder 75, the source line control circuit 78, and the well control circuit 79. The control circuit 76 includes a voltage generation circuit 76-1 that boosts, for example, the power supply voltage. The control circuit 76 boosts the power supply voltage as needed by the control circuit 76, and applies the boosted voltage to the column decoder 72, the data input/output buffer 73, the row decoder 75, and the source line control circuit 78.

The control circuit 76 controls the operations based on control signals (command latch enable signal CLE, address latch enable signal ALE, ready/busy signal RY/BY, and the like) input from the outside via the control signal input terminal 77 and commands input from the data input/output terminal 74 via the data input/output buffer 73. That is, the control circuit 76 generates a desired voltage at the time of data program verify, read, and erase and supplies it to the units of the memory cell array 71 in accordance with the control signal and commands.

The plane switch 80 is connected to the control circuit 76 and the voltage generation circuit 76-1. The plane switch 80 switches the output destination of a voltage from the voltage generation circuit 76-1 based on signals from the control circuit 76 and the like.

The configuration of the memory cell array 71 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKD GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire descriptions of these patent applications are incorporated by reference herein.

<Arrangement of Drivers according to Eighth Embodiment>

FIG. 36 is a block diagram schematically showing the relationship between CG drivers and plane switches according to the eighth embodiment.

A case where the memory cell array 71 includes two planes will be explained with reference to FIG. 36 for the sake of simplicity. In this embodiment, a case where one plane includes four blocks will be described.

As shown in FIG. 36, the voltage generation circuit 76-1 includes a power supply 761, a CG driver 762, and an SG driver 763. The power supply 761 supplies power to the CG driver 762, the SG driver 763, and other circuits.

As shown in FIG. 37, the CG driver 762 according to the eighth embodiment includes a VCGSEL circuit 762a, CGN drivers 762b and 762d (16 in total), a CGD driver 762c (two in total), and a CGU driver 762e.

The VCGSEL circuit 762a outputs a voltage VPGM or VCGRV as a voltage VCGSEL in accordance with a control signal from the control circuit 76.

The CGN drivers 762b and 762d and the CGD driver 762c output one of the voltages VCGSEL, VUSEL1, VUSEL2, and VSS in accordance with a control signal from the control circuit 76.

The CGU driver 762e outputs one of the voltages VUSEL1, VUSEL2, and VSS in accordance with a control signal from the control circuit 76. Voltages VCELSRC and VCPWELL are connected to the memory cell array 71.

The CGN driver drives the word lines WL (to be also referred to as Data WL) that store data on a line-by-line basis. The CGN driver includes a CGNA driver, a CGNB driver, a CGNC driver, and a CGND driver each of which includes four drivers. The CGD driver drives the word lines WL (to be also referred to as Dummy WL) that do not store data on a line-by-line basis. No Dummy WL or one or more Dummy WL are prepared in each generation as needed to ensure the litho-margin and the cell characteristic of Data WL. The CGD driver includes a DGDD driver and a CGDS driver. The CGDD driver selectively outputs, for example, a voltage VREADK. The CGDS driver selectively outputs a voltage VREAD. The CGU driver can select only a few voltages but has a driving force. In the program/read operation associated with the memory, the word lines WL far part from the selected word line WL are equally driven by the same potential. In this case, the CGU driver is used.

The SG driver 763 is a driver that supplies power to the select gate and the like of the memory cell array 71.

The plane switch 80 includes plane switches CGSW and SGSW for each plane of the memory cell array 71. More specifically, the plane switch 80 includes a plane switch CGSW 801*a* and a plane switch SGSW 801*b* in correspondence with a plane <0>, and a plane switch CGSW 802*a* and a plane switch SGSW 802*b* in correspondence with a plane <1>.

The plane switch CGSW 801*a* receives a zone signal ZONE_P0<3:0>, a mode signal MODE_P0<1:0>, and CGD*SW_P0 from the control circuit 76. The plane switch CGSW 801*a* also receives CGNA<3:0>, CGNB<3:0>, CGNC<3:0>, CGND<3:0>, CGDD, CGDS, and CGU from the CG driver 762. The plane switch CGSW 801*a* supplies the signals from the CG driver 762 to the row decoder 75 based on signals from the control circuit 76. The plane switch SGSW 801*b* supplies the SGS signal and the SGD signal received from the SG driver 763 to the row decoder 75 based on the signals from the control circuit 76.

The row decoder 75 includes a row decoder for each plane. More specifically, the row decoder 75 includes a row decoder 751 corresponding to the plane <0> and a row decoder 752 corresponding to the plane <1>.

The row decoder 751 receives a signal BLKADD_P0<1:0> and a signal RDEC_P0 from the control circuit 76. The row decoder 751 also receives CGI<31:0>, CGDDI, and CGDSI from the plane switch CGSW 801*a*. The row decoder 751 also receives SGSI, SGDI, USGSI, and USGDI from the plane switch SGSW 801*b*. The row decoder 751 supplies the signals to the plane <0> based on the received signals. The row decoder 752 operates like the row decoder 751.

<Arrangement of Switches Concerning CGD in Plane Switch CGSW>

The arrangement of switches concerning CGD in the plane switch CGSW according to the eighth embodiment will briefly be described next with reference to FIG. 38.

For example, in the eighth embodiment, the plane switch CGSW 801*a* includes switches 80*a*, 80*b*, 80*c*, and 80*d*.

CGDD is input to one end of the voltage path of the switch 80*a*. The other end of the voltage path is connected to the signal line CGDDI. A signal from the control circuit 76 is input to the gate.

CGDS is input to one end of the voltage path of the switch 80*b*. The other end of the voltage path is connected to the signal line CGDDI. A signal from the control circuit 76 is input to the gate.

CGDD is input to one end of the voltage path of the switch 80*c*. The other end of the voltage path is connected to the signal line CGDSI. A signal from the control circuit 76 is input to the gate.

CGDS is input to one end of the voltage path of the switch 80*d*. The other end of the voltage path is connected to the signal line CGDSI. A signal from the control circuit 76 is input to the gate.

Note that the arrangement of switches concerning CGN in the plane switch CGSW according to this embodiment is the same as the arrangement of switches concerning CGN in the plane switch CGSW described in the first embodiment, and a description thereof will be omitted.

<Example of CG Mapping>

Figure 39:
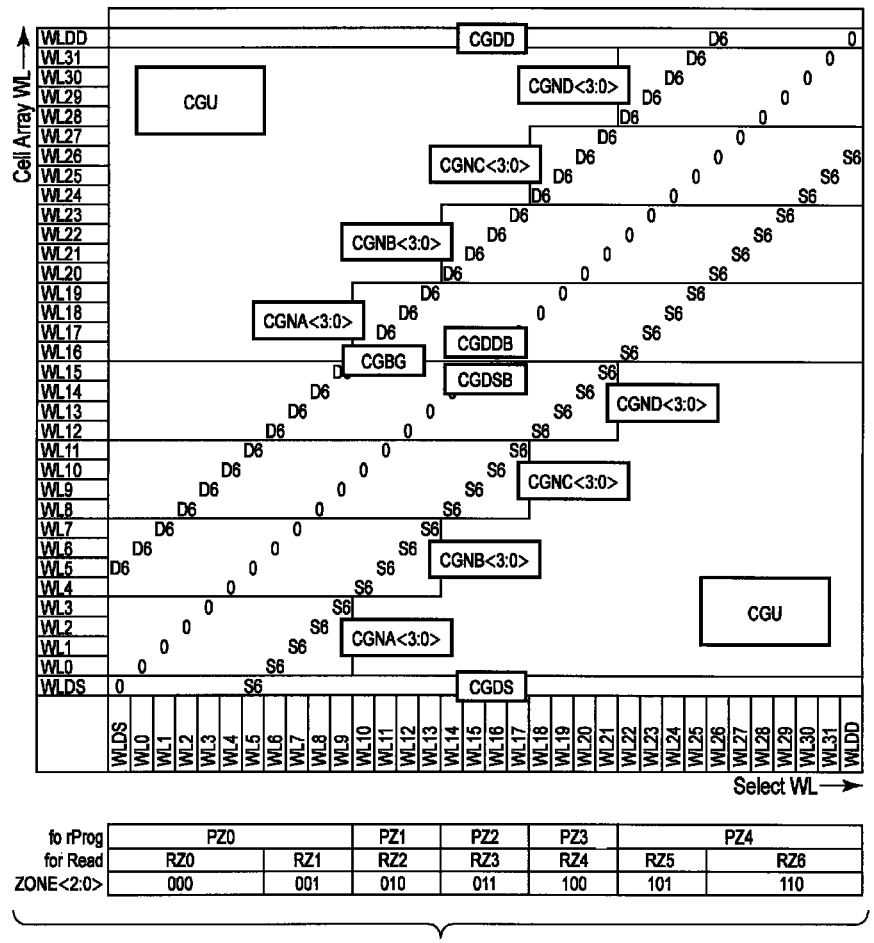
FIG. 39 is a view showing CG mapping in the program operation of a semiconductor memory device according to the eighth embodiment.
Figure 40:
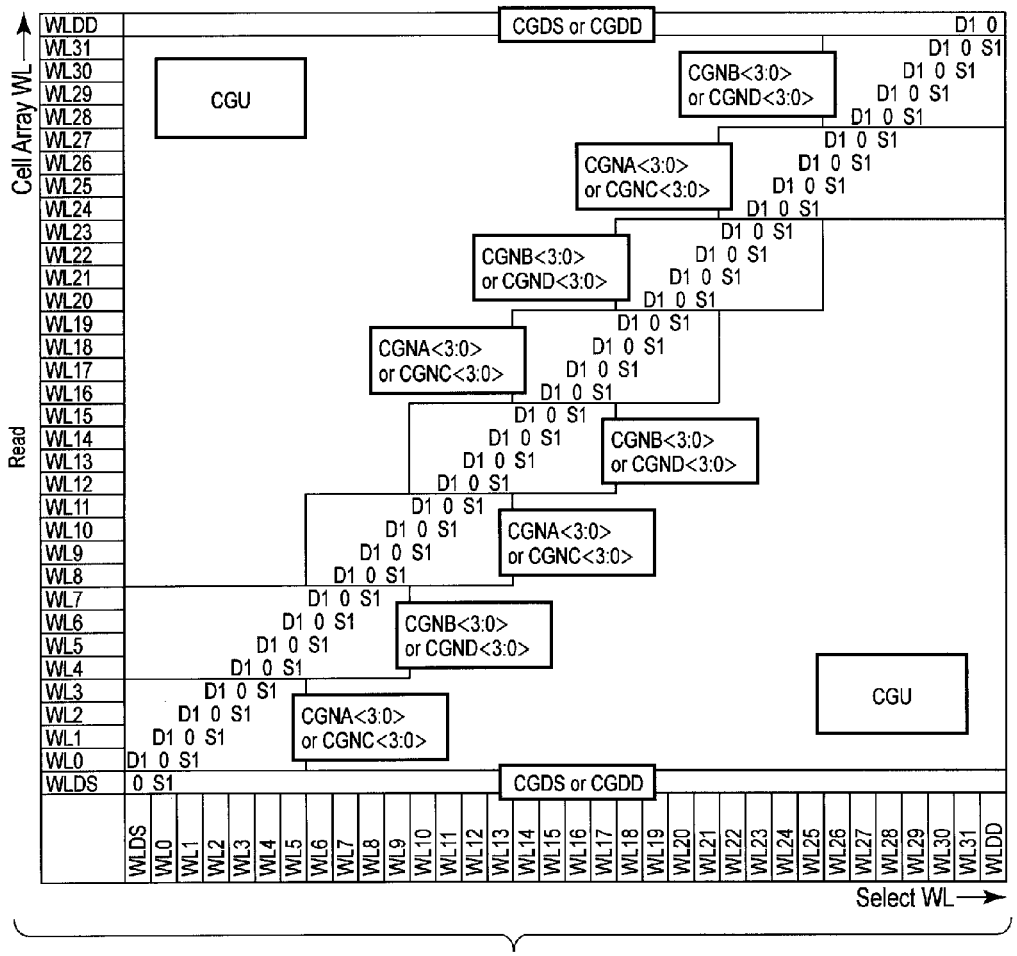
FIG. 40 is a view showing CG mapping in the read operation of the semiconductor memory device according to the eighth embodiment.
Figure 41:
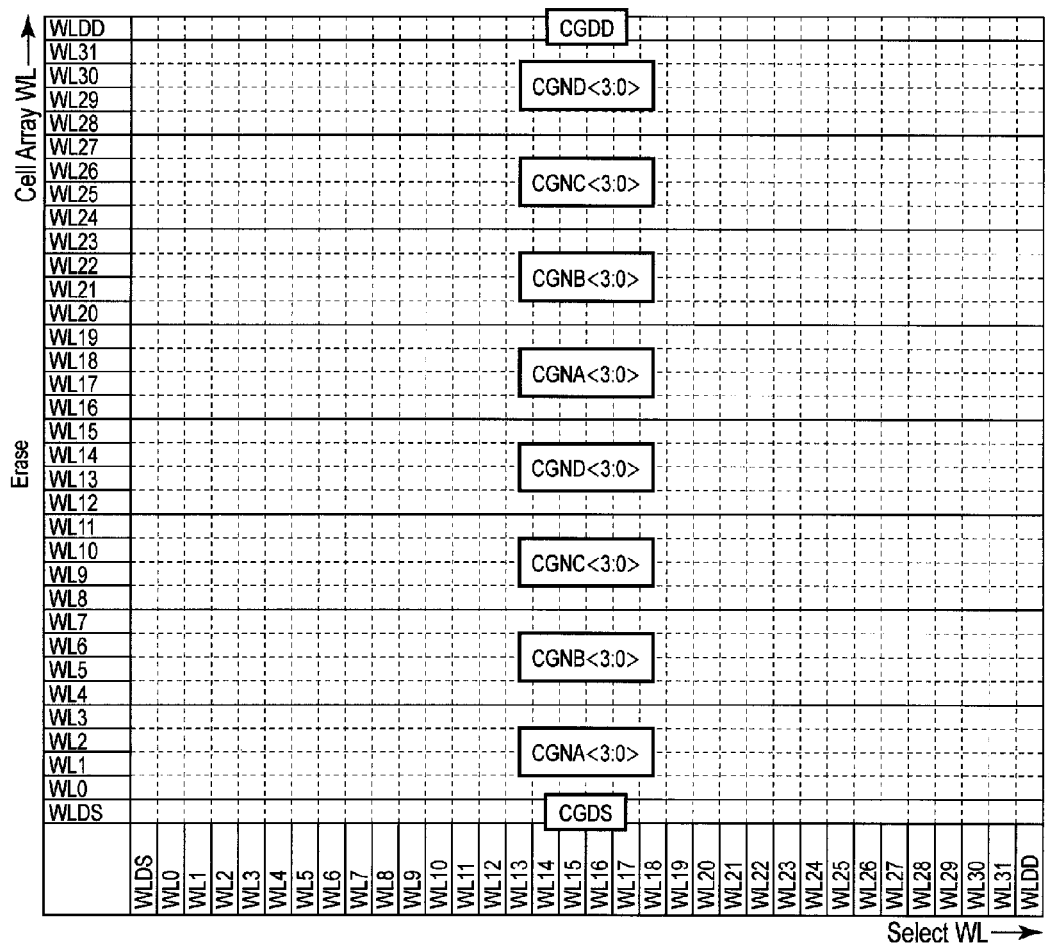
FIG. 41 is a view showing CG mapping in the erase operation of the semiconductor memory device according to the eighth embodiment.

CG mapping according to the eighth embodiment will briefly be described with reference to FIGS. 39, 40, and 41. FIG. 39 is a view showing CG mapping in the program operation of the semiconductor memory device according to the eighth embodiment. FIG. 40 is a view showing CG mapping in the read operation of the semiconductor memory device according to the eighth embodiment. FIG. 41 is a view showing CG mapping in the erase operation of the semiconductor memory device according to the eighth embodiment. Referring to FIGS. 39, 40, and 41, the ordinate represents CG driver assignment to the word lines WL, and the abscissa represents the selected word line WL.

Note that in the eighth embodiment, except the read operation, the CGDD driver always applies a dedicated voltage to a word line WLDD, and the CGDS driver always applies a dedicated voltage to a word line WLDS.

<Example of CG Mapping in Program Operation>

CG mapping in the program operation will be described first. As shown in FIG. 39, depending on the selected word line WL, the CG drivers that apply voltages to the word lines WL are appropriately switched.

The zone on the abscissa of FIG. 39 is information with which the control circuit designates one of the CGN drivers and the CGU driver to be connected to each Data WL. For example, a plane and page address to be accessed are input from a host 2 to a memory controller 20. The memory controller 20 thus inputs the plane and page address to be accessed to the NAND flash memory 300. The control circuit 76 in the memory device transmits ZONE<3:0> to the plane switch circuit 80 of the plane of interest, thereby deciding the driver. More specifically, when programming the word lines WLDS and WL0 to WL9, the CGNA driver applies a desired voltage to the word lines WL0 to WL3. Similarly, the CGNB driver, the CGNC driver, the CGND driver, and the CGU driver apply desired voltages to the word lines WL4 to WL7, WL8 to WL11, WL12 to WL15, and WL16 to WL31, respectively.

When programming the word lines WL10 to WL13, switching occurs to connect the CGNA driver to the word lines WL16 to WL19 and the CGU driver to the word lines WL0 to WL3. Predetermined connection is done in accordance with the word lines WL to be programmed. There are five types of connection combinations corresponding to zones PZ0 to PZ4.

Each of the zones PZ0 to PZ4 is called a zone for the program, as described in the first embodiment.

In this embodiment, a total of 16 CGN drivers are used so that the voltages of the unselected word lines WL(i+1) to WL(i+6) (see D6 in FIG. 39) or the unselected word lines WL(i-1) to WL(i-6) (see S6 in FIG. 39) with respect to the selected word line WLi (i: 0 to 31) at the time of program can accurately be controlled by the CGN drivers.

<Example of CG Mapping in Read Operation>

CG mapping in the read operation will be described next.

At the time of read of the NAND semiconductor memory device, applying a read voltage to the selected word line WLi, the voltage VREADK to the word lines WL of the unselected word lines WL(i±1), and a voltage called VREAD to the remaining word lines WL suffices. It is possible to reduce the range of the word lines WL that need to be controlled and the necessary number of CGN drivers as compared to those in the program.

As shown in FIG. 40, depending on the selected word line WL, the CG drivers that apply voltages to the word lines WL are appropriately switched.

Zones RZ0 to RZ6 for the read are set, as represented by the abscissa of FIG. 40.

More specifically, when reading from the word lines WLDS and WL0 to WL5, the CGNA driver or CGNC driver applies a desired voltage to the word lines WL0 to WL3. Similarly, the CGNB driver or CGND driver applies a desired voltage to the word lines WL4 to WL7, and the CGU driver applies a desired voltage to the word lines WL8 to WL31. When reading from the word lines WL6 to WL9, switching occurs to connect the CGNA driver or CGNC driver to the word lines WL8 to WL11 and the CGU driver to the word lines WL0 to WL3. Predetermined connection is done in accordance with the word lines WL to be read-accessed. There are seven types of connection combinations corresponding to, the zones RZ0 to RZ6. Each of the zones RZ0 to RZ6 is called a zone for the read.

When the zone RZ0 is selected, the zone signal is "000". When the zone RZ1 is selected, the zone signal is "001". When the zone RZ2 is selected, the zone signal is "010". When the zone RZ3 is selected, the zone signal is "011". When the zone RZ4 is selected, the zone signal is "100". When the zone RZ5 is selected, the zone signal is "101". When the zone RZ6 is selected, the zone signal is "110".

As described above, in this embodiment, at least the voltage of the unselected word line WL(i+1) (see D1 in FIG. 40) or the unselected word line WL(i−1) (see S1 in FIG. 40) with respect to the selected word line WLi (i: 0 to 31) can be switched by the CGN driver. When the CGNA and CGNB drivers and the CGNC and CGND drivers are assigned as drivers to apply voltages to the word lines WL of different planes, two types of word lines WL can freely be designated in the multi-plane read. To select two types of word lines WL in the multi-plane read in the NAND semiconductor memory device including, for example, 16 CGN drivers, the 16 CGN drivers are divided into four groups. Two groups are assigned to select one type of word lines WL, and the remaining two groups are assigned to select the other type of word lines WL.

<Example of CG Mapping in Erase Operation>

CG mapping in the erase operation will be described next.

As shown in FIG. 41, in the erase operation, the CGNA driver applies a voltage to the word lines WL0 to WL3 and WL16 to WL19, and the CGNB driver applies a voltage to the word lines WL4 to WL7 and WL20 to WL23. The CGNC driver applies a voltage to the word lines WL8 to WL11 and WL24 to WL27, and the CGND driver applies a voltage to the word lines WL12 to WL15 and WL28 to WL31. Note that this embodiment is irrelevant to the erase operation, and a detailed description thereof will be omitted.

<CG Connection Table>

A CG connection table will be described next with reference to FIGS. 42A and 42B. FIG. 42A shows the connection relationship from the CGN/CGU driver to the CGI for the zone signals in the erase operation, program operation, and read operation. FIG. 42B shows the connection relationship from the CGD driver to the CGD*I.

As shown in FIG. 42A, the mode signal MODE<1:0> is "00" in the erase and "01" in the program. The mode signal MODE<1:0> is "10" in the read (Read-A) and "11" in the read (Read-B). The read operation itself does not substantially change but the CG drivers to be used change between read (Read-A) and read (Read-B) shown in FIG. 42A.

As shown in FIG. 42B, when CGDDSW is "0", the CGDDI output is the output of the CGDD driver. When CGDDSW is "1", the CGDDI output is the output of the CGDS driver. When CGDDSSW is "0", the CGDSI output is the output of the CGDS driver. When CGDDSSW is "1", the CGDSI output is the output of the CGDD driver.

<Functions and Effects of Eighth Embodiment>

According to the above-described eighth embodiment, even in a memory device using the planar NAND flash memory, the same effects as in the above-described embodiments can be obtained.

(Ninth Embodiment)

The ninth embodiment will be described next. In the ninth embodiment, a read operation near a dummy word line in the NAND flash memory 300 described in the eighth embodiment will be explained. Note that in the ninth embodiment, the same reference numerals as in the above-described eighth embodiment denote constituent elements having almost the same functions and arrangements, and a repetitive description thereof will be made only when necessary.

A read operation when a selected word line WL is located near a dummy word line WLD and a read operation when the selected word line WL is not located near the dummy word line WLD will be described with reference to FIGS. 43A and 43B. FIG. 43A is a view showing a zone signal ZONE<3:0>, a mode signal MODE<1:0>, and signals CGDDSW and CGDDSSW when the selected word line WL is located near the dummy word line WLD in the read operation. FIG. 43B is a view showing the types of CG drivers used for the word lines WL and voltages applied to the word lines WL. Note that focus is placed here on planes 0 and 1, and a case where hSLC data is read from plane 1 will be explained for the sake of simplicity.

As shown in FIGS. 43A and 43B, in plane 0, when the selected word line WL is, for example, a word line WL31 adjacent to a dummy word line WLDD, the zone signal ZONE<3:0> is "110", the mode signal MODE<1:0> is "10", the signal CGDDSW is "0", and the signal CGDSSW is "0".

A voltage VCGRV is applied to the selected word line WL31 by a CGNB<3> driver, and a voltage VREADK (VREADK>VCGRV) is applied to an unselected word line WL30 by a CGNB<2> driver. The voltage VREADK (VREADK>VCGRV) is applied to the dummy word line WLDD by a CGDD driver.

As shown in FIGS. 43A and 43B, in plane 1, when the selected word line WL is, for example, a word line WL15 that is not adjacent to the dummy word line WLD, the zone signal ZONE<3:0> is "011", the mode signal MODE<1:0> is "11", the signal CGDDSW is "1", and the signal CGDSSW is "0".

The voltage VCGRV is applied to the selected word line WL15 by the CGNB<3> driver, and the voltage VREADK (VREADK>VCGRV) is applied to unselected word lines WL14 and WL16 by the CGND driver.

(10th Embodiment)

The 10th embodiment will be described next. In the 10th embodiment, CG drivers and a power supply different from those described in the ninth embodiment will be described. Note that in the 10th embodiment, the same reference numerals as in the above-described embodiments denote constituent elements having almost the same functions and arrangements, and a repetitive description thereof will be made only when necessary.

As shown in FIG. 44, in a power supply 761 and a CG driver 762 according to the 10th embodiment, the power supply is divided for planes A and B. As shown in FIG. 44, the CG driver 762 according to the 10th embodiment includes a VCGSEL circuit 762a, CGN drivers 762b and 762d (16 in total), CGD drivers 762c (two in total), a CGU driver 762e, a VCGSEL2 circuit 762f, CGD drivers 762g (two in total), and a CGU driver 762h.

The VCGSEL circuit 762a outputs a voltage VPGM or VCGRVA as a voltage VCGSEL_AB in accordance with a control signal from a control circuit 76.

The CGN driver 762b and the CGD driver 762c output one of the voltages VCGSEL_AB, VUSEL1A, VUSEL2A, and VSS to the plane A in accordance with a control signal from the control circuit 76.

The CGU driver 762e outputs one of the voltages VUSEL1A, VUSEL2A, and VSS to the plane A in accordance with a control signal from the control circuit 76.

The VCGSEL2 circuit 762f outputs the voltages VPGM, VCGRVA, and VCGRVB as a voltage VCGSEL_CD in accordance with a control signal from the control circuit 76. The VCGSEL2 circuit 762f also outputs the voltages VUSEL1A and VUSEL1B as a voltage VUSEL1_CD in accordance with a control signal from the control circuit 76. The VCGSEL2 circuit 762f also outputs voltages VUSEL2A and VUSEL2B as a voltage VUSEL2_CD in accordance with a control signal from the control circuit 76.

The CGN driver 762d and the CGD driver 762g output one of the voltages VCGSEL_CD, VUSEL1_CD, VUSEL2_CD, and VSS to the plane B in accordance with a control signal from the control circuit 76.

The CGU driver 762h outputs one of the voltages VUSEL1_CD, VUSEL2_CD, and VSS to the plane B in accordance with a control signal from the control circuit 76. Voltages VCELSRCA and VCPWELLA are connected to a memory cell array 71 of the plane A. Voltages VCELSRCB and VCPWELLB are connected to the memory cell array 71 of the plane B. Note that the planes A and B can be arbitrary planes.

<Functions and Effects of 10th Embodiment>

According to the above-described 10th embodiment, the power supply 761 according to the 10th embodiment includes two voltage systems for two planes, as compared to the power supply 761 according to the ninth embodiment. In addition, a CGN driver arrangement capable of simultaneously applying voltages to the two planes is formed. It is therefore possible to simultaneously read, for example, MLC data and hSLC data or SLC data and hSLC data as described above.

(11th Embodiment)

The 11th embodiment will be described next. In the 11th embodiment, a read operation of outputting data of a plane that has not completed read operation even if the plane that has not completed read operation exists when performing a multi-plane access operation will be described. Note that in the 11th embodiment, the same reference numerals as in the above-described embodiments denote constituent elements having almost the same functions and arrangements, and a repetitive description thereof will be made only when necessary. In this embodiment, a memory cell array 11 has the arrangement described with reference to FIG. 2.

<Example of Read Sequence According to 11th Embodiment>

A read sequence according to the 11th embodiment will be described next with reference to FIG. 45.

An example will be explained here in which MLC-Lower data or SLC data stored by a selected word line WLn of a block BLKx of plane 0 and MLC-Upper data stored by a selected word line WLm of a block BLKy of plane 1 are simultaneously read. Note that "CacheReady/Busy" shown in FIG. 45 is a signal indicating ready/busy of a signal line between a memory controller 20 and a BiCS flash memory 10. Additionally, "TrueReady/Busy" shown in FIG. 45 is a signal indicating ready/busy of the BiCS flash memory 10 itself. A control circuit 15 notifies the memory controller 20 of "CacheReady/Busy" and "TrueReady/Busy" via a Ready/Busy terminal (not shown).

As shown in FIG. 45, when reading data of plane 0, the memory controller 20 first issues a 00h command to the BiCS flash memory 10. The memory controller 20 then issues an address and the like concerning plane 0 to the BiCS flash memory 10.

Additionally, the memory controller 20 issues a 00h command to the BiCS flash memory 10 to read data of plane 1. The memory controller 20 then issues an address and the like concerning plane 1 to the BiCS flash memory 10.

As shown in FIG. 45, when an xxh command is input from the memory controller 20, the BiCS flash memory 10 performs the read operation simultaneously for planes 0 and 1.

A voltage generation circuit 16 applies a voltage BR or SLCR to the selected word line WLn of the block BLKx of plane 0 in accordance with an instruction from the control circuit 15. MLC-Lower data or SLC data is thus read from plane 0.

The voltage generation circuit 16 also applies a voltage AR to the selected word line WLm of the block BLKy of plane 1 and then applies a voltage CR (CR>AR) to the selected word line WLn in accordance with an instruction from the control circuit 15. MLC-Upper data is thus read from plane 1.

Note that in this embodiment, the control circuit 15 changes "CacheReady/Busy" to the "Ready" state when the read operation of at least one plane (in this example, plane 0) has completed.

When "CacheReady/Busy" changes to the "Ready" state, the memory controller 20 issues a DOUT (P0) command to read data from plane 0 of the BiCS flash memory 10. When receiving the DOUT (P0) command, the BiCS flash memory 10 transmits the data of plane 0 to the memory controller 20.

Note that the memory controller 20 may issue a command to select plane 0 to the BiCS flash memory 10 before issuance of the DOUT (P0) command.

In this embodiment, the control circuit 15 changes "TrueReady/Busy" to the "Ready" state when the read operation of all planes (in this example, planes 0 and 1) as the target of the multi-plane access operation has completed.

When "TrueReady/Busy" changes to the "Ready" state, the memory controller 20 issues a yyh command and a DOUT (P1) command to read data from plane 1 of the BiCS flash memory 10. The yyh command is a command to select a plane to perform the read operation.

When receiving the yyh command and the DOUT (P1) command, the BiCS flash memory 10 transmits the data of plane 1 to the memory controller 20.

In the above-described way, the memory controller 20 continuously reads MLC-Lower data or SLC data and MLC-Upper data.

In this embodiment, when performing multi-plane access, the word line WL number and the plane number of MLC-Lower data or SLC data may be different from those of MLC-Upper data.

<Functions and Effects of 11th Embodiment>

According to the above-described embodiment, if a plane that has completed the read operation exists in the multi-plane access operation, the BiCS flash memory 10 changes "CacheReady/Busy" to the "Ready" state. This enables data output even if a plane that has not completed the read operation exists.

This makes it possible to output data before the end of the read operation of all planes in the multi-plane access operation. It is therefore possible to speed up the read operation of the BiCS flash memory 10.

(12th Embodiment)

The 12th embodiment will be described next. In the 12th embodiment, a case where the multi-plane access operation described in the 11th embodiment is applied to four planes will be described. Note that in the 12th embodiment, the same reference numerals as in the above-described embodiments denote constituent elements having almost the same functions and arrangements, and a repetitive description thereof will be made only when necessary. In this embodiment, a memory cell array 11 has the arrangement described with reference to FIG. 2.

<Example of Read Sequence According to 12th Embodiment>

A read sequence according to the 12th embodiment will be described with reference to FIG. 46.

An example will be explained here in which SLC data stored by a selected word line WLk of a block BLKw of plane 0, MLC-Lower data stored by a selected word line WL1 of a block BLKx of plane 1, MLC-Upper data stored by a selected word line WLm of a block BLKy of plane 2, and MLC-Upper data stored by a selected word line WLn of a block BLKz of plane 3 are simultaneously read.

As shown in FIG. 46, a memory controller 20 issues a 00h command and predetermined addresses associated with read to the BiCS flash memory 10. When an xxh command is input from the memory controller 20, the BiCS flash memory 10 performs the read operation for planes 0 to 3.

A voltage generation circuit 16 applies a voltage SLCR to the selected word line WLk of the block BLKw of plane 0 in accordance with an instruction from a control circuit 15. SLC data is thus read from plane 0.

The voltage generation circuit 16 applies a voltage BR to the selected word line WL1 of the block BLKx of plane 1 in accordance with an instruction from the control circuit 15. MLC-Lower data is thus read from plane 1.

The voltage generation circuit 16 applies a voltage AR to the selected word line WLm of the block BLKy of plane 2 and then applies a voltage CR (CR>AR) to the selected word line WLm in accordance with an instruction from the control circuit 15. MLC-Upper data is thus read from plane 2.

The voltage generation circuit 16 also applies the voltage AR to the selected word line WLn of the block BLKz of plane 3 and then applies the voltage CR (CR>AR) to the selected word line WLn in accordance with an instruction from the control circuit 15. MLC-Upper data is thus read from plane 3.

Note that in this embodiment, the control circuit 15 changes "CacheReady/Busy" to the "Ready" state when the read operation of at least one plane (in this example, planes 0 and 1) has completed.

When "CacheReady/Busy" changes to the "Ready" state, the memory controller 20 issues a y1h command and a DOUT (P0) command to read data from plane 0 of the BiCS flash memory 10. The y1h command is a command to select a plane to perform the read operation.

When receiving the y1h command and the DOUT (P0) command, the BiCS flash memory 10 transmits the data of plane 0 to the memory controller 20.

Additionally, in this embodiment, "TrueReady/Busy" changes to the "Ready" state when the read operation of all planes (in this example, planes 0 and 1) has completed in the BiCS flash memory 10.

When "TrueReady/Busy" changes to the "Ready" state, the memory controller 20 causes planes other than the plane read-accessed first to output data.

Here, the memory controller 20 issues a y2h command and a DOUT (P1) command to read data from plane 1 of the BiCS flash memory 10. The y2h command is a command to select a plane to perform the read operation.

When receiving the y2h command and the DOUT (P1) command, the BiCS flash memory 10 transmits the data of plane 1 to the memory controller 20.

Then, the memory controller 20 issues a y3h command and a DOUT (P2) command to read data from plane 2 of the BiCS flash memory 10. The y3h command is a command to select a plane to perform the read operation.

When receiving the y3h command and the DOUT (P2) command, the BiCS flash memory 10 transmits the data of plane 2 to the memory controller 20.

Next, the memory controller 20 issues a y4h command and a DOUT (P3) command to read data from plane 3 of the BiCS flash memory 10. The y4h command is a command to select a plane to perform the read operation. When receiving the y4h command and the DOUT (P3) command, the BiCS flash memory 10 transmits the data of plane 3 to the memory controller 20.

In the above-described way, the memory controller 20 continuously reads SLC data, MLC-Lower data, and MLC-Upper data.

In this embodiment, when performing multi-plane access, the word line WL number and the plane number of SLC data may be different from those of MLC-Upper data.

<Functions and Effects of 12th Embodiment>

According to the above-described embodiment, even when performing the multi-plane operation for four planes, the same operation as in the 11th embodiment can be performed. It is therefore possible to obtain the same effects as in the 11th embodiments independently of the number of planes.

In the 12th embodiment, an example in which the 11th embodiment is applied to four planes has been described. However, the number of planes is not limited to this, and the 11th embodiment can be applied to three planes or five planes.

(13th Embodiment)

The 13th embodiment will be described next. In the 13th embodiment, a case where the read operation described in the 11th embodiment is applied to a plane including a memory cell transistor that stores octal data will be described. Note that in the 13th embodiment, the same reference numerals as in the above-described embodiments denote constituent elements having almost the same functions and arrangements, and a repetitive description thereof will be made only when necessary. In this embodiment, a memory cell array 11 has the arrangement described with reference to FIG. 2.

<Threshold Distribution of Memory Cell Transistor MT>

The threshold distribution of the memory cell transistor MT capable of storing octal (3-bit) data will be described next with reference to FIGS. 47 and 48.

Each memory cell transistor MT according to this embodiment can store, for example, octal data (3-bit data).

That is, the memory cell transistor MT can store eight types of data of "Er" level, "A" level, "B" level, "C" level, "D" level, "E" level, "F" level, and "G" level in ascending order of threshold voltage Vth.

The "Er", "A", "B", "C", "D", "E", "F", and "G" levels can appropriately be associated with a binary notation. Two types of binary notations will be exemplified below.

For example, in the first binary notation shown in FIG. 47, the Er", "A", "B", "C", "D", "E", "F", and "G" levels are associated with "111" "011", "001", "000", "010", "110", "100", and "101" data, respectively. The bits of each 3-bit data will be referred to as an upper page (or upper bit), middle page (or middle bit), and lower page (or lower bit), as shown in FIG. 47.

As shown in FIG. 47, a threshold voltage Vth0 of "111" data of the memory cell transistor MT is given by Vth0<AR. A threshold voltage Vth1 of "011" data is given by AR<Vth1<BR. A threshold voltage Vth2 of "001" data is given by BR<Vth2<CR. A threshold voltage Vth3 of "000" data is given by CR<Vth3<DR. A threshold voltage Vth4 of "010" data is given by DR<Vth4<ER. A threshold voltage Vth5 of "110" data is given by ER<Vth5<FR. A threshold voltage Vth6 of "100" data is given by FR<Vth6<GR. A threshold voltage Vth7 of "101" data is given by GR<Vth7. The memory cell transistor MT can thus store 3-bit data in accordance with the threshold.

In the first binary notation shown in FIG. 47, when reading data of the lower page, a voltage generation circuit 16 applies a voltage AR to a selected word line WLn and then applies a voltage ER in accordance with an instruction from a control circuit 15. When reading data of the middle page, the voltage generation circuit 16 applies a voltage BR to the selected word line WLn, next applies a voltage DR, and then applies a voltage FR in accordance with an instruction from the control circuit 15. When reading data of the upper page, the voltage generation circuit 16 applies a voltage CR to the selected word line WLn and then applies a voltage GR in accordance with an instruction from the control circuit 15.

The second binary notation will be described next. As shown in FIG. 48, in the second binary notation, the Er", "A", "B", "C", "D", "E", "F", and "G" levels are associated with "111", "110", "100", "101", "001", "000", "010", and "011" data, respectively.

Figure 48:
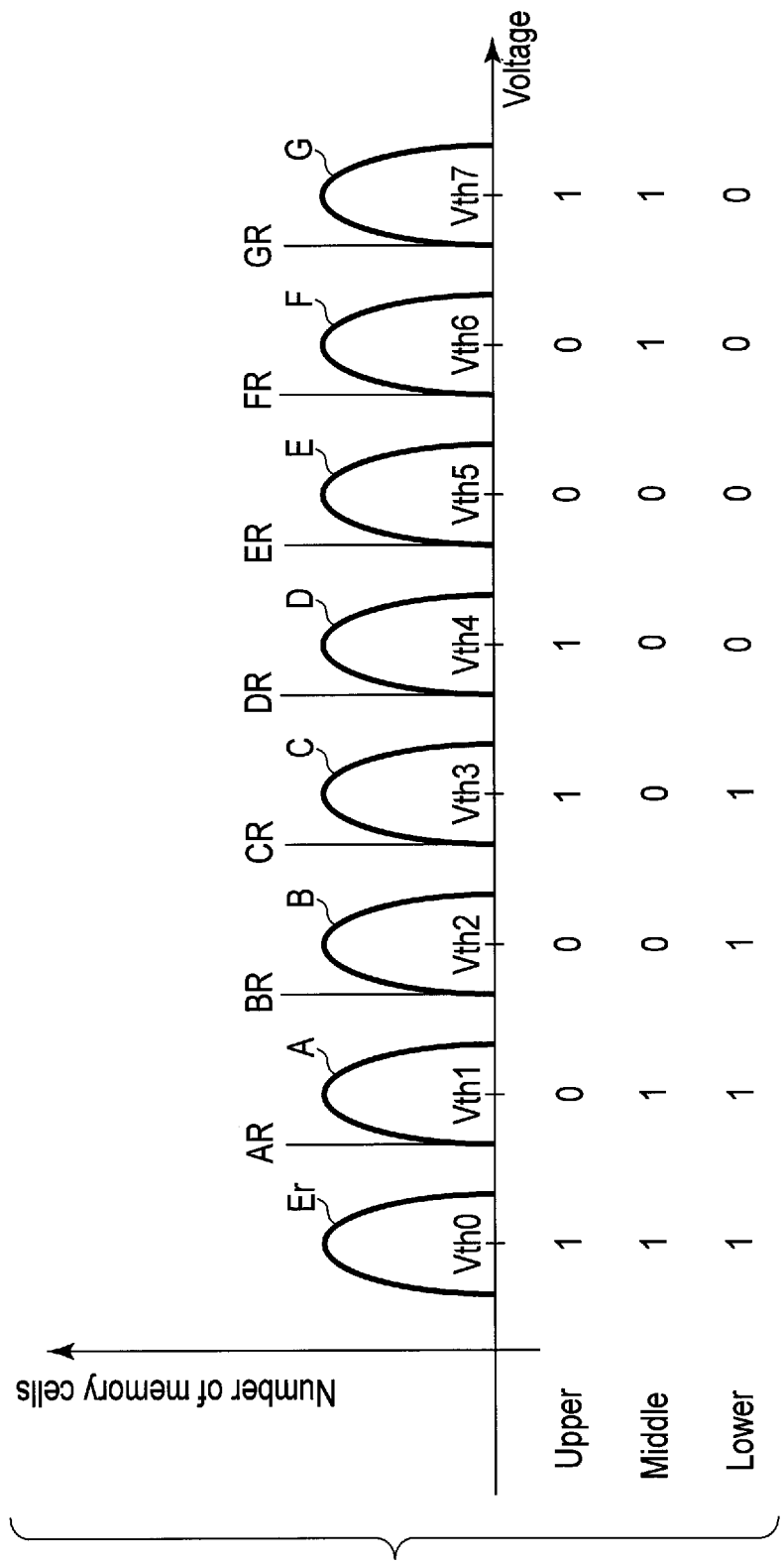
FIG. 48 is a graph showing a threshold distribution while plotting a voltage along the abscissa and the number of memory cell transistors MT along the ordinate.

In the second binary notation shown in FIG. 48, when reading data of the lower page, the voltage generation circuit 16 applies the voltage DR to the selected word line WLn in accordance with an instruction from the control circuit 15. When reading data of the middle page, the voltage generation circuit 16 applies the voltage BR to the selected word line WLn and then applies the voltage FR in accordance with an instruction from the control circuit 15. When reading data of the upper page, the voltage generation circuit 16 applies the voltage AR to the selected word line WLn, next applies the voltage CR, then applies the voltage ER, and after that, applies the voltage GR in accordance with an instruction from the control circuit 15.

The relationship between the Er" to "G" levels and the binary notation is not limited to those described with reference to FIGS. 47 and 48, and can appropriately be selected.
<Example of Read Sequence According to 13th Embodiment>

A read sequence according to the 13th embodiment will be described next with reference to FIG. 49.

An example will be explained here in which MLC-Lower data stored by a selected word line WLk of a block BLKw of plane 0 and MLC-Middle data stored by a selected word line WL1 of a block BLKx of plane 1 are simultaneously read. In this example, a case where the "Er", "A", "B", "C", "D", "E", "F", and "G" levels are associated with the first binary notation will be described.

As shown in FIG. 49, a memory controller 20 issues a 00h command and predetermined addresses associated with read to a BiCS flash memory 10. When an xxh command is input from the memory controller 20, the BiCS flash memory 10 performs the read operation from the memory cell array 11.

The voltage generation circuit 16 applies the voltage AR to the selected word line WLk of the block BLKw of plane 0 and then applies the voltage ER in accordance with an instruction from the control circuit 15. MLC-Lower data is thus read from plane 0.

The voltage generation circuit 16 also applies the voltage BR to the selected word line WL1 of the block BLKx of plane 1, next applies the voltage DR, and then applies the voltage FR in accordance with an instruction from the control circuit 15. MLC-Middle data is thus read from plane 1.

Note that in this embodiment, the control circuit 15 changes "CacheReady/Busy" to the "Ready" state when the read operation of at least one plane (in this example, plane 0) has completed.

By the same method as in the 11th embodiment, the memory controller 20 continuously reads MLC-Lower data and MLC-Middle data.
<Functions and Effects of 13th Embodiment>

According to the above-described embodiment, even when performing the multi-plane operation for a plane including a memory cell transistor capable of storing octal data, the same operation as in the 11th embodiment can be performed.

Note that in the 13th embodiment, an example in which the memory controller 20 continuously reads MLC-Lower data and MLC-Middle data has been described. However, the present invention is not limited to this.

(14th Embodiment)

The 14th embodiment will be described next. In the 14th embodiment, a case where the read operation described in the 11th embodiment is applied to four planes each including a memory cell transistor described in the 13th embodiment will be described. Note that in the 14th embodiment, the same reference numerals as in the above-described embodiments denote constituent elements having almost the same functions and arrangements, and a repetitive description thereof will be made only when necessary. In this embodiment, a memory cell array 11 has the arrangement described with reference to FIG. 2.
<Example of Read Sequence According to 14th Embodiment>

An example of a read sequence according to the 14th embodiment will be described with reference to FIG. 50. In this example, a case where the "Er", "A", "B", "C", "D", "E", "F", and "G" levels are associated with the second binary notation (see FIG. 48) will be described.

An example will be explained here in which SLC data stored by a selected word line WLk of a block BLKw of plane 0, MLC-Lower data stored by a selected word line WL1 of a block BLKx of plane 1, MLC-Middle data stored by a selected word line WLm of a block BLKy of plane 2, and MLC-Upper data stored by a selected word line WLn of a block BLKz of plane 3 are simultaneously read.

Figure 50:
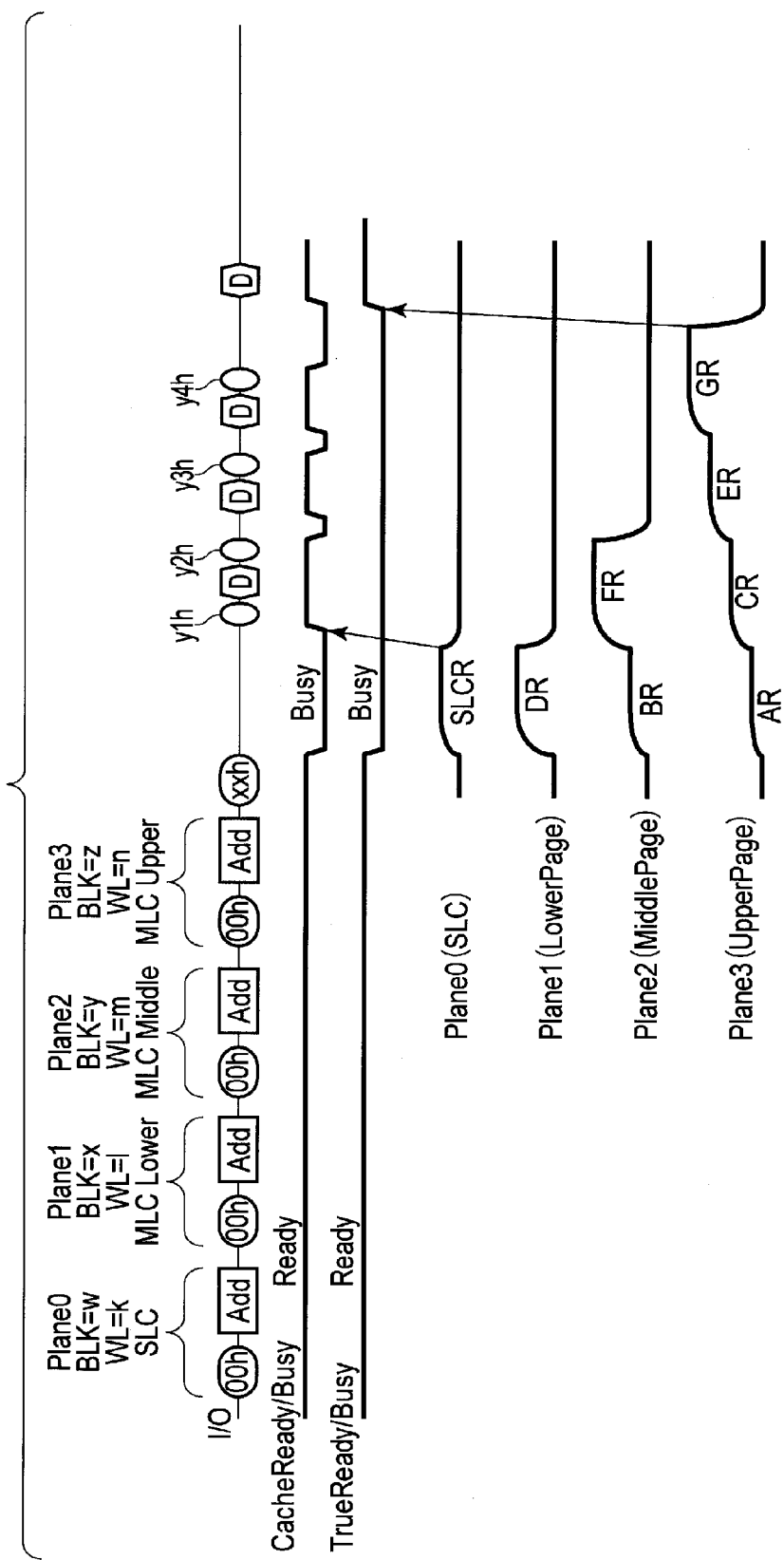
FIG. 50 is a view showing a command sequence at the time of data read for four planes and operation waveforms at the time of read.
Figure 51:
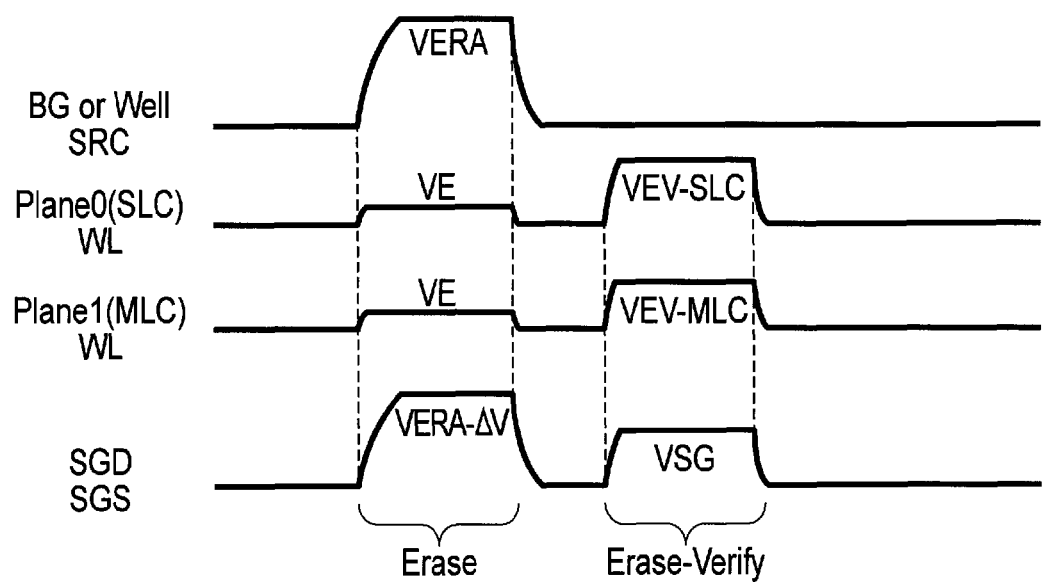
FIG. 51 is a graph showing operation waveforms at the time of erase operation.
Figure 52:
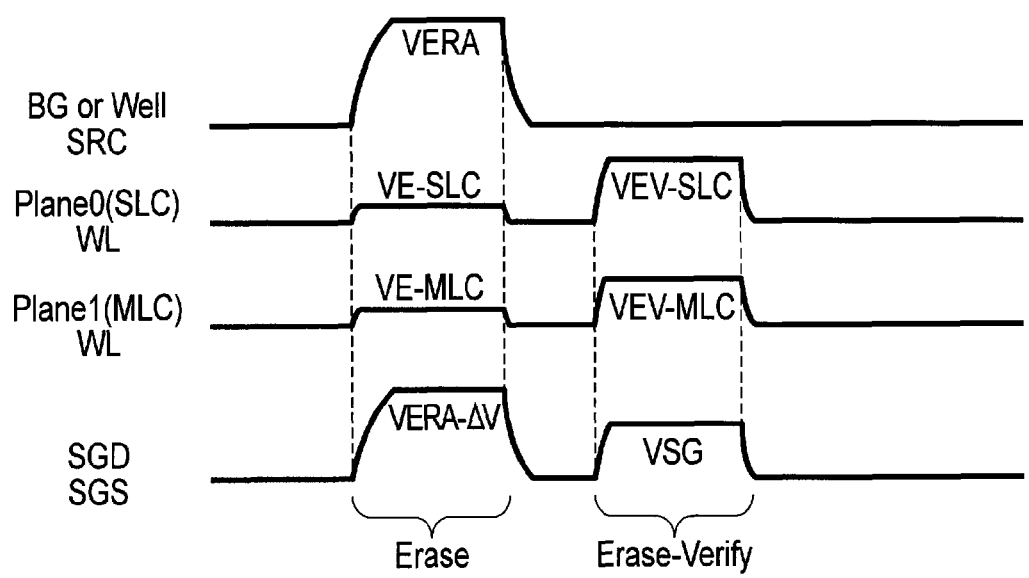
FIG. 52 is a graph showing operation waveforms at the time of erase operation.

As shown in FIG. 50, a memory controller 20 issues a 00h command and predetermined addresses associated with read to a BiCS flash memory 10. When an xxh command is input from the memory controller 20, the BiCS flash memory 10 performs the read operation from the memory cell array 11.

A voltage generation circuit 16 applies a voltage SLCR to the selected word line WLk of the block BLKw of plane 0 in accordance with an instruction from a control circuit 15. SLC data is thus read from plane 0.

The voltage generation circuit 16 applies a voltage DR to the selected word line WL1 of the block BLKx of plane 1 in accordance with an instruction from the control circuit 15. MLC-Lower data is thus read from plane 1.

The voltage generation circuit 16 applies a voltage BR to the selected word line WLm of the block BLKy of plane 2 and then applies a voltage FR to the selected word line WLm in accordance with an instruction from the control circuit 15. MLC-Middle data is thus read from plane 2.

The voltage generation circuit 16 also applies the a voltage AR to the selected word line WLn of the block BLKz of plane 3, next applies a voltage CR to the selected word line WLn, then applies a voltage ER to the selected word line WLn, and after that, applies a voltage GR to the selected word line WLn in accordance with an instruction from the control circuit 15.

Note that in this embodiment, the control circuit 15 changes "CacheReady/Busy" to the "Ready" state when the read operation of at least one plane (in this example, planes 0 and 1) has completed.

When "CacheReady/Busy" changes to the "Ready" state, the memory controller 20 issues a y1h command and a DOUT (P0) command to read data from plane 0 of the BiCS flash memory 10. When receiving the y1h command and the DOUT (P0) command, the BiCS flash memory 10 transmits the data of plane 0 to the memory controller 20.

Next, the memory controller 20 issues a y2h command to read data from plane 1 of the BiCS flash memory 10. When the BiCS flash memory 10 receives the y2h command, "CacheReady/Busy" changes to "Busy", and a plane switching operation is executed. When the plane switching operation has completed, the control circuit 15 changes "CacheReady/Busy" to the "Ready" state.

When "CacheReady/Busy" changes to the "Ready" state, the memory controller 20 issues a DOUT (P1) command. When receiving the DOUT (P1) command, the BiCS flash memory 10 transmits the data of plane 1 to the memory controller 20.

In a similar way, when the read operation of each plane has completed, the memory controller 20 issues a predetermined command and reads data from each plane.

In this embodiment, the control circuit 15 changes "TrueReady/Busy" to the "Ready" state when the read operation of all planes (in this example, planes 0 to 3) as the target of the multi-plane operation has completed.

In the above-described way, the memory controller 20 continuously reads SLC data, MLC-Lower data, and MLC-Upper data.

<Functions and Effects of 14th Embodiment>

According to the above-described embodiment, even when performing the multi-plane operation for four planes each including a memory cell transistor capable of storing octal data, the same operation as in the 11th embodiment can be performed.

Note that in this embodiment, the control circuit 15 changes "CacheReady/Busy" to the "Busy" state at the time of plane switching operation. However, "CacheReady/Busy" may be changed to the "Ready" state, as described in the 13th embodiment.

In this embodiment, when performing multi-plane access, the word line WL number and the plane number of SLC data may be different from those of MLC data.

(15th Embodiment)

The 15th embodiment will be described next. In the 15th embodiment, an erase operation of adjusting a voltage applied to a word line on a plane basis will be described. Note that in the 15th embodiment, the same reference numerals as in the above-described embodiments denote constituent elements having almost the same functions and arrangements, and a repetitive description thereof will be made only when necessary. In this embodiment, a memory cell array 11 has the arrangement described with reference to FIG. 2.

<Erase Operation>

In this embodiment, an example in which the erase operation is performed simultaneously for plane 0 that stores SLC data and plane 1 that stores MLC data will be described.

A voltage generation circuit 16 applies an erase voltage VERA (for example, 20 V) to a back gate BG (for example, a well when the embodiment is applied to a memory cell array 15 and the like described in U.S. patent application Ser. No. 12/407,403 described above) and a source line SL in accordance with an instruction from a control circuit 15. The voltage generation circuit 16 also applies a voltage VE (VERA>VE) to all word lines WL of planes 0 and 1 in accordance with an instruction from the control circuit 15.

The voltage generation circuit 16 also applies a voltage VERA-ΔV (for example, 12 V) to select gate lines SGD and SGS in accordance with an instruction from the control circuit 15. GIDL (gate induced drain leakage) occurs at the end of the select gates. Holes out of hole-electron pairs generated by GIDL enter into a pillar having a low voltage. For this reason, the potential of the pillar rises up to the erase voltage VERA.

Next, the voltage generation circuit 16 applies a voltage VEV_SLC to all word lines WL of plane 0 and applies VSG (for example, 4 V) to all select gate lines SGD and SGS in accordance with an instruction from the control circuit 15. The voltage generation circuit 16 also applies a voltage VEV_MLC (VEV_MLC<VEV_SLC) to all word lines WL of plane 1 and applies VSG to all select gate lines SGD and SGS in accordance with an instruction from the control circuit 15. Note that VEV_SLC and VEV_MLC are the verify level as the upper limit of the Er level.

In a string, select transistors ST1 and ST2 and a back gate transistor BT are on. Hence, if the threshold of the memory cell transistor MT in a normal string has lowered to a desired value, a cell current flows from a bit line BL to the source line SL via the string. The potential of the bit line BL thus lowers, and erase verify is passed.

As described above, according to this embodiment, the erase verify level applied to the word line WL is changed at the time of erase verify in accordance with the type of data stored in a plane.

In the 15th embodiment, the erase verify level applied to the word line WL is changed at the time of erase verify. However, when the erase operation is performed simultaneously for plane 0 that stores SLC data and plane 1 that stores MLC data, a voltage generation circuit 16 may apply an erase voltage VERA to Well, a voltage VE_SLC to all word lines WL of plane 0 and a voltage VE_MLC to all word lines WL of plane 1 in accordance with an instruction from the control circuit 15. As described above, the erase level applied to the word line WL may be changed at the time of erase in accordance with the type of data stored in a plane.

(Modifications)

Note that the first to eighth embodiments can variously be combined.

In addition, the 11th to 15th embodiments can variously be combined with the first to 10th embodiments.

The memory cell array 11 according to the 11th to 15th embodiments has the arrangement described with reference to FIG. 2. However, the memory cell array 11 is not limited to this, and its arrangement can variously be changed. For example, the embodiments can be applied to each of the above-described memory cell arrays.

In the 13th and 14th embodiments, a case where the memory cell transistor can store octal data has been described. However, the present invention is not limited to this.

In the above-described embodiments, 16 CGN drivers including CGNA<3:0>, CGNB<3:0>, CGNC<3:0>, and CGND<3:0> are provided. However, the number of CGN drivers is not limited to this. As described in the above embodiments, CGN drivers in number capable of adjusting the voltages to be applied to the unselected word lines near the selected word line WL suffice. In the above-described embodiments, CG mapping has been described. This is merely an example, and the CG mapping may appropriately be changed by, for example, increasing/decreasing the number of CGN drivers within the scope of the embodiments.

The first to seventh, 11th to 15th embodiments have been described using a pBiCS flash memory. However, the same effects as described above can be obtained even when an iBiCS flash memory or a planar NAND flash memory is used.

In the above embodiments, a binary or quaternary memory cell has been described. However, the memory cell is not limited to this, and can appropriately be changed.

The zone range described in the above embodiments is merely an example, and can appropriately be changed.

In the above embodiments, the program method using the hSLC mode and the like have been described. However, the method is not limited to this, and the SLC mode may be used in place of the hSLC mode.

In the above embodiments, a case where the memory cell array 11 includes plane <0> and plane <1> has been described. However, the memory cell array 11 is not limited to this, and may store a predetermined number of planes.

The SLC driver provided in the voltage generation circuit 16 generates a smaller number of voltage types as compared to the MLC driver. For this reason, the circuit area of the SLC driver is smaller than that of the MLC driver.

The above-described embodiments include the following forms.

1. A memory system comprising:
a memory device including a plane including a plurality of memory cells; and
a controller which controls the memory device,
wherein the controller issues, to the memory device, a first command to simultaneously execute data read operations for the plurality of planes,
the memory device notifies the controller of first information if at least one data read operation has completed, and
when receiving the first information, the controller issues, to the memory device, a second command to output data of the plane whose data read operation has completed.

2. The apparatus according to 1, wherein the memory device
changes a voltage of a gate of the memory cell i (i is an integer, i≥1) times in the data read operation that has completed first, and
changes the voltage of the gate of the memory cell j (j>i) times in the data read operation that has not completed first.

3. The apparatus according to 1, wherein the memory device notifies the controller of second information if all the data read operations for the plurality of planes have completed, and
when receiving the second information, the controller issues, to the memory device, a third command to output data of planes other than the plane whose data read operation has completed first.

4. The apparatus according to 1, wherein 1-bit data is stored in the memory cell of the plane whose data read operation has completed first, and
data of a plurality of bits is stored in the memory cell of the plane whose data read operation has not completed first.

5. A memory system comprising:
a memory device including a first plane and a second plane, each of which includes a plurality of memory cells; and
a controller which controls the memory device,
wherein the controller issues a command to simultaneously execute a first data read operation for the first plane and a second data read operation for the second plane,
a time needed for the first data read operation is shorter than a time needed for the second data read operation,
the memory device notifies the controller of first information if the first data read operation has completed, and
when receiving the first information, the controller issues, to the memory device, a second command to output data of the first plane.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory device; and
a controller which controls the memory device,
the memory device comprising:
a first plane including a plurality of first blocks, the first blocks including a plurality of first memory cells, and gates of the first memory cells being coupled to first word lines;
a second plane including a plurality of second blocks, the second blocks including a plurality of second memory cells, and gates of the second memory cells being coupled to second word lines;
a plurality of word line drivers configured to apply voltages to a plurality of word lines; and
a plurality of switches coupled to the word line drivers, the first plane, and the second plane, the switches being configured to control connections between the word line drivers and the first plane, and between the word line drivers and the second plane, the switches being configured to allocate m word line drivers (m being a natural number) to the first plane during a read operation for the first plane, and the switches being configured to allocate n word line drivers (n being a natural number, with n being different from m) to the first plane during a write operation for the first plane, wherein the controller issues, to the memory device, a command to simultaneously execute first data read for a selected first block and second data read for a selected second block.

2. The memory system according to claim 1, wherein when receiving the first data read command and the second data read command from the controller, the memory device simultaneously reads data from the first plane and the second plane.

3. The memory system according to claim 1, wherein when a plurality of access requests to the memory device are input, the controller combines a plurality of accesses to the first and second planes, and allocates the plurality of word line drivers to the plurality of word lines of the first and second planes on a plane basis using the switches.

4. The memory system according to claim 1, wherein when a plurality of access requests to the memory device are input, the controller combines a plurality of accesses to pages that belong to the first and second planes, and allocates the plurality of word line drivers to the plurality of word lines of the first and second planes on a plane basis using the switches.

5. The memory system according to claim 1, wherein when a plurality of access requests to the memory device are input, the controller combines a plurality of accesses to the first and second planes and data associated with each other, and allocates the plurality of word line drivers to the plurality of word lines of the first and second planes on a plane basis using the switches.

6. The memory system according to claim 3, wherein the controller combines the plurality of accesses for reading data.

7. The memory system according to claim 3, wherein the controller combines the plurality of accesses for programing data.

8. The memory system according to claim 1, further comprising a power supply which supplies a voltage to the first and second planes, wherein the plurality of word line drivers supply the voltage supplied from the power supply to the first and second planes simultaneously.

9. The memory system according to claim 1, wherein when determining that externally supplied first data and second data are associated, the controller stores the first data and the second data in the first and second planes.

10. The memory system according to claim 1, wherein when MLC data is stored in the first plane, and hSLC data whose threshold is higher than that of SLC data is stored in the second plane, the controller simultaneously reads the MLC data stored in the first plane and the hSLC data stored in the second plane.

11. The memory system according to claim 1, wherein when SLC data is stored in the first plane, and hSLC data whose threshold is higher than that of the SLC data is stored in the second plane, the controller simultaneously reads the SLC data stored in the first plane and the hSLC data stored in the second plane.

12. The memory system according to claim 1, wherein when MLC data is stored in the first plane, and SLC data is stored in the second plane, the controller simultaneously reads the MLC data stored in the first plane and the SLC data stored in the second plane.

13. The memory system according to claim 1, wherein the controller further comprises a queue area which receives a plurality of access requests.

14. The memory system according to claim 1, wherein the controller reads a plurality of data from the plurality of word lines belonging to the first and second planes in one data read sequence.

15. The memory system according to claim 1, wherein the controller further comprises a storage unit which holds range information of the word lines, and the controller controls the switches based on the range information.

16. The memory system according to claim 1, wherein the memory device comprises a 3D stacked nonvolatile semiconductor memory.

17. The memory system according to claim 1, wherein the memory device comprises a NAND flash memory.

18. The memory system according to claim 1, wherein the switches are configured to allocate m word line drivers to the first plane and m word line drivers of remaining ones of the word line drivers to the second plane during a read operation for the first plane and the second plane.

* * * * *